(12) United States Patent
Teig

(10) Patent No.: US 7,521,959 B2
(45) Date of Patent: Apr. 21, 2009

(54) CONFIGURABLE IC HAVING A ROUTING FABRIC WITH STORAGE ELEMENTS

(75) Inventor: Steven Teig, Menlo Park, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

(21) Appl. No.: 11/754,300

(22) Filed: May 27, 2007

(65) Prior Publication Data
US 2008/0231315 A1    Sep. 25, 2008

Related U.S. Application Data

(60) Provisional application No. 60/895,946, filed on Mar. 20, 2007, provisional application No. 60/915,108, filed on Apr. 30, 2007.

(51) Int. Cl.
*H03K 19/173* (2006.01)

(52) U.S. Cl. .......................... 326/38; 326/46

(58) Field of Classification Search ............. 326/37–41, 326/46
See application file for complete search history.

(56) References Cited

U.S. PATENT DOCUMENTS

| | | | |
|---|---|---|---|
| 4,594,661 A | 6/1986 | Moore et al. | |
| 4,873,459 A | 10/1989 | El Gamal et al. | |
| 5,191,241 A | 3/1993 | McCollum et al. | |
| 5,245,575 A | 9/1993 | Sasaki et al. | |
| 5,325,329 A | 6/1994 | Inoue et al. | |
| 5,349,250 A | 9/1994 | New | |
| 5,357,153 A | 10/1994 | Chiang et al. | |
| 5,365,125 A | 11/1994 | Goetting et al. | |
| 5,369,622 A | 11/1994 | McLaury | |
| 5,426,378 A | 6/1995 | Ong | |
| 5,521,835 A | 5/1996 | Trimberger | |
| 5,532,958 A | 7/1996 | Jiang et al. | |
| 5,552,721 A | 9/1996 | Gould | |
| 5,600,263 A | 2/1997 | Trimberger et al. | |
| 5,610,829 A | 3/1997 | Trimberger | |

(Continued)

FOREIGN PATENT DOCUMENTS

WO PCT/US2007/069831    5/2007

OTHER PUBLICATIONS

U.S. Appl. No. 11/754,299, filed May 27, 2007, Schmit, et al., Commonly Owned Application.

(Continued)

*Primary Examiner*—Don P Le
(74) *Attorney, Agent, or Firm*—Adeli & Tollen LLP

(57) ABSTRACT

Some embodiments provide a configurable IC that includes a configurable routing fabric with storage elements. In some embodiments, the routing fabric provides a communication pathway that routes signals to and from source and destination components. The routing fabric of some embodiments provides the ability to selectively store the signals passing through the routing fabric within the storage elements of the routing fabric. In this manner, a source or destination component continually performs operations (e.g., computational or routing) irrespective of whether a previous signal from or to such a component is stored within the routing fabric. The source and destination components include configurable logic circuits, configurable interconnect circuits, and various other circuits that receive or distribute signals throughout the configurable IC.

32 Claims, 30 Drawing Sheets

U.S. PATENT DOCUMENTS

| | | |
|---|---|---|
| 5,629,637 A | 5/1997 | Trimberger et al. |
| 5,631,578 A | 5/1997 | Clinton et al. |
| 5,640,107 A | 6/1997 | Kruse |
| 5,646,544 A | 7/1997 | Iadanza |
| 5,646,545 A | 7/1997 | Trimberger et al. |
| 5,656,950 A | 8/1997 | Duong et al. |
| 5,659,484 A | 8/1997 | Bennett et al. |
| 5,682,107 A | 10/1997 | Tavana et al. |
| 5,692,147 A | 11/1997 | Larsen et al. |
| 5,694,057 A | 12/1997 | Gould |
| 5,701,441 A | 12/1997 | Trimberger |
| 5,719,889 A | 2/1998 | Iadanza |
| 5,732,246 A | 3/1998 | Gould et al. |
| 5,737,235 A | 4/1998 | Kean et al. |
| 5,745,422 A | 4/1998 | Iadanza |
| 5,745,734 A | 4/1998 | Craft et al. |
| 5,761,483 A | 6/1998 | Trimberger |
| 5,764,954 A | 6/1998 | Fuller et al. |
| 5,768,178 A | 6/1998 | McLaury |
| 5,777,360 A | 7/1998 | Rostoker et al. |
| 5,802,003 A | 9/1998 | Iadanza et al. |
| 5,815,726 A | 9/1998 | Cliff |
| 5,825,662 A | 10/1998 | Trimberger |
| 5,835,751 A | 11/1998 | Chen et al. |
| 5,847,577 A | 12/1998 | Trimberger |
| 5,889,411 A | 3/1999 | Chaudhary |
| 5,914,616 A | 6/1999 | Young et al. |
| 5,914,906 A | 6/1999 | Iadanza et al. |
| 5,942,913 A | 8/1999 | Young et al. |
| 5,944,813 A | 8/1999 | Trimberger |
| 6,002,991 A | 12/1999 | Conn, Jr. |
| 6,023,421 A | 2/2000 | Clinton et al. |
| 6,038,192 A | 3/2000 | Clinton et al. |
| 6,038,392 A | 3/2000 | Ashar et al. |
| 6,044,031 A | 3/2000 | Iadanza et al. |
| 6,054,873 A | 4/2000 | Laramie |
| 6,069,490 A | 5/2000 | Ochotta et al. |
| 6,075,745 A | 6/2000 | Gould et al. |
| 6,084,429 A | 7/2000 | Trimberger |
| 6,086,628 A | 7/2000 | Dave et al. |
| 6,086,631 A | 7/2000 | Chaudhary et al. |
| 6,091,263 A | 7/2000 | New et al. |
| 6,091,645 A | 7/2000 | Iadanza |
| 6,107,821 A | 8/2000 | Kelem et al. |
| 6,108,805 A | 8/2000 | Rajsuman |
| 6,110,223 A | 8/2000 | Southgate et al. |
| 6,118,707 A | 9/2000 | Gould et al. |
| 6,130,854 A | 10/2000 | Gould et al. |
| 6,134,154 A | 10/2000 | Iwaki et al. |
| 6,140,836 A | 10/2000 | Fujii et al. |
| 6,140,839 A | 10/2000 | Kaviani et al. |
| 6,150,838 A | 11/2000 | Wittig et al. |
| 6,152,612 A | 11/2000 | Liao et al. |
| 6,163,168 A | 12/2000 | Nguyen et al. |
| 6,172,521 B1 | 1/2001 | Motomura |
| 6,173,379 B1 | 1/2001 | Poplingher et al. |
| 6,175,247 B1 | 1/2001 | Scalera et al. |
| 6,184,707 B1 | 2/2001 | Norman et al. |
| 6,184,709 B1 | 2/2001 | New |
| 6,205,076 B1 | 3/2001 | Wakayama |
| 6,229,337 B1 * | 5/2001 | Xiao et al. .................... 326/41 |
| 6,233,191 B1 | 5/2001 | Gould et al. |
| 6,255,849 B1 | 7/2001 | Mohan |
| 6,275,064 B1 | 8/2001 | Agrawal et al. |
| 6,292,019 B1 | 9/2001 | New et al. |
| 6,326,807 B1 | 12/2001 | Veenstra et al. |
| 6,346,824 B1 | 2/2002 | New |
| 6,348,813 B1 | 2/2002 | Agrawal et al. |
| 6,381,732 B1 | 4/2002 | Burnham et al. |
| 6,404,224 B1 | 6/2002 | Azegami et al. |
| 6,411,128 B2 | 6/2002 | Maeda |
| 6,430,736 B1 | 8/2002 | Levi et al. |
| 6,441,642 B1 | 8/2002 | Jones et al. |
| 6,466,051 B1 | 10/2002 | Jones et al. |
| 6,469,540 B2 | 10/2002 | Nakaya |
| 6,469,553 B1 | 10/2002 | Sung et al. |
| 6,480,954 B2 | 11/2002 | Trimberger et al. |
| 6,487,709 B1 | 11/2002 | Keller et al. |
| 6,490,707 B1 | 12/2002 | Baxter |
| 6,496,918 B1 | 12/2002 | DeHon et al. |
| 6,515,509 B1 | 2/2003 | Baxter |
| 6,526,559 B2 | 2/2003 | Schiefele et al. |
| 6,529,040 B1 | 3/2003 | Carberry et al. |
| 6,545,501 B1 | 4/2003 | Bailis et al. |
| 6,545,505 B1 | 4/2003 | Chan et al. |
| 6,590,417 B1 | 7/2003 | Jones et al. |
| 6,593,771 B2 | 7/2003 | Bailis et al. |
| 6,601,227 B1 | 7/2003 | Trimberger |
| 6,603,330 B1 | 8/2003 | Snyder |
| 6,614,703 B2 | 9/2003 | Pitts et al. |
| 6,629,308 B1 | 9/2003 | Baxter |
| 6,636,070 B1 | 10/2003 | Altaf |
| 6,642,744 B2 | 11/2003 | Or-Bach et al. |
| 6,642,763 B2 | 11/2003 | Dike |
| 6,650,142 B1 | 11/2003 | Agrawal et al. |
| 6,667,635 B1 | 12/2003 | Pi et al. |
| 6,668,361 B2 | 12/2003 | Bailis et al. |
| 6,674,303 B1 | 1/2004 | Morse et al. |
| 6,675,309 B1 | 1/2004 | Baxter |
| 6,686,769 B1 | 2/2004 | Nguyen et al. |
| 6,691,301 B2 | 2/2004 | Bowen |
| 6,701,494 B2 | 3/2004 | Giddens et al. |
| 6,703,861 B2 | 3/2004 | Ting |
| 6,710,623 B1 | 3/2004 | Jones et al. |
| 6,714,041 B1 | 3/2004 | Darling et al. |
| 6,732,068 B2 | 5/2004 | Sample et al. |
| 6,806,730 B2 | 10/2004 | Bailis et al. |
| 6,807,660 B1 | 10/2004 | Frenkil |
| 6,809,979 B1 | 10/2004 | Tang |
| 6,829,756 B1 | 12/2004 | Trimberger |
| 6,831,479 B2 | 12/2004 | Lo |
| 6,838,902 B1 | 1/2005 | Elftmann et al. |
| 6,851,101 B1 | 2/2005 | Kong et al. |
| 6,861,868 B1 | 3/2005 | Agrawal et al. |
| 6,894,527 B1 | 5/2005 | Donlin et al. |
| 6,920,627 B2 | 7/2005 | Blodget et al. |
| 6,924,663 B2 | 8/2005 | Masui et al. |
| 6,927,601 B1 | 8/2005 | Lin et al. |
| 6,937,535 B2 | 8/2005 | Ahn et al. |
| 6,956,399 B1 | 10/2005 | Bauer |
| 6,992,505 B1 | 1/2006 | Zhou |
| 6,998,872 B1 | 2/2006 | Chirania et al. |
| 7,010,667 B2 | 3/2006 | Vorbach et al. |
| 7,028,281 B1 | 4/2006 | Agrawal et al. |
| 7,073,158 B2 | 7/2006 | McCubbrey |
| 7,075,333 B1 | 7/2006 | Chaudhary et al. |
| 7,084,666 B2 | 8/2006 | Madurawe |
| 7,088,134 B1 | 8/2006 | Agrawal et al. |
| 7,088,136 B1 | 8/2006 | Lewis |
| 7,107,568 B2 | 9/2006 | Cronquist |
| 7,109,752 B1 | 9/2006 | Schmit et al. |
| 7,112,992 B1 | 9/2006 | Guzman et al. |
| 7,113,421 B2 | 9/2006 | Maeda et al. |
| 7,116,131 B1 | 10/2006 | Chirania et al. |
| 7,126,372 B2 | 10/2006 | Vadi et al. |
| 7,126,373 B1 | 10/2006 | Schmit et al. |
| 7,126,381 B1 | 10/2006 | Schmit et al. |
| 7,126,856 B2 | 10/2006 | Sun et al. |
| 7,129,746 B1 | 10/2006 | Balasubramanian et al. |
| 7,129,747 B1 * | 10/2006 | Jang et al. .................... 326/38 |
| 7,138,827 B1 | 11/2006 | Trimberger |
| 7,154,298 B1 | 12/2006 | Agrawal et al. |
| 7,154,299 B2 | 12/2006 | Swami et al. |
| 7,157,933 B1 | 1/2007 | Schmit et al. |

| | | |
|---|---|---|
| 7,167,025 B1 | 1/2007 | Schmit et al. |
| 7,193,432 B1 | 3/2007 | Schmit et al. |
| 7,193,440 B1 | 3/2007 | Schmit et al. |
| 7,212,448 B1 | 5/2007 | Trimberger |
| 7,224,182 B1 | 5/2007 | Hutchings et al. |
| 7,236,009 B1 | 6/2007 | Rohe et al. |
| 7,242,216 B1 | 7/2007 | Schmit et al. |
| 7,342,415 B2 | 3/2008 | Teig et al. |
| 7,372,297 B1 | 5/2008 | Pugh et al. |
| 2001/0007428 A1 | 7/2001 | Young et al. |
| 2002/0008541 A1 | 1/2002 | Young et al. |
| 2002/0010853 A1 | 1/2002 | Trimberger et al. |
| 2002/0113619 A1 | 8/2002 | Wong |
| 2002/0125910 A1 | 9/2002 | New et al. |
| 2002/0125914 A1 | 9/2002 | Kim |
| 2002/0161568 A1 | 10/2002 | Sample et al. |
| 2002/0163357 A1 | 11/2002 | Ting |
| 2003/0042931 A1 | 3/2003 | Ting |
| 2003/0080777 A1 | 5/2003 | Baxter |
| 2003/0110430 A1 | 6/2003 | Bailis et al. |
| 2004/0010767 A1 | 1/2004 | Agrawal et al. |
| 2004/0044849 A1 | 3/2004 | Stence et al. |
| 2004/0103265 A1 | 5/2004 | Smith |
| 2004/0196066 A1 | 10/2004 | Ting |
| 2004/0233758 A1 | 11/2004 | Kim et al. |
| 2005/0134308 A1 | 6/2005 | Okada et al. |
| 2005/0193359 A1 | 9/2005 | Gupta et al. |
| 2006/0220716 A1 | 10/2006 | Nicolaidis |
| 2006/0225002 A1 | 10/2006 | Hassoun et al. |
| 2006/0250168 A1 | 11/2006 | Starr et al. |
| 2007/0075737 A1 | 4/2007 | Schmit et al. |
| 2007/0143577 A1 | 6/2007 | Smith |
| 2007/0257700 A1 | 11/2007 | Caldwell et al. |
| 2007/0257702 A1 | 11/2007 | Hutchings et al. |
| 2007/0285124 A1 | 12/2007 | Schmit et al. |
| 2008/0180131 A1 | 7/2008 | Teig et al. |
| 2008/0231314 A1 | 9/2008 | Teig et al. |
| 2008/0231318 A1 | 9/2008 | Schmit et al. |

OTHER PUBLICATIONS

U.S. Appl. No. 11/754,301, filed May 27, 2007, Teig, et al., Commonly Owned Application.

Notice of Allowance for U.S. Appl. No. 11/754,299, mailed Mar. 31, 2008, Schmit, et al., Notice of Allowance of Commonly Owned Application.

Non-Final Office Action for U.S. Appl. No. 11/754,301, mailed Jun. 18, 2008, Teig, et al., Non-Final Office Action of Commonly Owned Application.

"§3 Programmable Logic Devices," *Digital System Design*, 2001 Month N/A, slides 3.1-3.28.

"Design for Low Power in Actel Antifuse FPGAs", Actel Application Note, 2000 Actel Corporation, Sep. 2000, pp. 1-8.

"The Effect of SRAM Table Sharing and Cluster Size on FPGA Area", NPL Date Unknown, pp. 1-10.

"The Xilinx Virtex Series FPGA," Jan. 22, 2001, slides 1-22.

"Unifying Sequential and Spatial Computing with a Single Instruction Set Architecture," *ISCA '04*, Jun. 19-23, 2004, ACM, Munchen, Oberbayern, Germany.

Agrawal, O., et al., "An Innovative, Segmented High Performance FPGA Family with Variable-Grain-Architecture and Wide-gating Functions," *FPGA 99*, Feb. 1999, pp. 17-26, ACM, Monterey, California, USA.

Ahmed, E., et al., "The Effect of LUT and Cluster Size on Deep-Submicron FPGA Performance and Density," *FPGA 2000*, Feb. 2000, ACM, Monterey, California, USA.

Altera Corp., "6. DSP Blocks in Stratix II Devices," *SII52006-1.0*, Feb. 2004, pp. 1-32.

Altera, "Stratix II DSP Performance," *White Paper*, Feb. 2004, pp. 1-9, ver. 1.0, Altera Corporation, San Jose, California, USA.

Amerson, R., et al., "Plasma: An FPGA for Million Gate Systems," *Proceedings of the 1996 ACM 4th International Symposium on FPGAs*, Feb. 11-13, 1996, pp. 10-16, Monterey, California, USA.

Backus, J., "Can Programming be Liberated from the Von Neumann Style? A Functional Style and its Algebra of Programs," *Communications of the ACM*, Aug. 1978, pp. 613-641, vol. 21, No. 8, ACM.

Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, California, USA.

Butts, M., "Future Directions of Dynamically Reprogrammable Systems," *IEEE 1995 Custom Integrated Circuits Conference*, May 1995, pp. 487-494, IEEE.

Camposano, R., "The Growing Semiconductor Zoo: ASICs, CSSP, ASSP, ASIP, Structured Arrays, FPGAs, Processor Arrays, Platforms . . . and Other Animalia," Aug. 29, 2003, pp. 1-74, Synopsys, Inc.

Caspi, E., et al., "A Streaming Multi-Threaded Model," *MSP-3*, Dec. 2, 2001, pp. 1-23.

Caspi, E., et al., "Stream Computations Organized for Reconfigurable Execution (SCORE): Introduction and Tutorial," Aug. 25, 2000, pp. 1-31, Version 1.0.

Compton, K., et al., "An Introduction to Reconfigurable Computing", *IEEE Computer*, Apr. 2000.

Compton, K., et al., "Reconfigurable Computing: A Survey of Systems and Software," *ACM Computing Surveys*, Jun. 2002, pp. 171-210, vol. 34, No. 2, ACM, New York, New York, USA.

Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.

Davare, A., et al., "The Best of Both Worlds: The Efficient Asynchronous Implementation of Synchronous Specifications," *DAC '04*, Jun. 7-11, 2004, ACM, San Diego, California, USA.

Dehon, A., "Balancing Interconnect and Computation in a Reconfigurable Computing Array (or, why don't you really want 100% LUT utilization)," *Proceedings of the International Symposium on Field Programmable Gate Arrays*, Feb. 1999, pp. 125-134.

Dehon, A., "DPGA Utilization and Application," *Proceedings of the 1996 ACM Fourth International Symposium on Field-Programmable Gate Arrays FPGA*, Feb. 11-13, 1996, Monterey, California, USA.

Dehon, A., "Dynamically Programmable Gate Arrays: A Step Toward Increased Computational Density," *Proceedings of the Fourth Canadian Workshop on Field-Programmable Devices*, May 1996, pp. 47-54.

Dehon, A., "Reconfigurable Architectures for General-Purpose Computing," *A.I. Technical Report* No. 1586, Oct. 1996, pp. i-353.

Dehon, A., "The Density Advantage of Configurable Computing," Apr. 2000, pp. 41-49, IEEE.

Dehon, A., "Transit Note #121: Notes on Programmable Interconnect," *M.I.T. Transit Project*, Feb. 1995, pp. 1-13.

Dehon, A., et al., "Design Patterns for Reconfigurable Computing," *Proceedings of the IEEE Symposium on Field-Programmable Custom Computing Machines*, Apr. 2004.

Dehon, A., et al., "DPGA-Coupled Microprocessors: Commodity ICs for the Early 21st Century," *FCCM '94-IEEE Workshop on FPGAs for Custom Computing Machines*, Apr. 1994, Napa Valley, California, USA.

Dehon, A., et al., "Reconfigurable Computing: What, Why and Implications for Design Automation," *DAC 1999*, Jun. 1999, ACM, New Orleans, Louisiana.

Enzler, R., et al., "Virtualizing Hardware with Multi-Context Reconfigurable Arrays," *Lecture Notes in Computer Science*, Sep. 2003, pp. 151-160.

Gayasen, A., et al., "Reducing Leakage Energy in FPGAs Using Region-Constrained Placement," *FPGA '04*, Feb. 22-24, 2004, pp. 51-58, ACM, Monterey, California, USA.

George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of California*, Berleley, Fall 2000 Month N/Z, pp. 1-190.

Giraud-Carrier, C., "A Reconfigurable Data Flow Machine for Implementing Functional Programming Languages," *SIGPLAN Notices*, Sep. 1994, vol. 29 (9): 22-28.

Goldstein, S.C., et al., "PipeRench: A Coprocessor for Streaming Multimedia Acceleration," *International Symposium on Computer Architecture (ISCA)*, May 1999, pp. 28-39.

Goldstein, S.C., et al., "PipeRench: A Reconfigurable Architecture and Compiler," Apr. 2000, pp. 70-77, IEEE.

Hauck, S., et al., "Montage: An FPGA for Synchronous and Asynchronous Circuits," *Field-Programmable Gate Arrays: Architectures and Tools for Rapid Prototyping*, 1993 Month N/A, Springer-Verlag, Berlin.

Hauck, S., et al., "Totem: Domain-Specific Reconfigurable Logic," *IEEE Transactions on VLSI Systems*, 2006 Month N/A, pp. 1-25.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, California, USA.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," *Submitted to the Dept. of Electrical Engineering and Computer Science in Partial Fullfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

IBM, "Cell Broadband Engine Architecture, Version 1.0," Aug. 8, 2005, pp. 1-319, USA.

IBM, "SPU Application Binary Interface Specification, Version 1.3," *CBEA JSRE Series*, Aug. 1, 2005, pp. iv-26, USA.

IBM, "SPU Assembly Language Specification, Version 1.2," *CBEA JSRE Series*, Aug. 1, 2005, pp. iii-22, USA.

IBM, "SPU C/C++ Language Extentions, Version 2.0" *CBEA JSRE Series*, Aug. 1, 2005, pp. iv-84, USA.

IBM, "Synergistic Processor Unit Instruction Set Architecture, Version 1.0," Aug. 1, 2005, pp. 1-257, USA.

Kaviani, A., et al., "Computational Field Programmable Architecture," *Custom Integrated Circuits Conference, Proceedings of the IEEE 1998*, May 11-14, 1998.

Kaviani, A., et al., "Hybrid FPGA Architecture," *Proceedings of the 1996 ACM Fourth International Symposium on Field-Programmable Gate Arrays*, Feb. 11-13, 1996, pp. 3-9, Monterey, California, USA.

Keutzer, K., "Overview of *configurable* architectures," Feb. 28, 2002, slides 1-29.

Kocan, F., et al., "Logic Modules with Shared SRAM Tables for Field-Programmable Gate Arrays," *FPL 2004*, Aug./Sep. 2004, pp. 289-300, Springer-Verlag, Berlin Heidelberg.

Lehn, D.I., et al., "Evaluation of Rapid Context Switching on a CSRC Device," *Proceedings of the International Conference on Engineering of Reconfigurable Systems and Algorithms*, Jun. 24-27, 2002.

Lemieux, G., et al., "Generating Highly-Routable Sparse Crossbars for PLDs," *FPGA 2000*, Feb. 2000, ACM, Monterey, California, USA.

Lemieux, G., et al., "Using Sparce Crossbars within LUT Clusters," *FPGA 2001*, Feb. 11-13, 2001, ACM, Monterey, California, USA.

Lertora, F., et al., "Handling Different Computational Granularity by a Reconfigurable IC Featuring Embedded FPGAs and a Network-On-Chip," *13th Annual IEEE Symposium on Field-Programmable Custom Computing Machines (FCCM 2005)* 2005, Apr. 18-20, 2005.

Lewis, D., et al., "The Stratix-II Routing and Logic Architecture," *Proceedings of the 2005 ACM/SIGDA 13th International Symposium on Field-Programmable Gate Arrays*, Feb. 20-22, 2005, pp. 1-22, Monterey, California, USA.

Ling, A., "The Search for the Optimal FPGA Logic Block," 2001 Month N/A, ACM.

M2000, "FlexEOS Embedded FPGA Cores," 2003 Month N/A, M2000.

Markovskiy, Y., et al., "Analysis of Quasi-Static Scheduling Techniques in a Virtualized Reconfigurable Machine," *FPGA '02*, Feb. 24-26, 2002, ACM, Monterey, California, USA.

Master, P., "The Next Big Leap in Reconfigurable Systems," *A Technology Vision Whitepaper*, Apr. 28, 2004, but © 2003, pp. 1-8, QuickSilver Technology, Inc., San Jose, California, USA.

Mathstar, Inc., "MathStar FPOA Architecture: A New Approach to High Throughput, Scalable, and Reprogrammable Design," *Technology Overview*, 2003 Month N/A, MathStar, Inc.

Mirsky, E., et al., "Matrix: A Reconfigurable Computing Architecture with Configurable Instruction Distribution and Deployable Resources," *Proceedings of the IEEE Workshop on FPGAs for Custom Computing Machines*, Apr. 1996.

Mirsky, E., et al., "Matrix: A Reconfigurable Computing Device with Configurable Instruction Distribution (Extended Abstract)," *Hot Chips Symposium 1997*, Aug. 1997.

Morris, K., "Lattice Launches XP: Non-Volatility at the Forefront of FPGA," *FPGA and Programmable Logic Journal*, Mar. 1, 2005, pp. 1-5, Techfocus Media, Inc.

Morris, K., "Rationalizing Reconfigurability: The Importance of Being Programmable," *FPGA and Structured ASIC Journal*, Sep. 27, 2005.

Nelson, B.E., "Reconfigurable Computing: An Introduction and Overview," Sep. 23, 1998, pp. 1-43.

Niedzielski, D., "An Overview of Reconfigurable Computing," NPL Date Unknown.

Ochotta, E.S., et al., "A Novel Predictable Segmented FPGA Routing Architecture," *FPGA 98*, Feb. 1998, pp. 3-11, ACM, Monterey, California, USA.

Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, California, USA.

Parhami, B., "Part IV: Lower-Diameter Architectures," *ECE 254B: Advanced Computer Architecture: Parallel Processing, UCSB*, Spring 2005 Month N/A, slides 1-93, Behrooz Parhami, Santa Barbara, California, USA.

Pedram, M., et al., "A New Design for Double Edge Triggered Flip-flops," Feb. 10-13, 1998.

Pedram, M., "IEEE Circuits and Systems Society Distinguished Lecturer Program," NPL Date Unknown.

Perissakis, S., et al., "Embedded DRAM for a Reconfigurable Array," *Proceedings of the 1999 Symposium on VLSI Circuits*, Jun. 1999, slides 1-24.

Perissakis, S., et al., "Embedded DRAM for a Reconfigurable Array," *Proceedings of the 1999 Symposium on VLSI Circuits*, Jun. 1999.

Plunkett, B., "In Search of the SDR Holy Grail," *A Technology Application Whitepaper*, Apr. 28, 2004 but © 2003, pp. 1-7, QuickSilver Technology, Inc., San Jose, California, USA.

Plunkett, B., et al., "Adapt2400 ACM Architecture Overview," *A Technology Whitepaper*, 2004 Month N/A, pp. 1-9, QuickSilver Technology, Inc.

QuickLogic Corp., "Ultra-Low Power FPGA Combining Performance, Density, and Embedded RAM," *Eclipse II Family Data Sheet*, Nov. 2005, pp. 1-92, QuickLogic Corporation, USA.

QuickSilver Technology, Inc., "Adapt2000 ACM System Platform," Apr. 2004, pp. 1-39, QuickSilver Technology, Inc., San Jose, California, USA.

QuickSilver Technology, Inc., "InSpire SDK Tool Set," *Product Brief*, 2004 Month N/A, QuickSilver Technology, Inc., San Jose, California, USA.

QuickSilver Technology, Inc., "QS2412 Adaptive Computing Machine," *Product Brief*, 2004 Month N/A, QuickSilver Technology, Inc., San Jose, California, USA.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Rose, J., "Hard vs. Soft: The Central Question of Pre-Fabricated Silicon," *34th International Symposium on Multiple-Valued Logic (ISMVL '04)*, May 2004, pp. 2-5.

Sambhwani, S., et al., "Implementing W-CDMA Transceiver Structure on an Adaptive Computing Platform," *A Technology Application Whitepaper*, Apr. 28, 2004 but © 2003, pp. 1-12, QuickSilver Technology, Inc., San Jose, California, USA.

Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.

Schaumont, P., et al., "A Quick Safari Through the Reconfiguration Jungle," *38th Design Automation Conference*, Jun. 2001, pp. 172-177, Las Vegas, Nevada, USA.

Schmit, H., "Extra-Dimensional Island-Style FPGAs," *Field Programmable Logic and Application (FPL 2003)*, Sep. 2003, pp. 406-415.

Schmit, H., "Extra-dimensional Island-Style FPGAs," *Field Programmable Logic and Application (FPL 2003)*, Sep. 2003, slides 1-26.

Schmit, H., "Incremental Reconfiguration for Pipelined Applications," *Proceedings of the 5th IEEE Symposium of FPGA-Based Custom Computing Machines*, Apr. 16-18, 1997.

Schmit, H., et al., "FPGA Switch Block Layout and Evaluation," *FPGA '02*, Feb. 24-26, 2002, ACM, Monterey, California, USA.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium of Field-Programmable Custom Computing Machines*, Apr. 22-24, 2002.

Sharma, A., et al., "Accelerating FPGA Routing Using Architecture-Adaptive A* Techniques," *Proceedings of the IEEE Conference on Field-Programmable Technology 2005*, Dec. 11-14, 2005.

Singh, A., et al., "Interconnect Pipelining in a Throughput-Intensive FPGA Architecture," *FPGA 2001*, Feb. 11-13, 2001, pp. 153-160, ACM, Monterey, California, USA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Slade, A.L., et al., "Reconfigurable Computing Application Frameworks," *11th Annual IEEE Symposium on Field-Programmable Custom Computer Machines*, Apr. 9-11, 2003.

Snider, G., "Performance-Constrained Pipelining of Software Loops onto Reconfigurable Hardware," *FPGA '02*, Feb. 24-26, 2002, pp. 177-186, ACM, Monterey, California, USA.

Tau, E., et al., "A First Generation DPGA Implementation," *Proceedings of the Third Canadian Workshop on Field-Programmable Device*, May 1995, pp. 138-143.

Tau, E., et al., "Transit Note #114: A First Generation DPGA Implementation," *M.I.T. Transit Project*, Jan. 1995, pp. 1-8.

Teifel, J., et al., "Highly Pipelined Asynchronous FPGAs," *Proceedings of the 2004 ACM/SIGDA 12th International Symposium on Field Programmable Gate Arrays*, Feb. 22-24, 2004, ACM, Monterey, California, USA.

Tessier, R., et al., "Balancing Logic Utilization and Area Efficiency in FPGAs," *Proceedings of the Roadmap to Reconfigurable Computing, 10th International Workshop on Field Programmable Logic and Applications*, Aug. 27-30, 2000, pp. 535-544.

Tom, M., et al., "Clustering of Large Designs for Channel-Width Constrained FPGAs," *University of British Columbia, Department of Electrical and Computer Engineering*, Jun. 2005, slides 1-39, Vancouver, British Columbia, Canada.

Tom, M., et al., "Logic Block Clustering of Large Designs for Channel-Width Constrained FPGAs," *DAC 2005*, Jun. 13-17, 2005, pp. 726-731, ACM, Anaheim, California, USA.

Trimberger, S., "Effects of FPGA Architecture on FPGA Routing," *32nd ACM/IEEE Design Automation Conference*, Jun. 1995, ACM.

Tsu, W., et al., "HSRA: High-Speed, Hierarchical Synchronous Reconfigurable Array," *Proceedings of the International Symposium on Field Programmable Gate Arrays*, Feb. 1999, pp. 69-78.

Wawrzynek, J., "EECS150-Digital Design: Lecture 5—Field Programmable Gate Arrays (FPGAs)," Feb. 4, 2002, slides 1-20.

Weaver, N., et al., "The SFRA: A Corner-Turn FPGA Architecture," *FPGA '04*, Feb. 22-24, 2004, ACM, Monterey, California, USA.

Wilton, S.J.E., "Memory-to-Memory Connection Structures in FPGAs with Embedded Memory Arrays," *FPGA 97*, Feb. 1997, pp. 10-16, ACM, Monterey, California, USA.

Xilinx, Inc., "Virtex-4 Family Overview," *Advance Product Specification*, Sep. 10, 2004, pp. 21-30, v1.1, Xilinx, Inc.

Zilic, Z. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, California, USA.

Zuchowski, P.S., "A Hybrid ASIC and FPGA Architecture," 2002 Month N/A, IEEE.

Notice of Allowance for U.S. Appl. No. 11/081,859, mailed Oct. 11, 2007, Teig, Steven, et al., Notice of Allowance Commonly Owned.

Non-Final Office Action for U.S. Appl. No. 11/081,859, mailed Apr. 5, 2007, Teig, Steven, et al., Non-Final Office Action of Commonly Owned.

Non-Final Office Action for U.S. Appl. No. 11/081,859, mailed Oct. 2, 2007, Teig, Steven, et al., Non-Final Office Action Commonly Owned Application.

Non-Final Office Action for U.S. Appl. No. 12/021,291, mailed Aug. 11, 2008, Teig, Steven, et al., Non-Final Office Action Commonly Owned Application.

U.S. Appl. No. 11/081,855, filed Mar. 15, 2005, Schmit, Herman, et al., Commonly Owned.

Non-Final Office Action for U.S. Appl. No. 11/081,855, mailed Nov. 16, 2006, Schmit, Herman, et al., Non-Final Office Action of Commonly Owned Application.

Notice of Allowance for U.S. Appl. No. 11/082,200, mailed Feb. 14, 2007, Rohe, Andre, et al., Notice of Allowance of Commonly Owned.

Ex-Parte Quayle Action for U.S. Appl. No. 11/082,200, mailed Nov. 21, 2006, Rohe, Andre, et al., Ex-Parte Quayle Action of Commonly Owned Application.

U.S. Appl. No. 11/751,629, filed May 21, 2007, Rohe, Andre, et al., Commonly Owned.

Final Office Action for U.S. Appl. No. 11/751,629, mailed May 14, 2008, Rohe, Andre, et al., Final Office Action of Commonly Application.

Non-Final Office Action for U.S. Appl. No. 11/751,629, mailed Sep. 19, 2007, Rohe, Andre, et al., Non-Final Office Action of Commonly Owned Application.

U.S. Appl. No. 11/292,952, filed Dec. 1, 2005, Redgrave, Jason, et al., Commonly Owned Application.

Non-Final Office Action for U.S. Appl. No. 11/292,952, mailed Dec. 13, 2007, Redgrave, Jason, et al., Non-Final Office Action Commonly Owned Application.

Non-Final Office Action for U.S. Appl. No. 11/292,952, mailed May 14, 2007, Redgrave, Jason, et al., Non-Final Office Action Commonly Owned Application.

Non-Final Office Action for U.S. Appl. No. 11/292,952, mailed Aug. 6, 2008, Redgrave, Jason, et al., Non-Final Office Action Commonly Owned Application.

U.S. Appl. No. 11/293,856, filed Dec. 1, 2005, Schmit, Herman, et al., Commonly Owned.

Non-Final Office Action for U.S. Appl. No. 11/293,856, mailed Nov. 29, 2006, Schmit, Herman, et al., Non-Final Office Action Commonly Owned Application.

U.S. Appl. No. 11/269,869, filed Nov. 7, 2005, Pugh, Daniel, et al., Commonly Owned.

Notice of Allowance for U.S. Appl. No. 11/269,505, mailed Dec. 3, 2007, Pugh, Daniel, et al., Notice of Allowance of Commonly Owned Application.

Notice of Allowance for U.S. Appl. No. 11/269,505, mailed Aug. 13, 2007, Pugh, Daniel, et al., Notice of Allowance of Commonly Owned Application.

U.S. App. No. 12/050,143, filed Mar. 17, 2008, Pugh, Daniel, et al., Commonly Owned.

U.S. App. No. 11/269,858, filed Nov. 7, 2005, Pugh, Daniel, et al., Commonly Owned.

U.S. App. No. 11/269,518, filed Nov. 7, 2005, Pugh, Daniel, et al., Commonly Owned.

U.S. Appl. No. 12/058,662, filed Mar. 28, 2008, Caldwell, Andrew, et al., Commonly Owned.

Notice of Allowance of U.S. Appl. No. 11/293,856, mailed Sep. 3, 2008, Schmit, Herman, et al, Notice of Allowance commonly owned application.

Notice of Allowance of U.S. Appl. No. 11/754,299, mailed Jul. 25, 2008, Schmit, Herman, et al, Notice of Allowance commonly owned application.

International Search Report and Written Opinion of PCT/US07/69831, mailed Sep. 24, 2008, Tabula, Inc., International Search Report and Written Opinion of Commonly owned International Patent Application.

Alexander, M.J., et al., "Placement and Routing for Performance-Oriented FPGA Layout," VLSI Design: an International Journal of Custom-Chip Design, Simulation, and Testing, 1998 Month N/A, vol. 7, No. 1, pp. 1-23.

Alpert, C.J., et al., "Quadratic Placement Revisited," *Design Automation Conference*, '97, Jun. 1997, ACM.

Andraka Consulting Group, Inc., "Multiplication in FPGAs," http://www.andraka.com/multipli.htm, Jan. 25, 2006, pp. 1-7.

Chiricescu, S., et al., "Morphable Multipliers," *FPL 2002, LNCS 2438*, Sep. 2002, pp. 647-656, Springer-Verlag Berlin Heidelberg.

Ciemat, J.V., et al., "Annealing Placement by Thermodynamic Combinatorial Optimization," *ACM Transactions on Design Automation of Electronic Systems*, Jul. 2004, pp. 310-332, vol. 9, No. 3, ACM, New York, NY.

Cong, J., et al., "Optimality and Stability Study of Timing-Driven Placement Algorithms," ICCAD-2003. International Conference on Computer Aided Design, Nov. 2003.

Cong, J., et al., "Large-Scale Circuit Placement," *ACM Transactions on Design Automation of Electronic Systems*, Apr. 2005, pp. 389-430, vol. 10, No. 2, ACM Inc., Broadway, New York, NY.

Hauck, S., et al., "High-Performance Carry Chains for FPGAs," *FPGA 98*, Feb. 1998, pp. 223-233, ACM, Monterey, CA.

Kudlugi, et al., "Static Scheduling of Multidomain Circuits for Fast Functional Verification", *IEEE Transactions on Computer-Aided Design of Integrated Circuits and Systems*, vol. 21, No. 11, Nov. 2002, pp. 1253-1268.

Lin, J.Y., et al., "Placement-Driven Technology Mapping for LUT-Based FPGAs," *FPGA '03*, Feb. 23-25, 2003, pp. 121-126, ACM, Monterey, CA.

Mazumder, "Parallel VLSI-Routing Models for Polymorphic Processors Array", *10$^{th}$ International Conference on VLSI Design*, IEEE, Jan. 1997, pp. 10-14.

Sankar, Y., "Ultra-Fast Automatic Placement for FPGAs," *A Thesis Submitted in Conformity with the Requirements for the Degree of Master of Applied Science Graduate Dept. of Electrical and Computer Engineering*, University of Toronto, 1999 Month N/A, pp. ii-73.

Sheeran, M., "Generating Fast Multipliers Using Clever Circuits." (NPL Date Unknown).

Singh, A., et al., "Interconnect Resource-Aware Placement for Hierarchical FPGAs," Proceedings of the 2001 IEEE/ACM International Conference on Computer-Aided Design, Nov. 2001.

Xing, S., et al., "FPGA Adders: Performance Evaluation and Optimal Design," *IEEE Design & Test of Computers*, Jan.-Mar. 1998, pp. 24-29, IEEE.

* cited by examiner

US 7,521,959 B2

CONFIGURABLE IC HAVING A ROUTING FABRIC WITH STORAGE ELEMENTS

CLAIM OF BENEFIT TO PRIOR APPLICATION

This application claims benefit to U.S. Provisional Patent Application 60/895,946, filed Mar. 20, 2007 and the U.S. Provisional Patent Application 60/915,108, filed Apr. 30, 2007. These United States Provisional Patent Applications are incorporated herein by reference.

CROSS REFERENCE TO RELATED APPLICATIONS

This Application is related to the following applications with the same filing date: U.S. Pat. application Ser. No. 11/754,301, filed May 27, 2007; and U.S. Pat. application Ser. No. 11/754,299, filed May 27, 2007.

FIELD OF THE INVENTION

The present invention is directed towards configurable ICs having a routing fabric with storage elements for performing routing and storage operations.

BACKGROUND

The use of configurable integrated circuits ("ICs") has dramatically increased in recent years. One example of a configurable IC is a field programmable gate array ("FPGA"). An FPGA is a field programmable IC that often has logic circuits, interconnect circuits, and input/output (I/O) circuits. The logic circuits (also called logic blocks) are typically arranged as an internal array of circuits. These logic circuits are typically connected together through numerous interconnect circuits (also called interconnects). The logic and interconnect circuits are often surrounded by the I/O circuits.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set is stored in a set of SRAM cells 115. From the set of functions that the logic circuit 100 can perform, the configuration data set specifies a particular function that this circuit has to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Multiplexers and look-up tables are two examples of configurable logic circuits.

FIG. 2 illustrates an example of a configurable interconnect circuit 200. This interconnect circuit 200 connects a set of input data 205 to a set of output data 210. This circuit receives configuration data 215 that are stored in a set of SRAM cells 220. The configuration data specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

FIG. 3A illustrates a portion of a prior art configurable IC 300. As shown in this figure, the IC 300 includes an array of configurable logic circuits 305 and configurable interconnect circuits 310. The IC 300 has two types of interconnect circuits 310a and 310b. Interconnect circuits 310a connect interconnect circuits 310b and logic circuits 305, while interconnect circuits 310b connect interconnect circuits 310a to other interconnect circuits 310a.

In some cases, the IC 300 includes numerous logic circuits 305 and interconnect circuits 310 (e.g., hundreds, thousands, hundreds of thousands, etc. of such circuits). As shown in FIG. 3A, each logic circuit 305 includes additional logic and interconnect circuits. Specifically, FIG. 3A illustrates a logic circuit 305a that includes two sections 315a that together are called a slice. Each section includes a look-up table (LUT) 320, a user register 325, a multiplexer 330, and possibly other circuitry (e.g., carry logic) not illustrated in FIG. 3A.

The multiplexer 330 is responsible for selecting between the output of the LUT 320 or the user register 325. For instance, when the logic circuit 305a has to perform a computation through the LUT 320, the multiplexer 330 selects the output of the LUT 320. Alternatively, this multiplexer selects the output of the user register 325 when the logic circuit 305a or a slice of this circuit needs to store data for a future computation of the logic circuit 305a or another logic circuit.

FIG. 3B illustrates an alternative way of constructing half a slice in a logic circuit 305a of FIG. 3A. Like the half-slice 315a in FIG. 3A, the half-slice 315b in FIG. 3B includes a look-up table (LUT) 320, a user register 325, a multiplexer 330, and possibly other circuitry (e.g., carry logic) not illustrated in FIG. 3B. However, in the half-slice 315b, the user register 325 can also be configured as a latch. In addition, the half-slice 315b also includes a multiplexer 350. In half-slice 315b, the multiplexer 350 receives the output of the LUT 320 instead of the register/latch 325, which receives this output in half-slice 315a. The multiplexer 350 also receives a signal from outside of the half-slice 315b. Based on its select signal, the multiplexer 350 then supplies one of the two signals that it receives to the register/latch 325. In this manner, the register/latch 325 can be used to store (1) the output signal of the LUT 320 or (2) a signal from outside the half-slice 315b.

The use of user registers to store such data is at times undesirable, as it typically requires data to be passed at a clock's rising edge or a clock's fall edge. In other words, registers often do not provide flexible control over the data passing between the various circuits of the configurable IC. In addition, the placement of a register or a latch in the logic circuit increases the signal delay through the logic circuit, as it requires the use of at least one multiplexer 330 to select between the output of a register/latch 325 and the output of a LUT 320. The placement of a register or a latch in the logic circuit further hinders the design of an IC as the logic circuit becomes restricted to performing either storage operations or logic operations, but not both.

Accordingly, there is a need for a configurable IC that has a more flexible approach for storing data and passing data. More generally, there is a need for more flexible storage mechanisms in configurable ICs.

SUMMARY OF THE INVENTION

Some embodiments provide a configurable IC that includes a configurable routing fabric with storage elements. In some embodiments, the routing fabric provides a communication pathway that routes signals to and from source and destination components. The routing fabric of some embodiments provides the ability to selectively store the signals passing through the routing fabric within the storage elements of the routing fabric. In this manner, a source or destination component continually performs operations (e.g., computational or routing) irrespective of whether a previous signal from or to such a component is stored within the routing fabric. The source and destination components include configurable logic circuits, configurable interconnect circuits, and various other circuits that receive or distribute signals throughout the configurable IC.

In some embodiments, the routing fabric includes configurable interconnect circuits, the wire segments (e.g., the metal or polysilicon segments) that connect to the interconnect circuits, and vias that connect to these wire segments and to the terminals of the interconnect circuits. In some of these embodiments, the routing fabric also includes buffers for achieving one or more objectives (e.g., maintaining the signal strength, reducing noise, altering signal delay, etc.) visa vi the signals passing along the wire segments. In conjunction with or instead of these buffer circuits, the routing fabric of some embodiments might also include one or more non-configurable circuits (e.g., non-configurable interconnect circuits).

Different embodiments place storage elements at different locations in the routing fabric. Examples of such locations include storage elements coupled to or within the output stage of interconnect circuits, storage elements coupled to, cross-coupled to, or adjacent to buffer circuits in the routing fabric, and storage elements at other locations of the routing fabric.

For instance, in some embodiments, the routing fabric includes a parallel distributed path (PDP) for an output of a source component that is being routed through the routing fabric to an input of a destination component. A PDP includes a first path and a second path. The first path directly routes the output of the source to a first input of the destination, while the second path runs in parallel with the first path and passes the output of the source through a controllable storage element before reaching a second input of the destination. The storage element stores the output value of the source circuit when enabled. In addition to reaching the same destination component, some embodiments allow the second path to fan out to other destination components than the first path. In some embodiments, both the first and second paths of a PDP emanate from the output of an interconnect circuit that receives the output of the source component.

In some embodiments, the routing fabric includes interconnect circuits with storage elements located at their output stage. For a particular interconnect circuit that connects a particular source circuit to a particular destination circuit, the output of the particular interconnect circuit's storage element connects to an input of the destination circuit. When enabled, this storage holds the output of the source circuit for a particular duration (e.g., for one or more user design clock cycles or one or more sub-cycles). Typically, such a storage element is used to store data for a relatively small amount of time as its storage operation prevents the interconnect circuit from performing its routing operation. Accordingly, at times, this storage element is referred to below as a short-term storage element.

In addition to placing a short-term storage element at the output stage of an interconnect circuit, some embodiments place a "long-term" storage element in a feedback path between an output and input of the interconnect circuit. Such a storage element is referred to as a long-term storage element as it can be used to store data for a time duration that can be relatively long as the storage element does not disable the interconnect circuit's routing operation. In other words, the placement of the storage element in a feedback path of the interconnect circuit allows the interconnect circuit to continue performing its routing operations even when the storage element stores data. In some embodiments, either the short term or long term storage element of an interconnect circuit is performing a storage operation at any given time.

Some embodiments place the long-term storage element and the feedback path in series with the short term storage element. For instance, in some embodiments, the output of the interconnect circuit that passes through the short term storage element (1) is distributed to a destination component and (2) is distributed along the feedback path through the long term storage element to an input of the interconnect circuit.

Other embodiments position the long-term storage element and the feedback path in parallel with the short-term storage element. For instance, the output of the interconnect circuit can be distributed along two separate output paths. The first output path passes the output of the interconnect circuit through the short-term storage before reaching the input of a destination circuit (where in some embodiments this path reaches the destination circuit's input possibly through one or more wire segments, vias, and buffers). The second parallel output path passes the output of the interconnect circuit through the long-term storage element along the feedback path before passing this output back to an input of the interconnect circuit.

Some embodiments do not utilize any short-term storage at the output of an interconnect circuit, but only utilize a long-term storage in a feedback path between the output and input of an interconnect circuit. Other embodiments utilize a long-term storage that receives the output of an interconnect circuit but does not supply its output back to the same interconnect circuit. Instead, this long-term storage routes its output to an input of another interconnect circuit.

The PDP, short-term, and long-term storage elements are controllable storage elements that can controllably store data for arbitrary durations of time. In some embodiments, some or all of these storage elements are controlled by user design signals. In some embodiments, some or all of these storage elements are configurable storage elements whose storage operation is at least partly controlled by a set of configuration data stored in configuration data storage of the IC. For instance, in some embodiments, the set of configuration bits determines the clock cycles in which a PDP, short-term, or long-term storage element receives and stores data.

BRIEF DESCRIPTION OF THE DRAWINGS

The novel features of the invention are set forth in the appended claims. However, for the purpose of explanation, several embodiments of the invention are set forth in the following figures.

DETAILED DESCRIPTION

Figure 1:
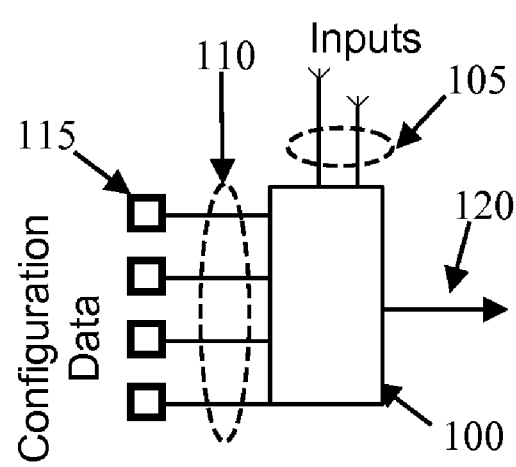
FIG. 1 illustrates an example of a configurable logic circuit.
Figure 2:
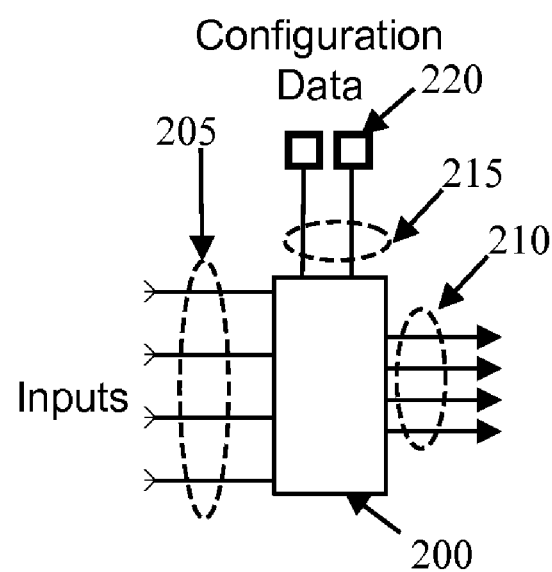
FIG. 2 illustrates an example of a configurable interconnect circuit.
Figure 3A:
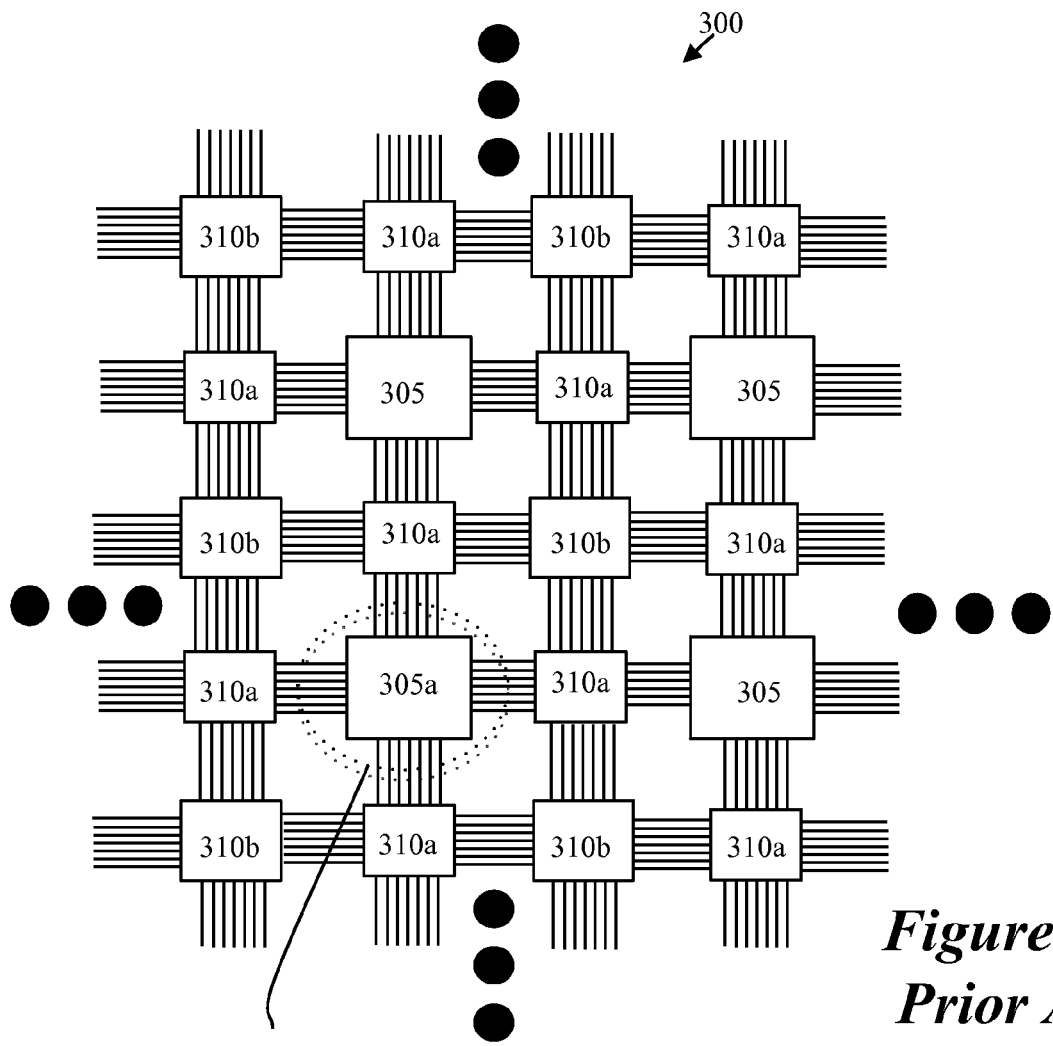
FIG. 3A illustrates a portion of a prior art configurable IC.
Figure 3A:
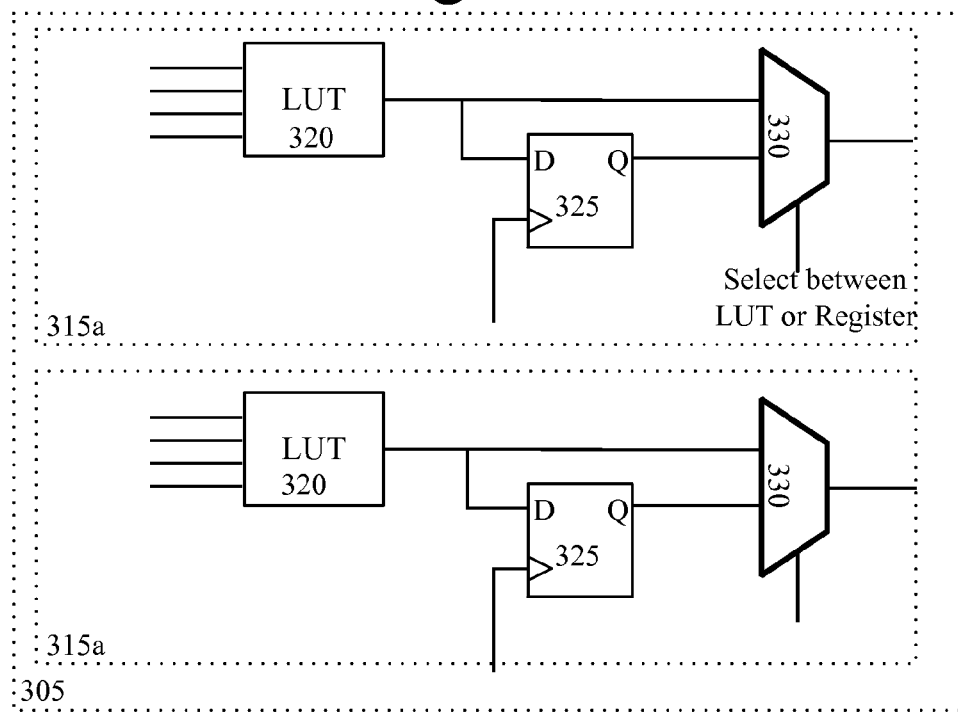
Figure 3B:
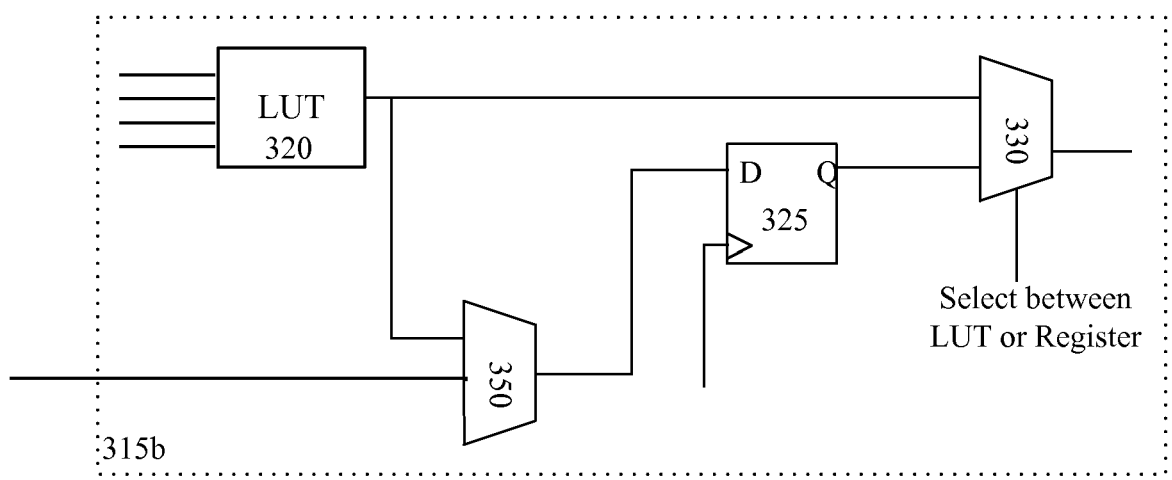
FIG. 3B illustrates an alternative way of constructing half a slice in a logic circuit of FIG. 3A.

In the following description, numerous details are set forth for purpose of explanation. However, one of ordinary skill in the art will realize that the invention may be practiced without the use of these specific details. For instance, not all embodiments of the invention need to be practiced with the specific number of bits and/or specific devices (e.g., multiplexers) referred to below. In other instances, well-known structures and devices are shown in block diagram form in order not to obscure the description of the invention with unnecessary detail.

I. Overview

Some embodiments provide a configurable IC that includes a configurable routing fabric with storage elements. In some embodiments, the routing fabric provides a communication pathway that routes signals to and from source and destination components. The routing fabric of some embodiments provides the ability to selectively store the signals passing through the routing fabric within the storage elements of the routing fabric. In this manner, a source or destination component continually performs operations (e.g., computational or routing) irrespective of whether a previous signal from or to such a component is stored within the routing fabric. The source and destination components include configurable logic circuits, configurable interconnect circuits, and various other circuits that receive or distribute signals throughout the configurable IC.

In some embodiments, the routing fabric includes routing circuits, the wire segments (e.g., the metal or polysilicon segments) that connect to the routing circuits, and vias that connect to these wire segments and to the terminals of the routing circuits. In some of these embodiments, the routing fabric also includes buffers for achieving one or more objectives (e.g., maintaining the signal strength, reducing noise, altering signal delay, etc.) visa vi the signals passing along the wire segments. In conjunction with or instead of these buffer circuits, the routing fabric of some embodiments might also include one or more non-configurable circuits (e.g., non-configurable interconnect circuits).

Different embodiments place storage elements at different locations in the routing fabric. Examples of such locations include storage elements coupled to or within the output stage of routing circuits, storage elements coupled to, cross-coupled to, or adjacent to buffer circuits in the routing fabric, and storage elements at other locations of the routing fabric.

For instance, in some embodiments, the routing fabric includes a parallel distributed path (PDP) for an output of a source component that is being routed through the routing fabric to an input of a destination component. A PDP includes a first path and a second path. The first path directly routes the output of the source to a first input of the destination, while the second path runs in parallel with the first path and passes the output of the source through a controllable storage element before reaching a second input of the destination. The storage element stores the output value of the source circuit when enabled. In addition to reaching the same destination component, some embodiments allow the second path to fan out to other destination components than the first path. In some embodiments, both the first and second paths of a PDP emanate from the output of a routing circuit that receives the output of the source component.

In some embodiments, the routing fabric includes routing circuits with storage elements located at their output stage. For a particular routing circuit that connects a particular source circuit to a particular destination circuit, the output of the particular routing circuit's storage element connects to an input of the destination circuit. When enabled, this storage holds the output of the source circuit for a particular duration (e.g., for one or more user design clock cycles or one or more sub-cycles). Typically, such a storage element is used to store data for a relatively small amount of time as its storage operation prevents the routing circuit from performing its routing operation. Accordingly, at times, this storage element is referred to below as a short-term storage element.

In addition to placing a short-term storage element at the output stage of a routing circuit, some embodiments place a "long-term" storage element in a feedback path between an output and input of the routing circuit. Such a storage element is referred to as a long-term storage element as it can be used to store data for a time duration that can be relatively long as the storage element does not disable the routing circuit's routing operation. In other words, the placement of the storage element in a feedback path of the routing circuit allows the routing circuit to continue performing its routing operations even when the storage element stores data. In some embodiments, either the short term or long term storage element of an interconnect circuit is performing a storage operation at any given time.

Some embodiments place the long-term storage element and the feedback path in series with the short term storage element. For instance, in some embodiments, the output of the routing circuit that passes through the short term storage element (1) is distributed to a destination component and (2) is distributed along the feedback path through the long term storage element to an input of the routing circuit.

Other embodiments position the long-term storage element and the feedback path in parallel with the short-term storage element. For instance, the output of the routing circuit can be distributed along two separate output paths. The first output path passes the output of the routing circuit through the short-term storage before reaching the input of a destination circuit (where in some embodiments this path reaches the destination circuit's input possibly through one or more wire segments, vias, and buffers). The second parallel output path passes the output of the routing circuit through the long-term storage element along the feedback path before passing this output back to an input of the routing circuit.

Some embodiments do not utilize any short-term storage at the output of a routing circuit, but only utilize a long-term storage in a feedback path between the output and input of a routing circuit. Other embodiments utilize a long-term storage that receives the output of a routing circuit but does not supply its output back to the same routing circuit. Instead, this long-term storage routes its output to an input of another routing circuit.

The PDP, short-term, and long-term storage elements are controllable storage elements that can controllably store data for arbitrary durations of time. In some embodiments, some or all of these storage elements are controlled by user design signals. In some embodiments, some or all of these storage elements are configurable storage elements whose storage operation is at least partly controlled by a set of configuration data stored in configuration data storage of the IC. For instance, in some embodiments, the set of configuration data determines the clock cycles or sub-cycles in which a PDP, short-term, or long-term storage element receives and stores data.

Some embodiments implement the storage elements described above using registers for all of the storage elements. Other embodiments use latches for some or all the storage elements. In some situations, latches have several advantages over registers. For instance, registers are edge triggered, i.e., their operation is driven by the rising or falling edge of a user design clock cycle or sub-cycle. This limitation on their operation imposes an arbitrary temporal hand, do not suffer from such arbitrary constraints as they can operate solely in response to an enable signal. Hence, they can typically operate transparently in response to enable signals that can even be asynchronous. This ability to operate transparently allows the operations of the latches to adjust flexibly to receive and output data whenever such data is provided or needed.

Some embodiments use complementary pass logic to implement some or all of their circuits. Some of these embodiments use a set of cross-coupling transistors to form some or all the storage elements. Cross-coupling transistors remove the signal delay associated with traditional storage elements such as registers or latches. Also, cross-coupling transistors operate solely in response to an enable signal and therefore allow the storage elements to operate transparently in response to the enable signal.

Several more detailed embodiments of the invention are described in the sections below. Before describing these embodiments further, an overview of the configurable IC architecture used by some embodiments to implement the routing fabric with storage elements is given in Section II below. This discussion is followed by the discussion in Section III of an overview of the reconfigurable IC architecture used by some embodiments to implement the routing fabric with storage elements. Next, Section IV describes various implementations of a configurable IC that includes storage elements in its routing fabric. Last, Section V describes an electronics system that has an IC which implements some of the embodiments of the invention.

II. Configurable IC Architecture

An IC is a device that includes numerous electronic components (e.g., transistors, resistors, diodes, etc.) that are embedded typically on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of substrate or wafer.

A configurable IC is an integrated circuit (IC) that has configurable circuits. A configurable circuit is a circuit that can "configurably" perform a set of operations. Specifically, a configurable circuit receives a configuration data set that specifies the operation that the configurable circuit has to perform in the set of operations that it can perform. In some embodiments, configuration data is generated outside of the configurable IC. In these embodiments, a set of software tools typically converts a high-level IC design (e.g., a circuit representation or a hardware description language design) into a set of configuration data bits that can configure the configurable IC (or more accurately, the configurable ICs configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions on its input data set.

A configurable interconnect circuit is a circuit that can configurably connect an input set to an output set in a variety of manners. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

The configurable IC of some embodiments includes configurable logic circuits and configurable interconnect circuits for routing the signals to and from the configurable logic circuits. In addition to configurable circuits, a configurable IC also typically includes non-configurable circuits (e.g., non-configurable logic circuits, interconnect circuits, memories, etc.).

Figure 4:
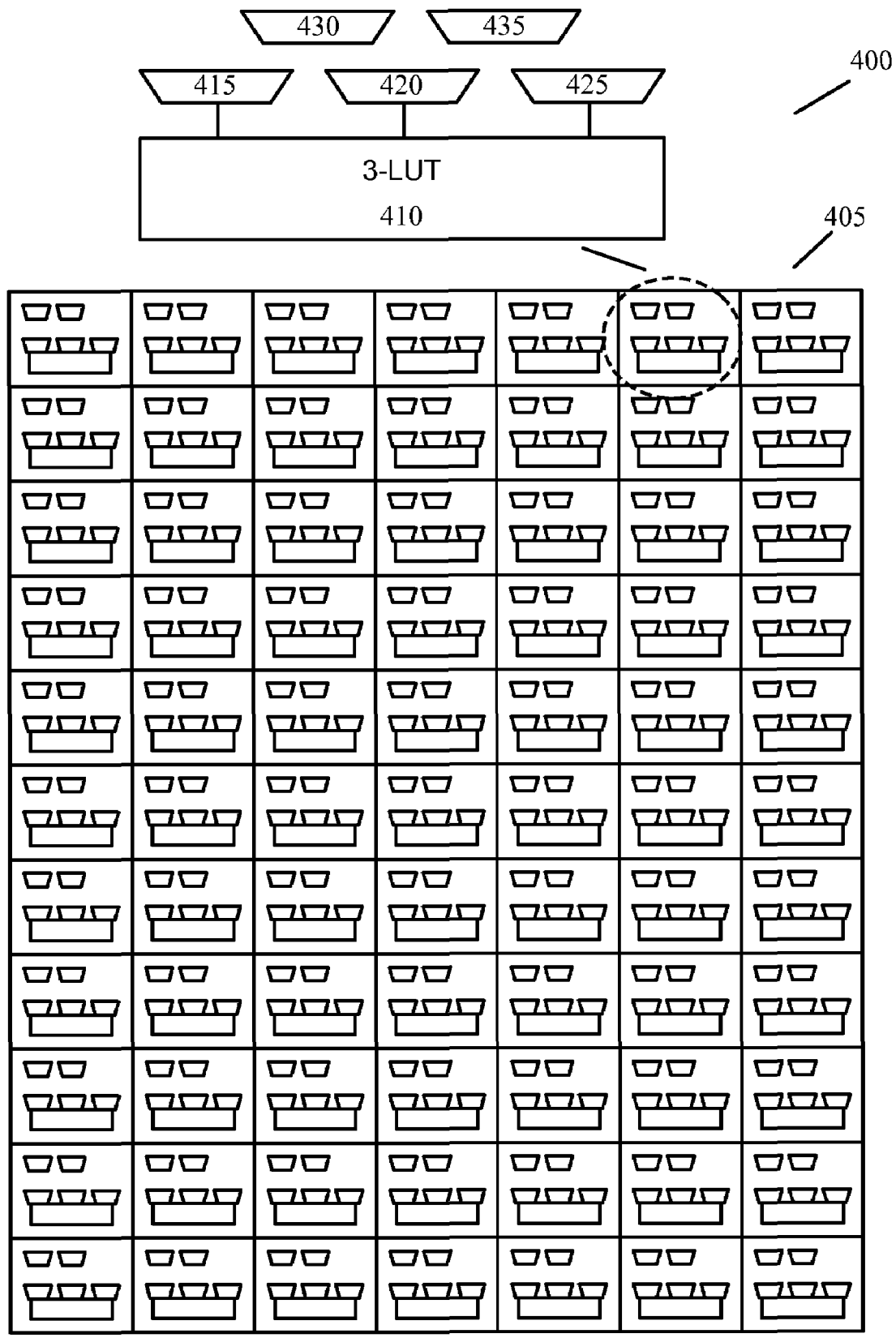
FIG. 4 illustrates a configurable circuit architecture that is formed by numerous configurable tiles that are arranged in an array with multiple rows and columns.
Figure 5:
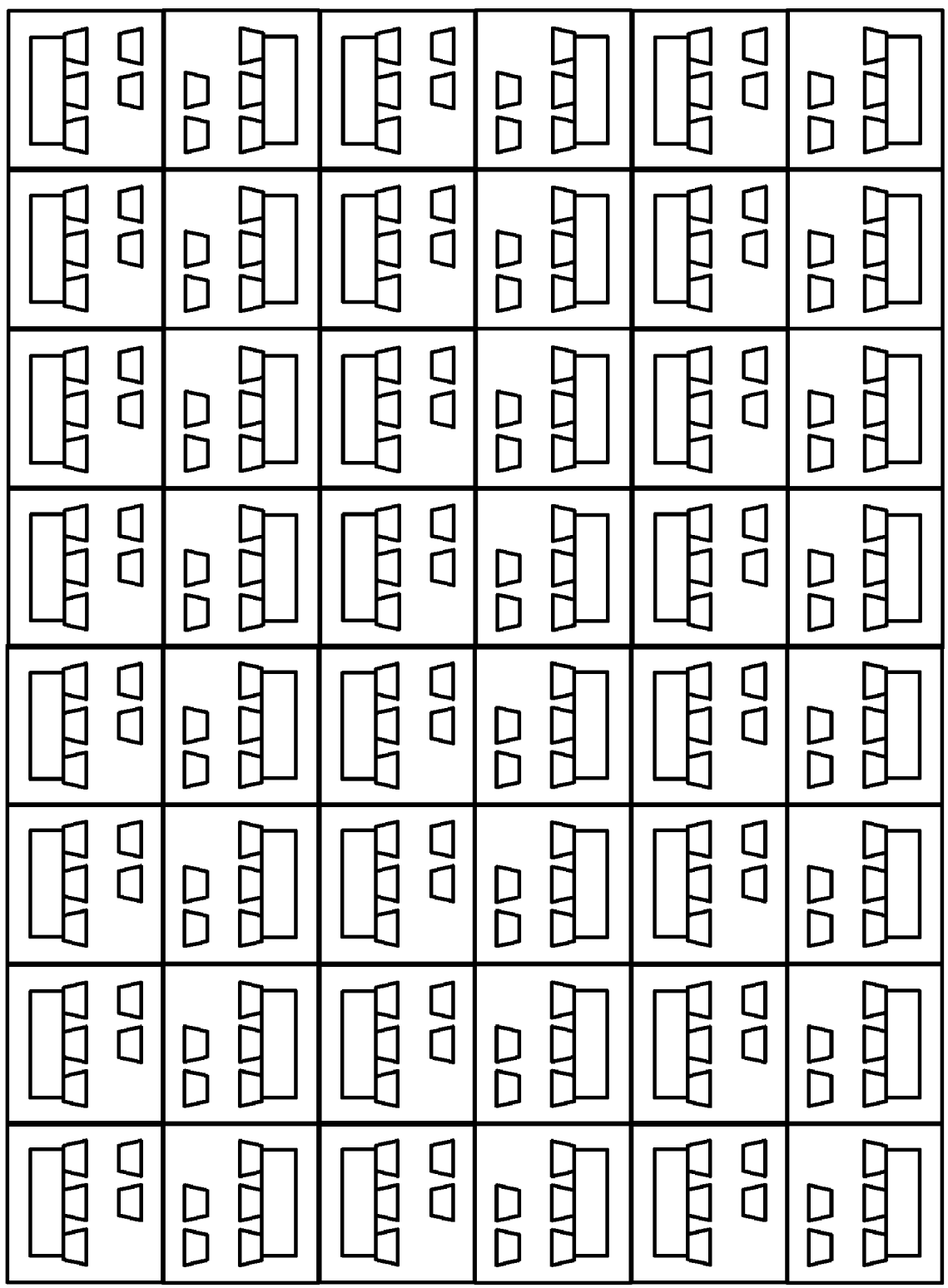
FIG. 5 provides one possible physical architecture of the configurable IC illustrated in FIG. 4.
Figure 6:
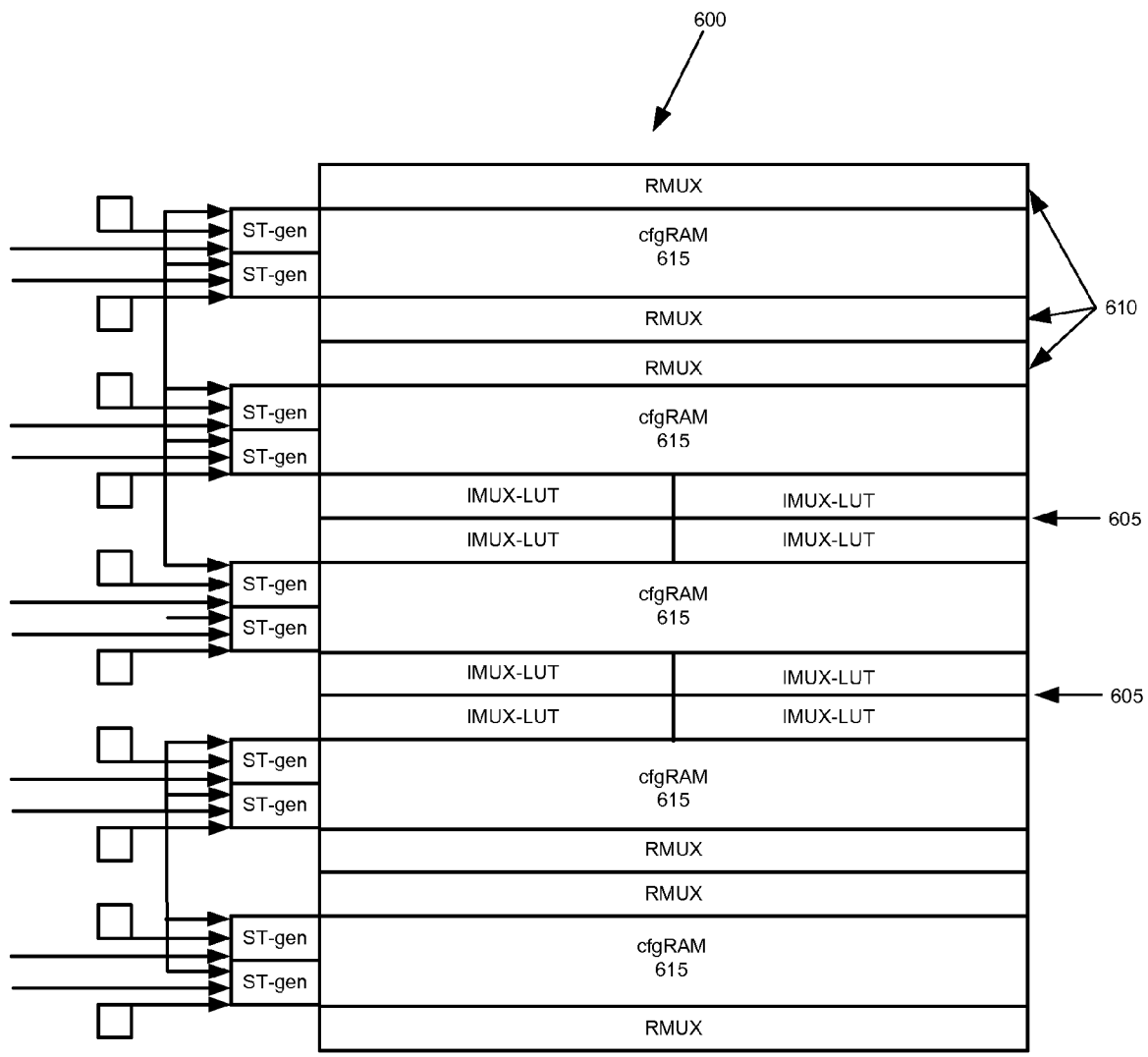
FIG. 6 illustrates the detailed tile arrangement of some embodiments.

In some embodiments, the configurable circuits might be organized in an arrangement that has all the circuits organized in an array with several aligned rows and columns. In addition, within such a circuit array, some embodiments disperse other circuits (e.g., memory blocks, processors, macro blocks, IP blocks, SERDES controllers, clock management units, etc.). FIGS. 4-6 illustrate several configurable circuit arrangements/architectures that include the invention's circuits. One such architecture is illustrated in FIG. 4.

The architecture of FIG. 4 is formed by numerous configurable tiles 405 that are arranged in an array with multiple rows and columns. In FIG. 4, each configurable tile includes a configurable three-input LUT 410, three configurable input-select multiplexers 415, 420, and 425, and two configurable routing multiplexers 430 and 435. Different embodiments have different number of configurable interconnect circuits 430. For instance, some embodiments may have eight configurable interconnect circuits while others may have more or less such circuits. For each configurable circuit, the configurable IC 400 includes a set of storage elements (e.g., a set of SRAM cells) for storing a set of configuration data bits.

In some embodiments, the logic circuits are look-up tables (LUTs) while the interconnect circuits are multiplexers. Also, in some embodiments, the LUTs and the multiplexers are sub-cycle reconfigurable circuits. In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits.

In FIG. 4, an input-select multiplexer (also referred to as an IMUX) 415 is an interconnect circuit associated with the LUT 410 that is in the same tile as the input select multiplexer. One such input select multiplexer receives several input signals for its associated LUT and passes one of these input signals to its associated LUT. In some embodiments, some of the input-select multiplexers are hybrid input-select/logic circuits (referred to as HMUXs) capable of performing logic operations as well as functioning as input select multiplexers. An HMUX is a multiplexer that can receive "user-design signals" along its select lines.

A user-design signal within a configurable IC is a signal that is generated by a circuit (e.g., logic circuit) of the configurable IC. The word "user" in the term "user-design signal" connotes that the signal is a signal that the configurable IC generates for a particular application that a user has configured the IC to perform. User-design signal is abbreviated to user signal in some of the discussion in this document. In some embodiments, a user signal is not a configuration or clock signal that is generated by or supplied to the configurable IC. In some embodiments, a user signal is a signal that is a function of at least a portion of the set of configuration data received by the configurable IC and at least a portion of the inputs to the configurable IC. In these embodiments, the user signal can also be dependent on (i.e., can also be a function of) the state of the configurable IC. The initial state of a configurable IC is a function of the set of configuration data received by the configurable IC and the inputs to the configurable IC. Subsequent states of the configurable IC are functions of the set of configuration data received by the configurable IC, the inputs to the configurable IC, and the prior states of the configurable IC.

In FIG. 4, a routing multiplexer (also referred to as an RMUX) 430 is an interconnect circuit that at a macro level connects other logic and/or interconnect circuits. In other words, unlike an input select multiplexer in these figures that only provides its output to a single logic circuit (i.e., that only has a fan out of 1), a routing multiplexer in some embodiments either provides its output to several logic and/or interconnect circuits (i.e., has a fan out greater than 1), or provides its output to at least one other interconnect circuit.

In some embodiments, the RMUXs depicted in FIG. 4 form the routing fabric along with the wire-segments that connect to the RMUXs, and the vias that connect to these wire segments and/or to the RMUXs. In some embodiments, the routing fabric further includes buffers for achieving one or more objectives (e.g., maintain the signal strength, reduce noise, alter signal delay, etc.) visa vi the signals passing along the wire segments.

Various wiring architectures can be used to connect the RMUXs, IMUXs, and LUTs. Several examples of the wire connection scheme are described in U.S. application Ser. No. 11/082,193 entitled "Configurable IC with Routing Circuits with Offset Connections", filed on Mar. 15, 2005.

Several embodiments are described below by reference to a "direct connection." In some embodiments, a direct connection is established through a combination of one or more wire segments, and potentially one or more vias, but no intervening circuit. In some embodiments, a direct connection might however include one or more intervening buffer circuits but no other type of intervening circuits. In yet other embodiments, a direct connection might include intervening non-configurable circuits instead of or in conjunction with buffer circuits. In some of these embodiments, the intervening non-configurable circuits include interconnect circuits, while in other embodiments they do not include interconnect circuits.

In the discussion below, two circuits might be described as directly connected. This means that the circuits are connected through a direction connection. Also, some connections are referred to below as configurable connections and some circuits are described as configurably connected. Such references signifies that the circuits are connected through a configurable interconnect circuit (such as a configurable routing circuit).

In some embodiments, the examples illustrated in FIG. 4 represent the actual physical architecture of a configurable IC. However, in other embodiments, the examples illustrated in FIG. 4 topologically illustrate the architecture of a configurable IC (i.e., they conceptually show the configurable IC without specifying a particular geometric layout for the position of the circuits).

In some embodiments, the position and orientation of the circuits in the actual physical architecture of a configurable IC are different from the position and orientation of the circuits in the topological architecture of the configurable IC. Accordingly, in these embodiments, the ICs physical architecture appears quite different from its topological architecture. For example, FIG. 5 provides one possible physical architecture of the configurable IC 400 illustrated in FIG. 4.

Having the aligned tile layout with the same circuit elements of FIG. 5 simplifies the process for designing and fabricating the IC, as it allows the same circuit designs and mask patterns to be repetitively used to design and fabricate the IC. In some embodiments, the similar aligned tile layout not only has the same circuit elements but also have the same exact internal wiring between their circuit elements. Having such layout further simplifies the design and fabrication processes as it further simplifies the design and mask making processes.

Some embodiments might organize the configurable circuits in an arrangement that does not have all the circuits organized in an array with several aligned rows and columns. Therefore, some arrangements may have configurable circuits arranged in one or more arrays, while other arrangements may not have the configurable circuits arranged in an array.

Some embodiments might utilize alternative tile structures. For instance, FIG. 6 illustrates an alternative tile structure that is used in some embodiments. This tile 600 has two sets 605 of 4-aligned LUTs along with their associated IMUXs. It also includes six sets 610 of RMUXs and five banks 615 of configuration RAM storage. Each 4-aligned LUT tile shares one carry chain. One example of which is described in U.S. application Ser. No. 11/082,193 entitled "Configurable IC with Routing Circuits with Offset Connections", filed on Mar. 15, 2005. One of ordinary skill in the art would appreciate that other organizations of LUT tiles may also be used in conjunction with the invention and that these organizations might have fewer or additional tiles.

III. Reconfigurable IC Architecture

Some embodiments of the invention can be implemented in a reconfigurable integrated circuit that has reconfigurable circuits that reconfigure (i.e., base their operation on different sets of configuration data) one or more times during the operation of the IC. Specifically, reconfigurable ICs are configurable ICs that can reconfigure during runtime. A reconfigurable IC typically includes reconfigurable logic circuits and/or reconfigurable interconnect circuits, where the reconfigurable logic and/or interconnect circuits are configurable logic and/or interconnect circuits that can "reconfigure" more than once at runtime. A configurable logic or interconnect circuit reconfigures when it bases its operation on a different set of configuration data.

A reconfigurable circuit of some embodiments that operates on four sets of configuration data receives its four configuration data sets sequentially in an order that loops from the first configuration data set to the last configuration data set. Such a sequential reconfiguration scheme is referred to as a 4 "loopered" scheme. Other embodiments, however, might be implemented as six or eight loopered sub-cycle reconfigurable circuits. In a six or eight loopered reconfigurable circuit, a reconfigurable circuit receives six or eight configuration data sets in an order that loops from the last configuration data set to the first configuration data set.

Figure 7:
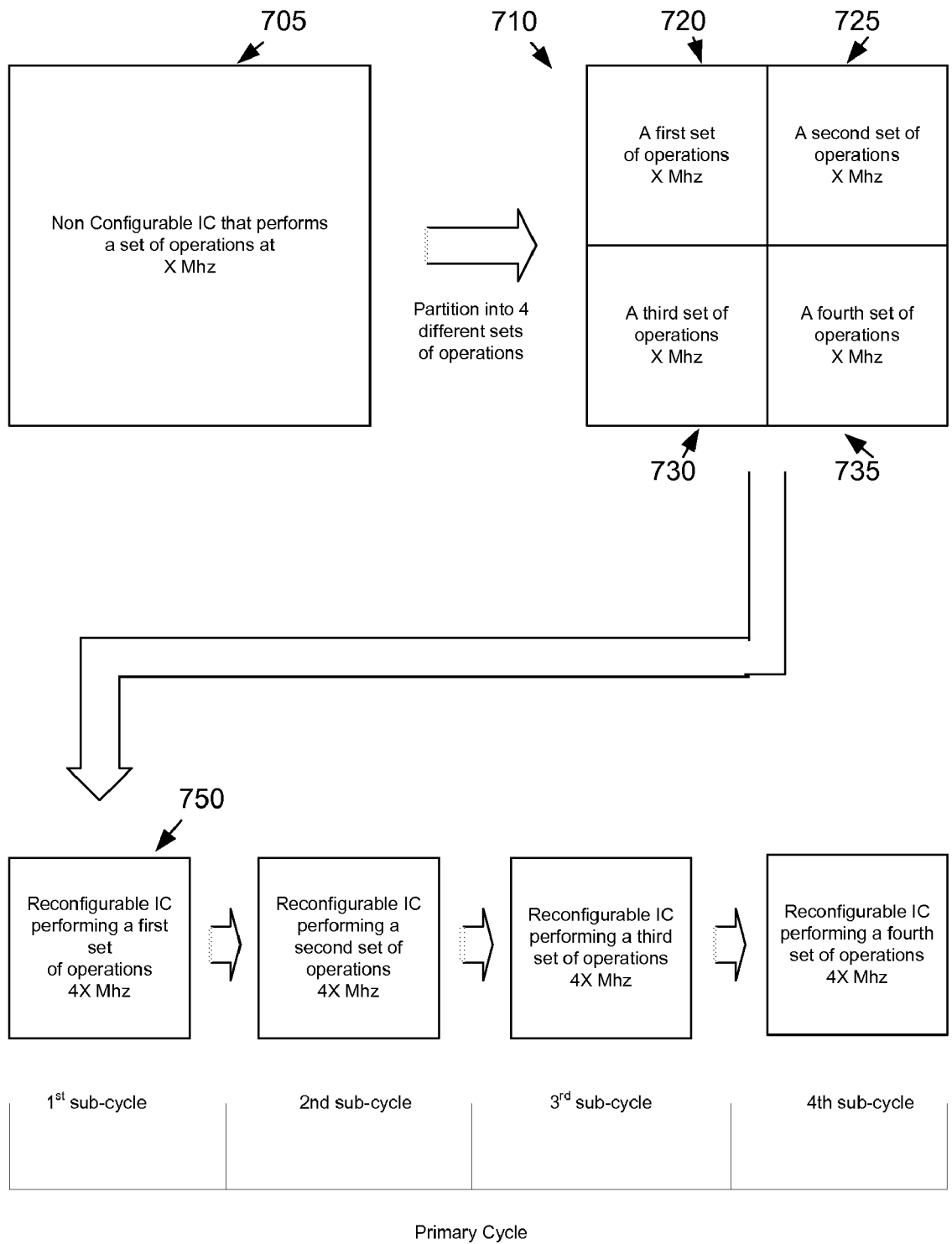
FIG. 7 illustrates an example of a sub-cycle reconfigurable IC.

FIG. 7 conceptually illustrates an example of a sub-cycle reconfigurable IC (i.e., an IC that is reconfigurable on a sub-cycle basis). In this example, the sub-cycle reconfigurable IC implements an IC design 705 that operates at a clock speed of X MHz. The operations performed by the components in the IC design 705 can be partitioned into four sets of operations 720-735, with each set of operations being performed at a clock speed of X MHz.

FIG. 7 then illustrates that these four sets of operations 720-735 can be performed by one sub-cycle reconfigurable IC 710 that operates at 4×MHz. In some embodiments, four cycles of the 4×MHz clock correspond to four sub-cycles within a cycle of the X MHz clock. Accordingly, this figure illustrates the reconfigurable IC 710 reconfiguring four times during four cycles of the 4×MHz clock (i.e., during four sub-cycles of the X MHz clock). During each of these reconfigurations (i.e., during each sub-cycle), the reconfigurable IC 710 performs one of the identified four sets of operations. In other words, the faster operational speed of the reconfigurable IC 710 allows this IC to reconfigure four times during each cycle of the X MHz clock, in order to perform the four sets of operations sequentially at a 4×MHz rate instead of performing the four sets of operations in parallel at an X MHz rate.

IV. Storage Elements within the Routing Fabric

As mentioned above, the configurable routing fabric of some embodiments is formed by configurable RMUXs along with the wire-segments that connect to the RMUXs, vias that connect to these wire segments and/or to the RMUXs, and buffers that buffer the signals passing along one or more of the wire segments. In addition to these components, the routing fabric of some embodiments further includes configurable storage elements.

Having the storage elements within the routing fabric is highly advantageous. For instance, such storage elements obviate the need to route data computed by a source component to a second component that stores the computed data before routing the data to a destination component that will use the data. Instead, such computed data can be stored optimally within storage elements located along the routing paths between source and destination components, which can be logic and/or interconnect circuits within the IC.

Such storage functionality within the routing fabric is ideal when in some embodiments the destination component is unable to receive or process the signal from the source component during a certain time period. This functionality is also useful in some embodiments when a signal from a source component has insufficient time to traverse the defined route to reach the destination within a single clock cycle or sub-cycle and needs to be temporarily stored along the route before reaching the destination in a later clock cycle (e.g., user-design clock cycle) or in a later sub-cycle in case of a sub-cycle reconfigurable IC. By providing storage within the routing fabric, the source and destination components continue to perform operations (e.g., computational or routing) during the required storage time period.

Figure 8:
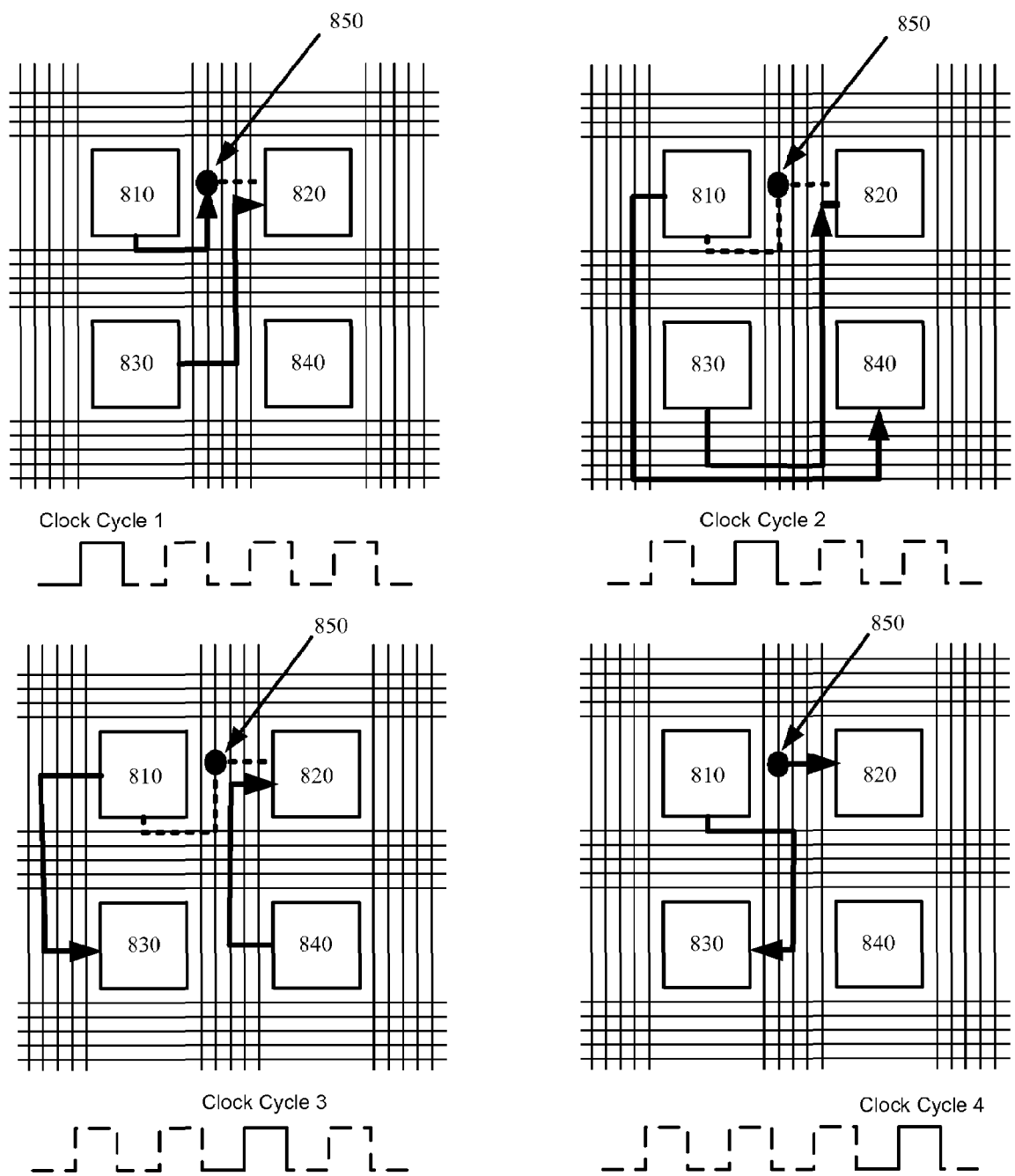
FIG. 8 provides an illustrative embodiment of the functionality provided by placing storage elements within the routing fabric of a configurable IC.

FIG. 8 provides an illustrative example of the functionality provided by placing storage elements within the routing fabric of a configurable IC. In FIG. 8, a component 810 is outputting a signal for processing by component 820 at clock cycle 1. However, component 820 is receiving a signal from component 830 at clock cycles 1 and 2 and a signal from component 840 at clock cycle 3. Therefore, the signal from 810 may not be routed to 820 until clock cycle 4. Hence, the signal is stored within the storage element 850 located within the routing fabric. By storing the signal from 810 within the routing fabric during clock cycles 1 through 3, components 810 and 820 remain free to perform other operations during this time period. At clock cycle 4, 820 is ready to receive the stored signal and therefore the storage element 850 releases the value. It should be apparent to one of ordinary skill in the art that the clock cycles of some embodiments described above could be either (1) sub-cycles within or between different user design clock cycles of a reconfigurable IC, (2) user-design clock cycles, or (3) any other clock cycle.

Figure 9:
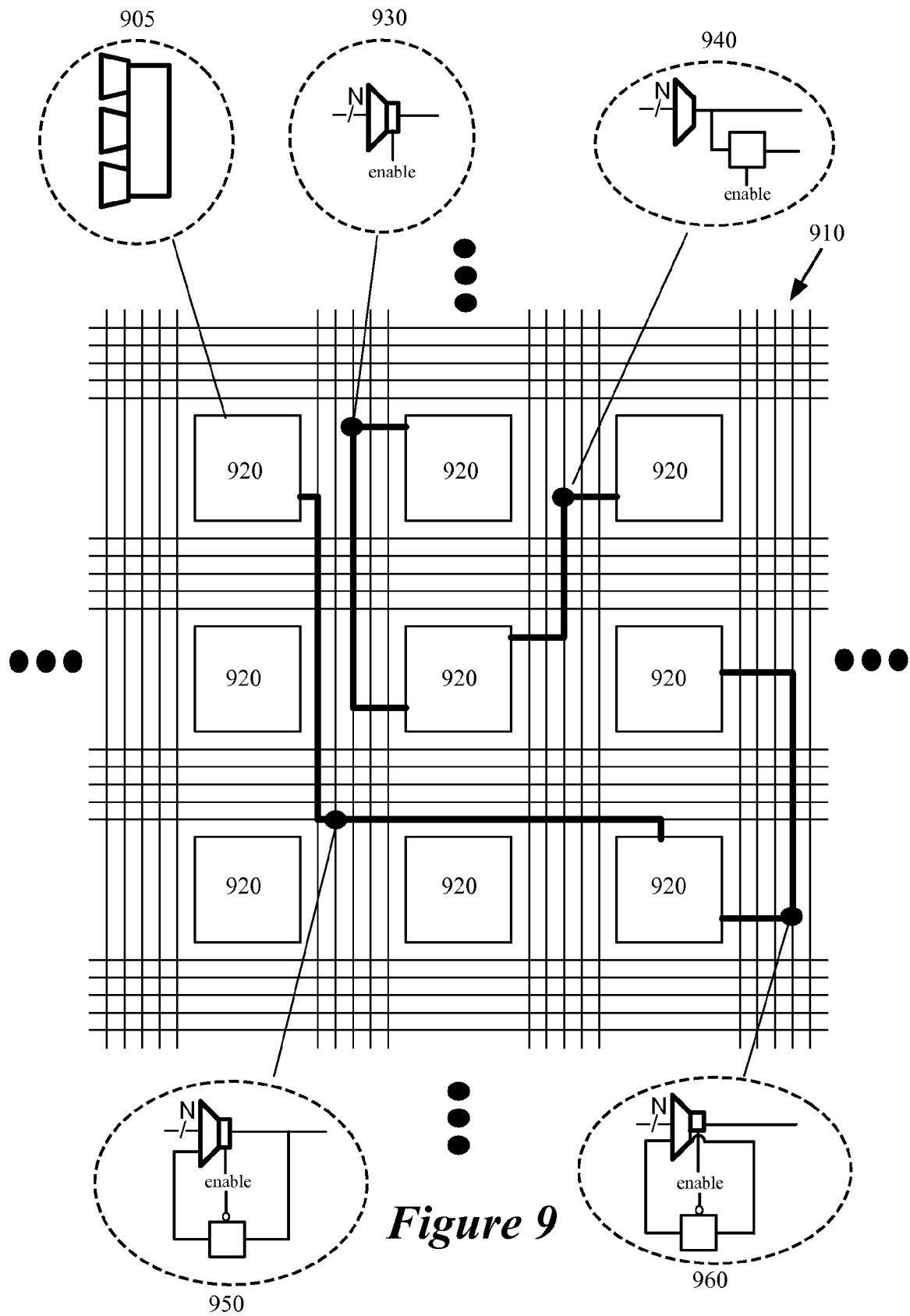
FIG. 9 illustrates placement of a storage element within the routing fabric of a configurable IC.

FIG. 9 illustrates several examples of different types of controllable storage elements 930-960 that can be located throughout the routing fabric 910 of a configurable IC. Each storage element 930-960 can be controllably enabled to store an output signal from a source component that is to be routed through the routing fabric to some destination component. In some embodiments, some or all of these storage elements are configurable storage elements whose storage operation is controlled by a set of configuration data stored in configuration data storage of the IC. U.S. patent application Ser. No. 11/081,859 describes a two-tiered multiplexer structure for retrieving enable signals on a sub-cycle basis from configuration data storage for a particular configurable storage. It also describes building the first tier of such multiplexers within the output circuitry of the configuration storage that stores a set of configuration data. Such multiplexer circuitry can be used in conjunction with the configurable storage elements described above and below. U.S. patent application Ser. No. 11/081,859 is incorporated herein by reference.

As illustrated in FIG. 9, outputs are generated from the circuit elements 920. The circuit elements 920 are configurable logic circuits (e.g., 3-input LUTs and their associated IMUXs as shown in expansion 905), while they are other types of circuits in other embodiments. In some embodiments, the outputs from the circuit elements 920 are routed through the routing fabric 910 where the outputs can be controllably stored within the storage elements 930-960 of the routing fabric. Storage element 930 is a storage element that is coupled to the output of a routing multiplexer. This storage element will be further described below by reference to FIGS. 10 and 11. Storage element 940 includes a routing circuit with a parallel distributed output path in which one of the parallel distributed paths contains a storage element. This storage element will be further described below by reference to FIGS. 13A and 13B. Storage elements 950 and 960 include a routing circuit with a set of storage elements in which a second storage element is connected in series or in parallel to the output path of the routing circuit. Storage element 950 will be further described below by reference to FIG. 17 and storage element 960 by reference to FIG. 20.

One of ordinary skill in the art will realize that the depicted storage elements within the routing fabric sections of FIG. 9 only present some embodiments of the invention and do not include all possible variations. Some embodiments use all these types of storage elements, while other embodiments do not use all these types of storage elements (e.g., use one or two of these types).

A. Storage Element at Output of a Routing Multiplexer

Figure 10:
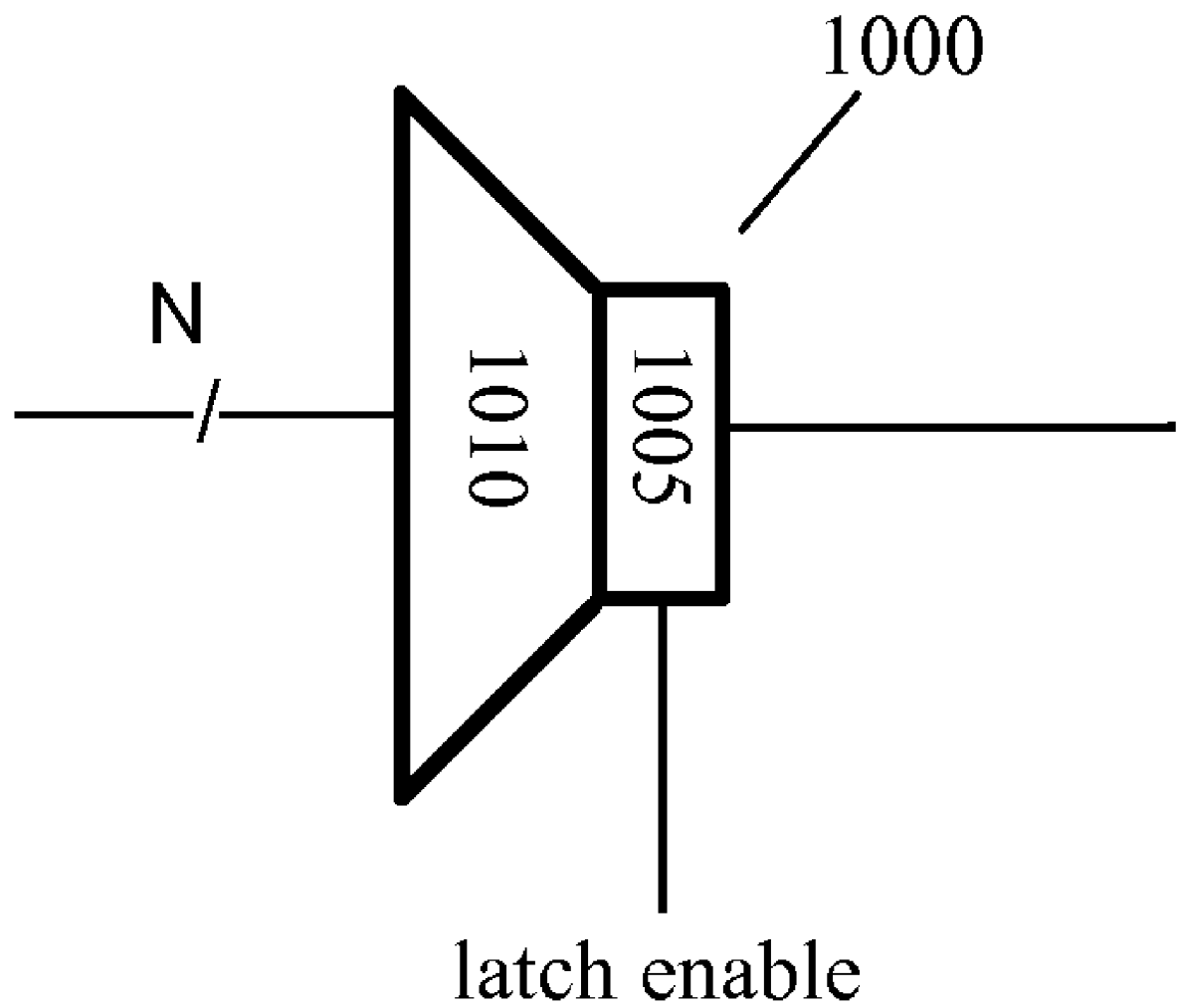
FIG. 10 illustrates a circuit representation of a storage circuit.

FIG. 10 illustrates a circuit representation of the storage element 930. In some embodiments, the storage element 930 is a latch 1005 that is built in or placed at the output stage of a multiplexer 1010. The latch 1005 receives a latch enable signal. When the latch enable signal is inactive, the circuit simply acts as a routing circuit. On the other hand, when the latch enable signal is active, the circuit acts as a latch that outputs the value that the circuit was previously outputting while serving as a routing circuit. Accordingly, when another circuit in a second later configuration cycle needs to receive the value of circuit 1000 in a first earlier configuration cycle, the circuit 1000 can be used. The circuit 1000 may receive and latch the value in a cycle before the second later configuration cycle (e.g., in the first earlier cycle) and output the value to the second circuit in the second later sub-cycle.

Figure 11:
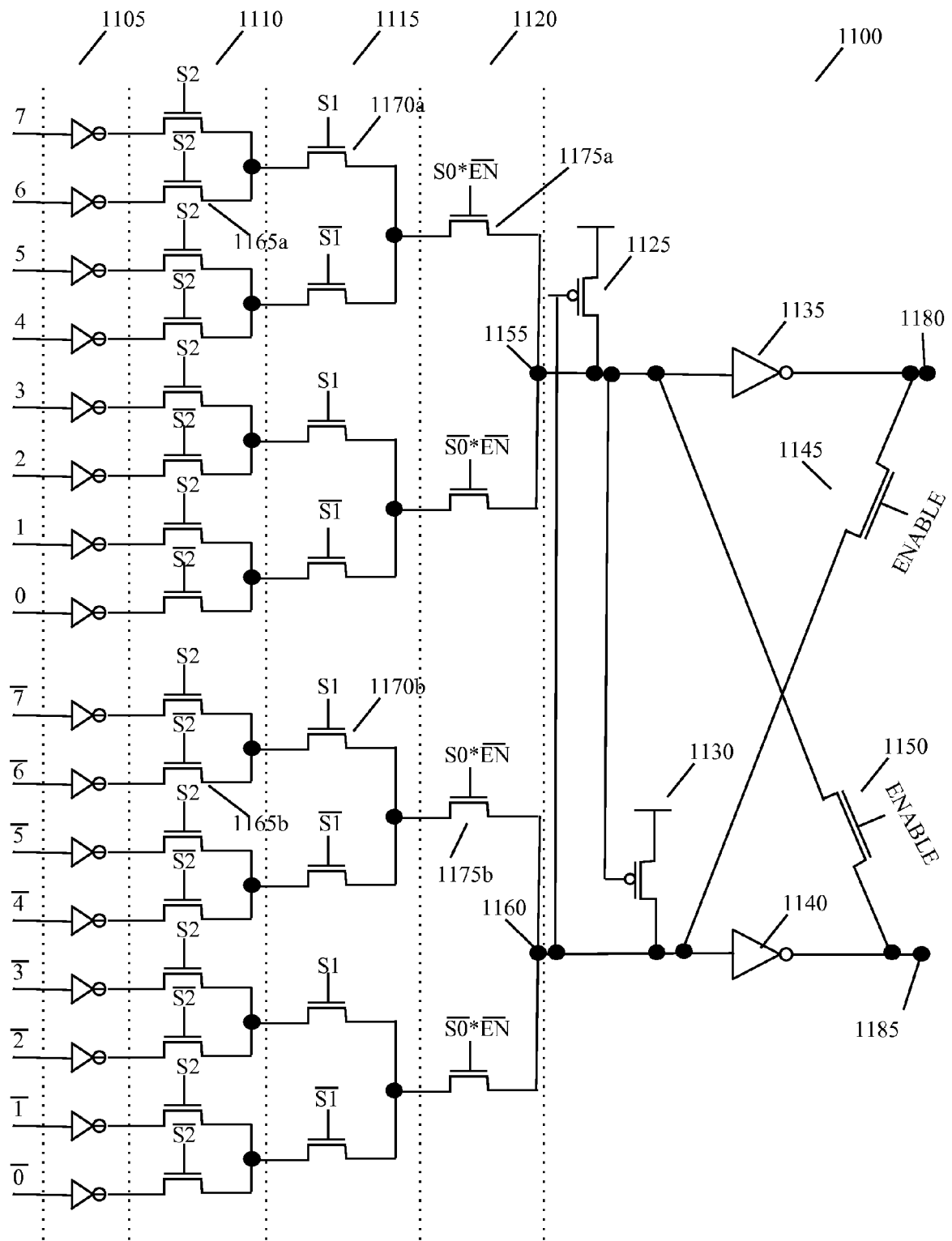
FIG. 11 illustrates another alternative implementation of a storage circuit.

FIG. 11 illustrates an implementation of the circuit 1000, where the latch is built into the output stage of the multiplexer 1010 by using a pair of cross-coupling transistors. As shown in this figure, the circuit 1100 includes (1) one set of input buffers 1105, (2) three sets 1110, 1115, and 1120 of NMOS pass gate transistors, (3) two pull-up PMOS transistors 1125 and 1130, (4) two inverting output buffers 1135 and 1140, and (5) two cross-coupling transistors 1145 and 1150.

The circuit 1100 is an eight-to-one multiplexer that can also serve as a latch. The inclusions of the two transistors 1145 and 1150 that cross couple the two output buffers 1135 and 1140 and the inclusion of the enable signal with a signal that drives the last set 1120 of the pass transistors of the eight-to-one multiplexer allow the eight-to-one multiplexer 1100 to act as a storage element whenever the enable signal is active (which, in this case, means whenever the enable signal is high).

In a CPL implementation of a circuit, a complementary pair of signals represents each logic signal, where an empty circle at or a bar over the input or output of a circuit denotes the complementary input or output of the circuit in the figures. In other words, the circuit receives true and complement sets of input signals and provides true and complement sets of output signals. Accordingly, in the multiplexer 1100 of FIG. 11, one subset of the input buffers 1105 receives eight input bits (0-7), while another subset of the input buffers 1105 receives the complement of the eight inputs bits. These input buffers serve to buffer the first set 1110 of pass transistors.

The first set 1110 of pass transistors receive the third select bit S2 or the complement of this bit, while the second set 1115 of pass transistors receive the second select bit S1 or the complement of this bit. The third set 1120 of pass transistors receive the first select bit or its complement after this bit has been "AND'ed" by the complement of the enable signal. When the enable bit is not active (i.e., in this case, when the enable bit is low), the three select bits S2, S1, and S0 cause the pass transistors to operate to pass one of the input bits and the complement of this input bit to two intermediate output nodes 1155 and 1160 of the circuit 1100. For instance, when the enable signal is low, and the select bits are 011, the pass transistors 1165a, 1170a, 1175a, and 1165b, 1170b, and 1175b turn on to pass the 6 and 6 input signals to the intermediate output nodes 1155 and 1160.

In some embodiments, the select signals S2, S1, and S0 as well as the enable signal are a set of configuration data stored in configuration data storage of the IC. In some embodiments, the configuration data storage stores multiple configuration data sets. The multiple configuration data sets define the operation of the storage elements during differing clock cycles, where the clock cycles of some embodiments include user design clock cycles or sub-cycles of a user design clock cycle of a reconfigurable IC. Circuitry for retrieving a set of configuration data bits from configuration data storage is disclosed in U.S. patent application Ser. No. 11/081,859.

The pull-up PMOS transistors 1125 and 1130 are used to pull-up quickly the intermediate output nodes 1155 and 1160, and to regenerate the voltage levels at the nodes that have been degenerated by the NMOS threshold drops, when these nodes need to be at a high voltage. In other words, these pull-up transistors are used because the NMOS pass transistors are slower than PMOS transistors in pulling a node to a high voltage. Thus, for instance, when the $6^{th}$ input signal is high, the enable signal is low, and the select bits are 011, the pass transistors 1165-1175 start to pull node 1155 high and to push node 1160 low. The low voltage on node 1160, in turn, turns on the pull-up transistor 1125, which, in turn, accelerates the pull-up of node 1155.

The output buffer inverters 1135 and 1140 are used to isolate the circuit 1100 from its load. Alternatively, these buffers may be formed by more than one inverter, but the feedback is taken from an inverting node. The outputs of these buffers are the final output 1180 and 1185 of the multiplexer/latch circuit 1100. It should be noted that, in an alternative implementation, the output buffers 1135 and 1140 are followed by multiple inverters.

The output of each buffer 1135 or 1140 is cross-coupling to the input of the other buffer through a cross-coupling NMOS transistor 1145 or 1150. These NMOS transistors are driven by the enable signal. Whenever the enable signal is low, the cross-coupling transistors are off, and hence the output of each buffer 1135 or 1140 is not cross-coupling with the input of the other buffer. Alternatively, when the enable signal is high, the cross-coupling transistors are ON, which cause them to cross-couple the output of each buffer 1135 or 1140 to the input of the other buffer. This cross-coupling causes the output buffers 1135 and 1140 to hold the value at the output nodes 1180 and 1185 at their values right before the enable signal went active. Also, when the enable signal goes active, the signal that drives the third set 1120 of pass transistors (i.e., the "AND'ing" of the complement of the enable signal and the first select bit S0) goes low, which, in turn, turns off the third pass-transistor set 1120 and thereby turns off the multiplexing operation of the multiplexer/latch circuit 1100.

Figure 12:
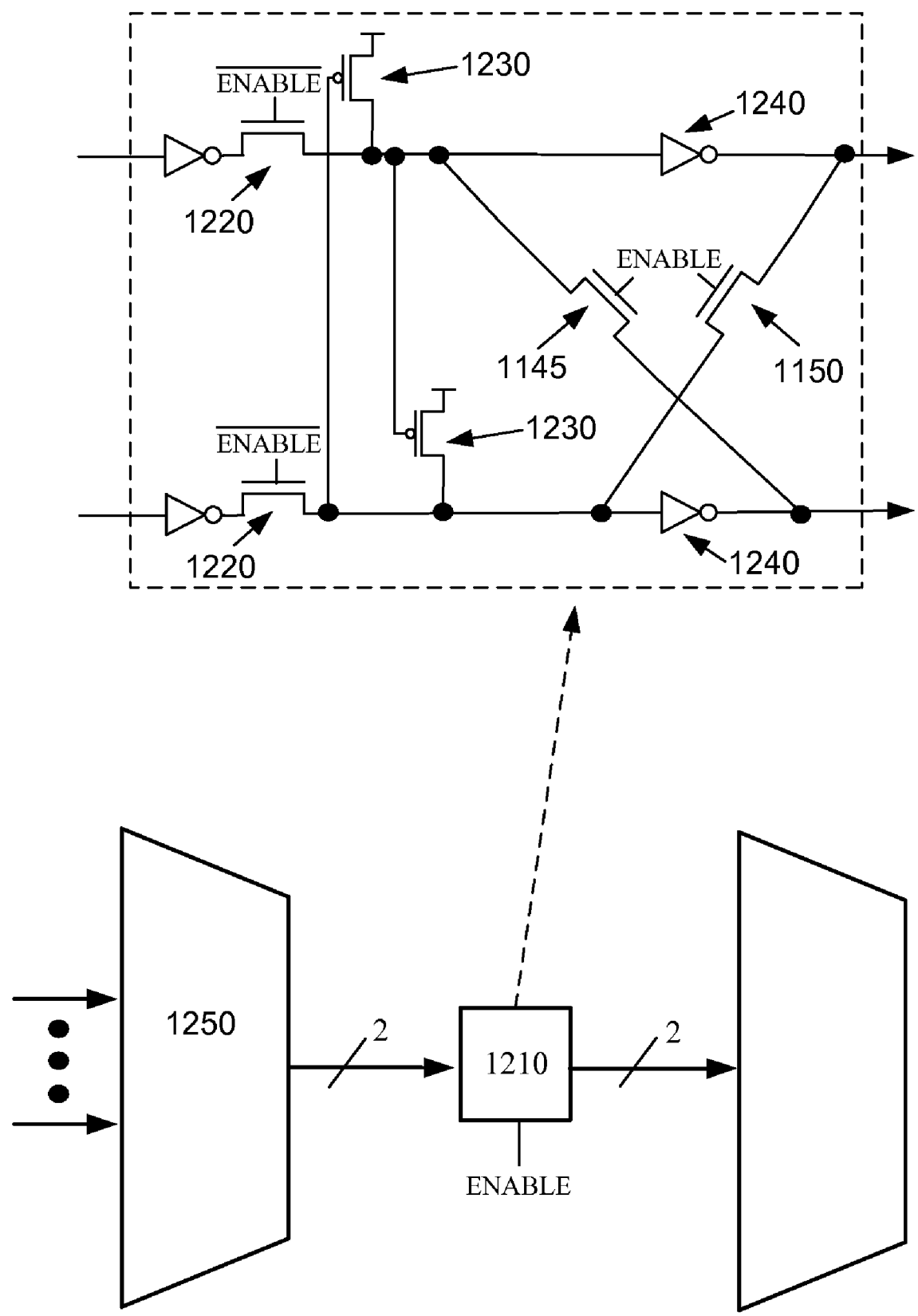
FIG. 12 illustrates an implementation of a storage circuit within the routing fabric.

In FIG. 11, the transistors 1145 and 1150 are cross-coupled at the output stage of the routing circuit. Alternatively, as illustrated in FIG. 12, some embodiments place the cross-coupled transistors 1145 and 1150 in the routing fabric to establish a configurable storage element within the routing fabric outside of the routing multiplexer (such as multiplexer 1100). In FIG. 12, the routing multiplexer 1250 of some embodiments comprises sections 1105, 1110, 1115, and 1120 of FIG. 11. In order to isolate the signal within the storage element 1210 of the routing fabric, some embodiments place isolation devices 1220 within or immediately before the storage element 1210. The isolation devices prevent the input signals to the storage element 1210 from converging with the signals passing through the cross-coupled transistors 1145 and 1150 of the storage element 1210 when the enable signal is asserted. Therefore, when the enable signal is asserted, the isolation devices 1220 prevent further input signals from entering the storage element 1210. Moreover, the asserted enable signal causes the cross coupled transistors 1145 and 1150 to store the signal currently passing through the storage element 1210. Furthermore, a pair of level restorers 1230 are used to quickly restore degraded high levels passing into the storage element 1210 and to prevent leakage in the inverters 1240 that the level restorers are driving.

In some embodiments (e.g., some embodiments that are not runtime reconfigurable), the latch enable signal of FIG. 10, 11, or 12 (referred to as Latch Enable in FIG. 10 and ENABLE in FIGS. 11 and 12) is one configuration data bit for all clock cycles. In other embodiments (e.g., some embodiments that are runtime reconfigurable), this enable signal corresponds to multiple configuration data sets, with each set defining the operation of the storage elements 1005, 1190, and 1210 during differing clock cycles. These differing clock cycles might be different user design clock cycles, or different sub-cycles of a user design clock cycle or some other clock cycle.

In FIGS. 10 and 11, the operations of the multiplexers 1010 and 1105-1120 are controlled by configuration data retrieved from configuration data storage. In some embodiments (e.g., some embodiments that are not runtime reconfigurable), the configuration data for each multiplexer is one configuration data set for all clock cycles. In other embodiments (e.g., some embodiments that are runtime reconfigurable), this configuration data corresponds to multiple configuration data sets, with each set defining the operation of the multiplexer during differing clock cycles, which might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

Other embodiments might construct the storage element 1210 differently (e.g., the storage element 1210 might not use isolation devices 1220 and/or the level restorers 1230). Some embodiments might also use an alternative circuit structure for defining storage elements outside of RMUXs in the routing fabric.

B. Storage Via a Parallel Distributed Path

In different embodiments, storage elements can be defined at different location in the routing fabric. FIGS. 13-29 illustrate several examples, though one of ordinary skill in the art will realize that it is, of course, not possible to describe every conceivable combination of components or methodologies for different embodiments of the invention. One of ordinary skill in the art will recognize that many further combinations and permutations of the invention are possible.

Figure 13A:
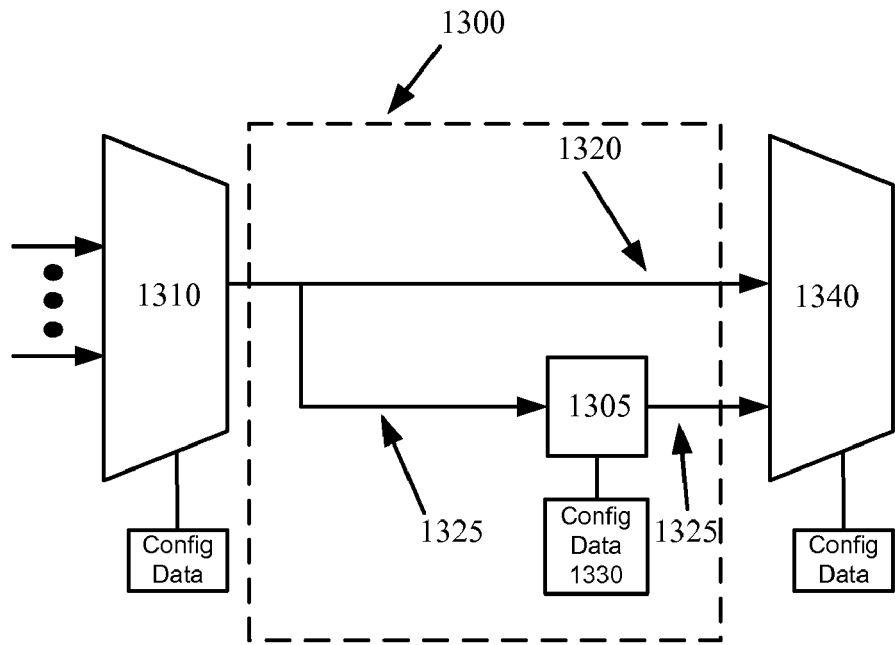
FIG. 13A illustrates a storage circuit with a parallel distributed output path for providing simultaneous routing and storage capability at the interconnect.

FIG. 13A presents one exemplary embodiment of a routing fabric section 1300 that performs routing and storage operations by distributing an output signal of a routing circuit 1310 through a parallel distributed path (PDP) to a first input of a destination 1340, which in some embodiments might be (1) an input-select circuit for a logic circuit, (2) a routing circuit, or (3) some other type of circuit. The PDP includes a first path and a second path. In some embodiments, the first path 1320 of the PDP directly connects the output of the routing circuit 1310 to the destination 1340 (i.e., the first path 1320 is a direct connection that routes the output of the routing circuit directly to the destination 1340).

In some embodiments, the second parallel path 1325 runs in parallel with the first path 1320 and passes the output of the routing circuit 1310 through a controllable storage element 1305, where the output may be optionally stored (e.g., when the storage element 1305 is enabled) before reaching a second input of the destination 1340. In some embodiments, the connection between the circuit 1310 and storage element 1305 and the connection between the storage element 1305 and the circuit 1340 are direct connections.

As mentioned above, a direct connection is established through a combination of one or more wire segments and/or one or more vias. In some of these embodiments, a direct connection might include intervening non-configurable circuits, such as (1) intervening buffer circuits in some embodiments, (2) intervening non-buffer, non-configurable circuits in other embodiments, or (3) a combination of such buffer and non-buffer circuits in yet other embodiments. In some embodiments, one or more of the connections between circuits 1310, 1305 and 1340 are configurable connection.

Because of the second parallel path, the routing circuit 1310 of FIG. 13A is used for only one clock cycle to pass the output into the controllable storage element 1305. Therefore, storage can be provided for during the same clock cycle in which the routing operation occurs. Moreover, the PDP allows the output stage of the routing circuit 1310 to remain free to perform routing operations in subsequent clock cycles while storage occurs.

Figure 13B:
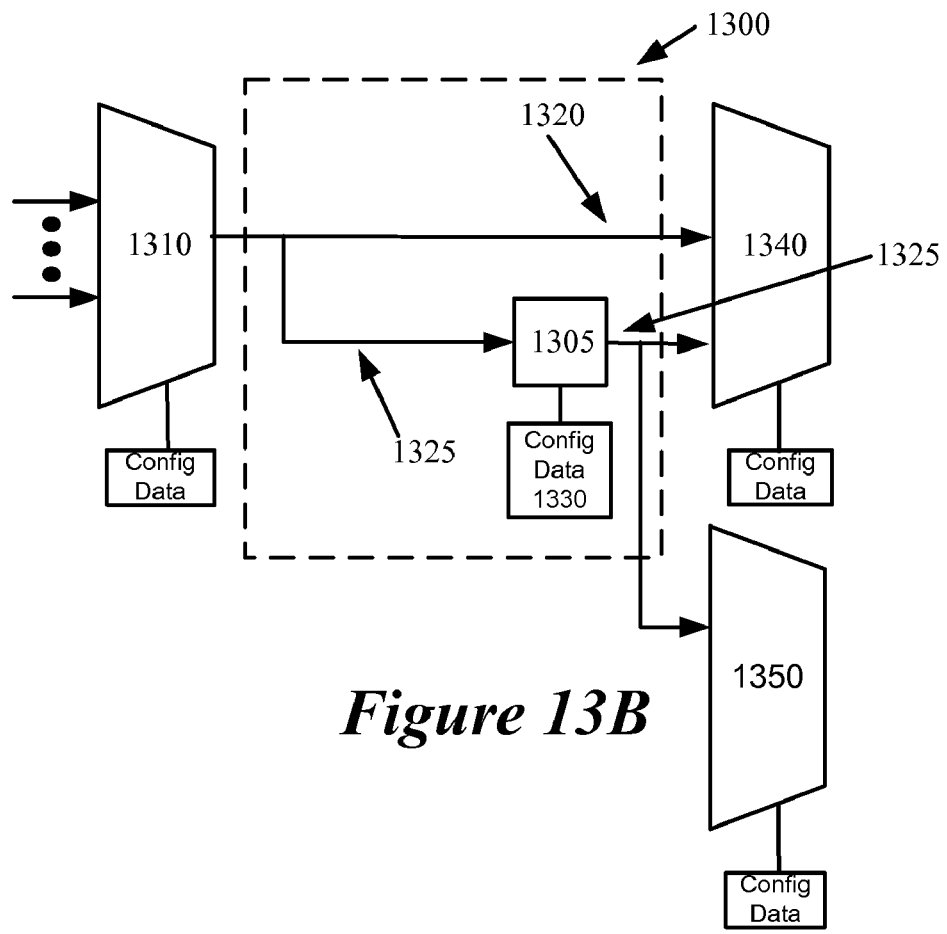
FIG. 13B illustrates a storage circuit with a parallel distributed in which the parallel path is distributed to multiple destinations.

Some embodiments require the second parallel path of a PDP to reach (i.e., connect) to every destination that the first parallel path of the PDP reaches (i.e., connects). Some of these embodiments allow, however, the second parallel path to reach (i.e., to connect) destinations that are not reached (i.e., that are not connected to) by the first parallel path. FIG. 13B illustrates an example of this concept.

In FIG. 13B, the first path 1320 and the second path 1325 of the PDP connect to the destination 1340. Additionally, the second path 1325 connects (e.g., directly connects in some embodiments while configurably connecting in other embodiments) to an alternate destination 1350. This additional connection to the destination 1350 permits the storage element 1305 within the second path 1325 to provide storage for multiple destination circuits 1340 and 1350 without restricting the functionality of the source circuit 1310 or the multiple destination circuits 1340 and 1350. Moreover, the stored signal can be distributed to multiple destination circuits at different clock cycles without having to re-store the signal or store the signal at a different location. For example, path 1325 of FIG. 13B routes the signal within storage element 1305 to destinations 1340 and 1350 at a first clock cycle. During this first clock cycle, destination 1340 may elect to receive the signal while destination 1350 ignores the input from path 1325 until it is ready to process the signal at a second clock cycle. The storage element 1305 can nevertheless continue storing the signal until the second clock cycle at which time the destination 1350 receives the signal.

The controllable storage elements 1305 of FIGS. 13A and 13B controllably store the value output from the routing circuit 1310. When the storage element 1305 is enabled (e.g., receives a high enable signal) by the set of configuration data 1330, the storage element 1305 stores the output of the routing circuit 1310. Storage may occur for multiple subsequent clock cycles as determined by the set of configuration data 1330. During storage, the output path of the routing circuit 1310 remains unrestricted, therefore permitting the routing fabric section 1300 to simultaneously perform routing and storage operations. For instance, at a first clock cycle, the configuration data sets of the circuits 1305 and 1310 cause the routing circuit 1310 to output one of its inputs and cause the storage element 1305 to store this output of the routing circuit 1310. At a second clock cycle, the set of configuration data 1330 can cause the routing circuit 1310 to output another value from the same or different input than the input used in the first clock cycle, while the storage element 1305 continues storing the previous output. The output of the routing circuit 1310 generated during the second clock cycle is then routed to the destination 1340 via the first output path 1320.

In some embodiments, the configuration data set 1330 for the storage element 1305 come at least partly from configuration data storage of the IC. In some embodiments (e.g., some embodiments that are not runtime reconfigurable), the configuration data storage stores one configuration data set (e.g., one bit or more than one bit) for all clock cycles. In other embodiments (e.g., embodiments that are runtime reconfigurable and have runtime reconfigurable circuits), the configuration data storage 1330 stores multiple configuration data sets, with each set defining the operation of the storage element during differing clock cycles. These differing clock cycles might be different user design clock cycles, or different sub-cycles of a user design clock cycle or some other clock cycle.

As shown in FIGS. 13A and 13B, the routing operations of the routing circuit 1310 are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuit 1310 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

Figure 14:
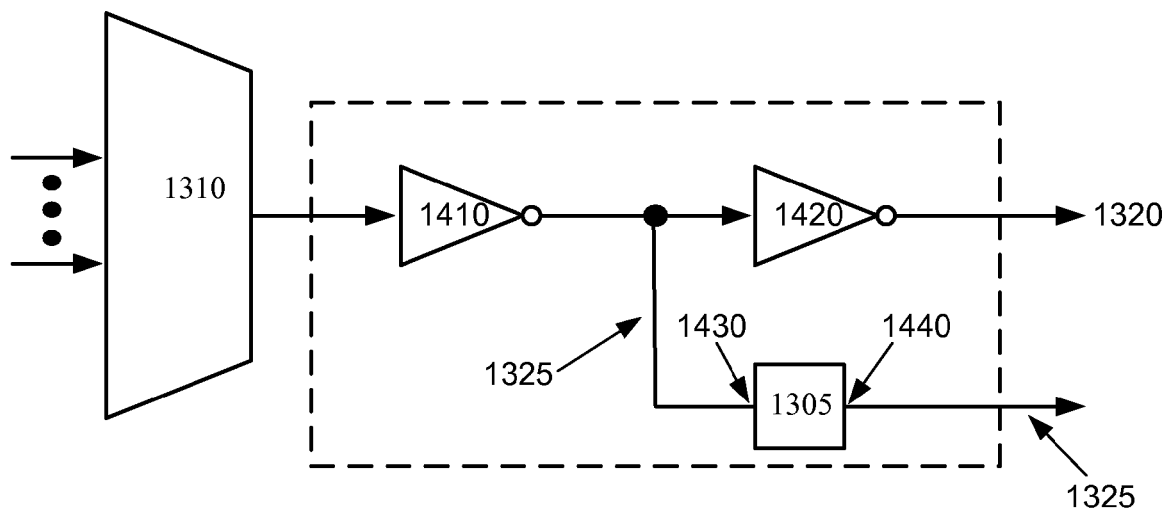
FIG. 14 illustrates a circuit for generating a parallel distributed output path.
Figure 15:
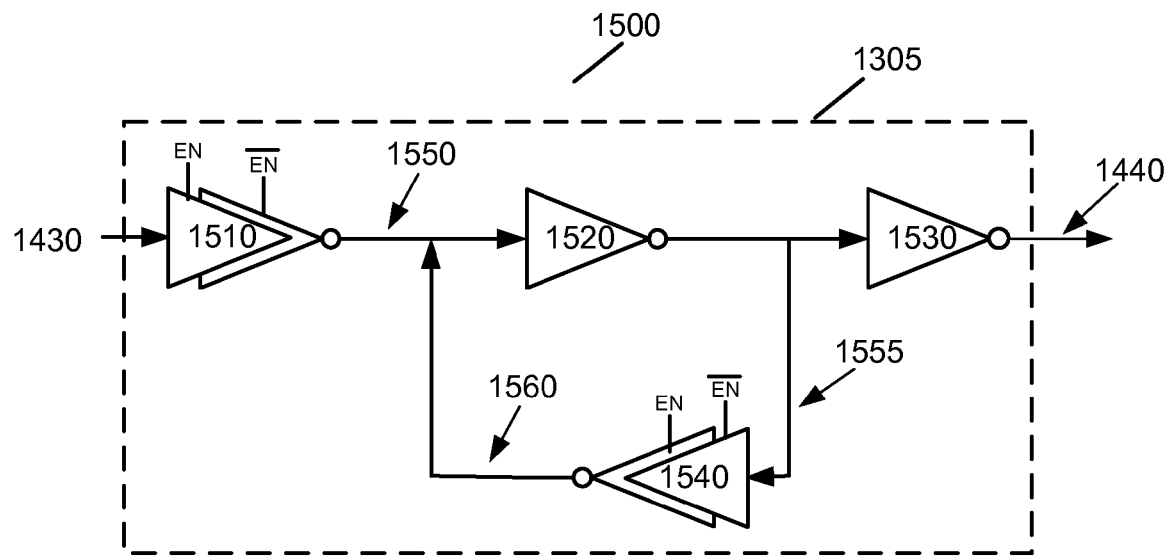
FIG. 15 illustrates a cross-coupling transistor storage element.

FIGS. 14 and 15 present an implementation of the routing fabric section 1300 with the direct connections of the parallel distributed path of some embodiments. As shown in FIG. 14, the parallel distributed output paths 1320 and 1325 from the routing circuit 1310 are generated by first passing the output of the routing circuit 1310 through a series of inverters. In some embodiments, some or all of these inverters 1410 and 1420 are separate from the routing circuit 1310. Alternatively, in some embodiments, some or all these inverters 1410 and 1420 are part of the routing circuit 1310 (e.g., are part of the output stage of the routing circuit 1310).

In FIG. 14, the first path of the parallel distributed output 1320 is generated from the value of the second inverter 1420 which is subsequently routed to a destination. By passing the output of the routing circuit 1310 through a pair of inverters 1410 and 1420, the destination receives the same output value it would have directly received had the output of the routing circuit 1310 been directly routed to the destination. The second path of the parallel distributed output 1325 is generated from the output of the first inverter 1410. In this manner, the storage element 1305 receives the inverted output of the routing circuit 1310.

In some embodiments of the routing fabric section 1300 of FIGS. 13A and 13B, the storage element 1305 may be implemented with any traditional storage element such as flip-flops, registers, latches, etc. However, in conjunction with FIG. 14, some embodiments must couple an inverter to the storage element 1305 to restore the original output value of the routing circuit 1310 when outputting to the destination or other destinations through the second parallel path 1325. In other embodiments of the routing fabric section 1300, instead of using traditional latches for the storage elements, some embodiments implement the storage elements using the CPL cross-coupling transistor implementation of FIG. 11 or alternatively through a CMOS implementation.

Figure 16A:
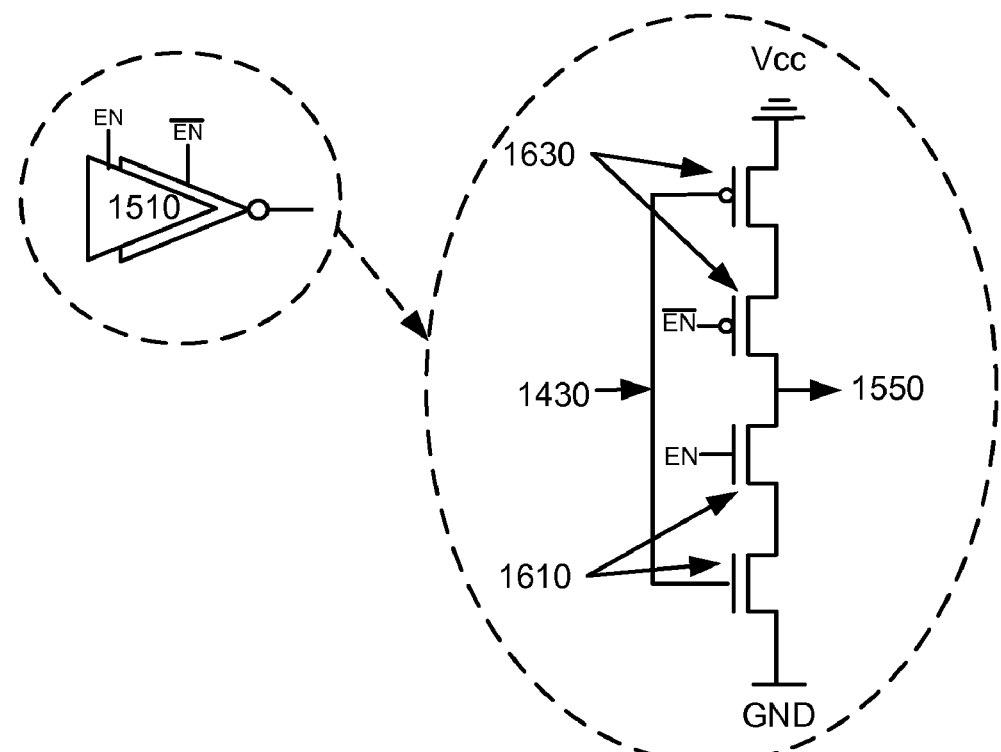
FIG. 16A illustrates a circuit representation for a first tri-state inverter of FIG. 15.
Figure 16B:
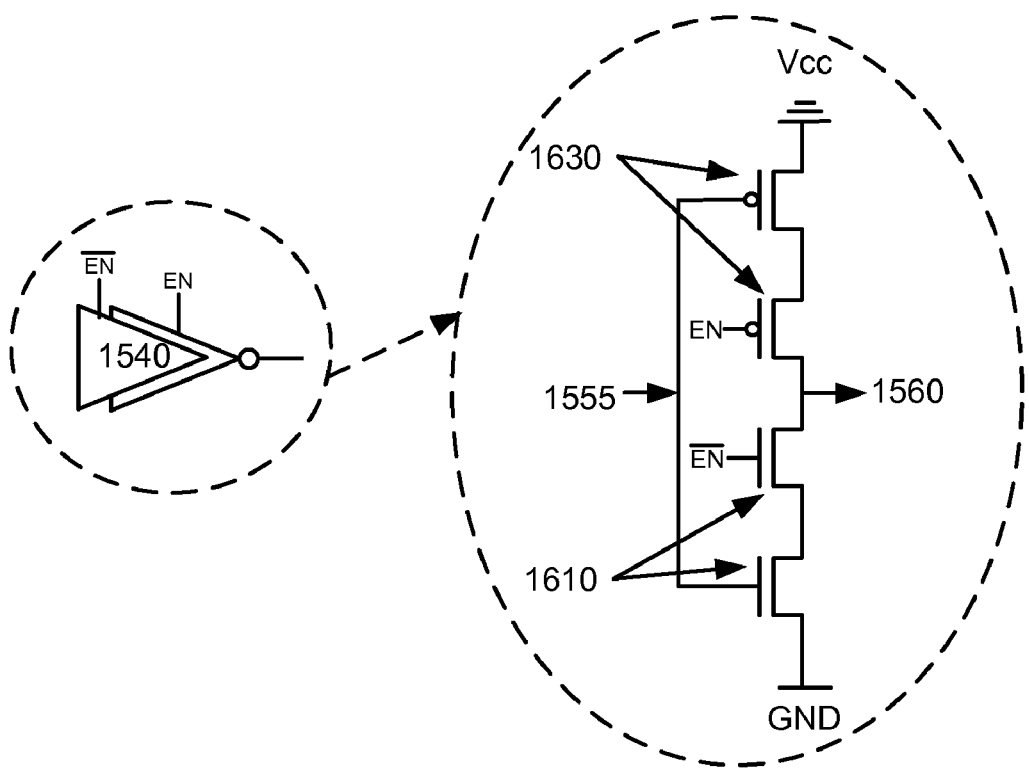
FIG. 16B illustrates a circuit representation for a second tri-state inverter of FIG. 15.

FIGS. 15 and 16 illustrate one such CMOS implementation of the storage element 1305 of FIG. 14. The storage element 1500 receives as input the signal 1430 passing through the directly connected parallel path 1325 with a source component and outputs the signal 1440 to the second path directly connected to a destination component. The storage element 1305 includes a pair of CMOS inverters 1520 and 1530 and a pair of tri-state inverters 1510 and 1540, which, as further described below by reference to FIGS. 16A and 16B, are controlled by an enable signal and its complement.

Inverters 1510, 1520, and 1530 are connected in series. When the enable signal is high, the series of inverters 1510, 1520, and 1530 pass through and invert the input from the parallel path 1325 after the input has passed through the inverter 1410 above. Upon output at the third inverter 1530, the original value of the multiplexer 1310 will have been restored. As shown in FIG. 13A, this restored original value will be passed from the storage element 1305 and will continue along the second parallel path 1325 until reaching destination 1340 or the multiple destinations 1340 and 1350 of FIG. 13B.

If the enable signal to the first tri-state inverter 1510 is low, the first tri-state inverter 1510 does not pass through and invert the signal coming in from the second parallel path 1325. Instead, the first tri-state inverter 1510 acts to isolate the storage element 1500 from the signal. FIG. 16A illustrates an example of a circuit implementation for the first tri-state inverter 1510. The tri-state inverter 1510 includes two NMOS transistors 1610, one which receives the input 1430 and one which receives the enable signal. The tri-state inverter further includes two PMOS transistors 1630, one which receives the input 1430 and the other which receives the complement of the enable signal. In FIG. 16A, the tri-state inverter 1510 inverts the input 1430 when the enable signal is high and acts as an open circuit (e.g., open switch) when the enable signal is low.

FIG. 16B illustrates an example of a circuit implementation for the second tri-state inverter 1540. Unlike the first tri-state inverter 1510, the second tri-state inverter 1540 is activated by a low enable signal. By swapping the enable signal and the complement to the enable signal, the second tri-state inverter 1540 has the opposite functionality to that of the first tri-state inverter 1510. Therefore, the second tri-state inverter 1540 acts as an open switch when the enable is high and acts as an inverter that sets up an inverting feedback path between the output 1560 and input 1555 of the inverter 1540 when the enable is low.

Moreover, because the inverter 1510 is not propagating the signal 1325 when the signal is low, this coupling of invertors 1520 and 1540 creates a feedback path that stores a value within the circuit 1500 so long as the enable signal remains low. During this time, the third inverter 1530 will receive its input from the feedback path. Therefore, while the enable signal is low, the circuit 1500 will output at 1440 the value stored within the feedback path to destination 1340 via the second parallel path 1325.

Re-assertion of the enable signal (e.g., enable is high) stops the inverter 1540 from propagating the stored signal, effectively removing the feedback path which causes the circuit 1500 to stop storing a value. Instead, a new value is input into the storage element 1500 via the first inverter 1510 which resumes signal propagation.

C. Storage Via a Feedback Path Connected in Series

In some embodiments, the routing fabric provides storage through storage elements located within a feedback path and/or at the output stage of routing circuits. For a particular routing circuit that connects a particular source circuit to a particular destination circuit, the output of the particular routing circuit's storage element connects to an input of the destination circuit. When enabled, this storage holds the output of the source circuit for a particular duration (e.g., for one or more clock cycles). Typically, such a storage element is used to store data for a relatively small amount of time as its storage operation prevents the routing circuit from performing its routing operation. Accordingly, at times, this storage element is referred to below as a short-term storage element.

In addition to placing a short-term storage element at the output stage of a routing circuit, some embodiments place a "long-term" storage element in a feedback path between an output and input of the routing circuit. Such a storage element is referred to as a long-term storage element as it can be used to store data for a time duration that can be relatively long as the storage element does not disable the routing circuit's routing operation. In other words, the placement of the storage element in a feedback path of the routing circuit allows the routing circuit to continue performing its routing operations even when the storage element stores data. Moreover, by implementing the long term storage within a feedback circuit, overall wire congestion needed for storage within the routing fabric is reduced as only a single input is required at the destination to route an output signal or a previously stored signal.

Figure 17:
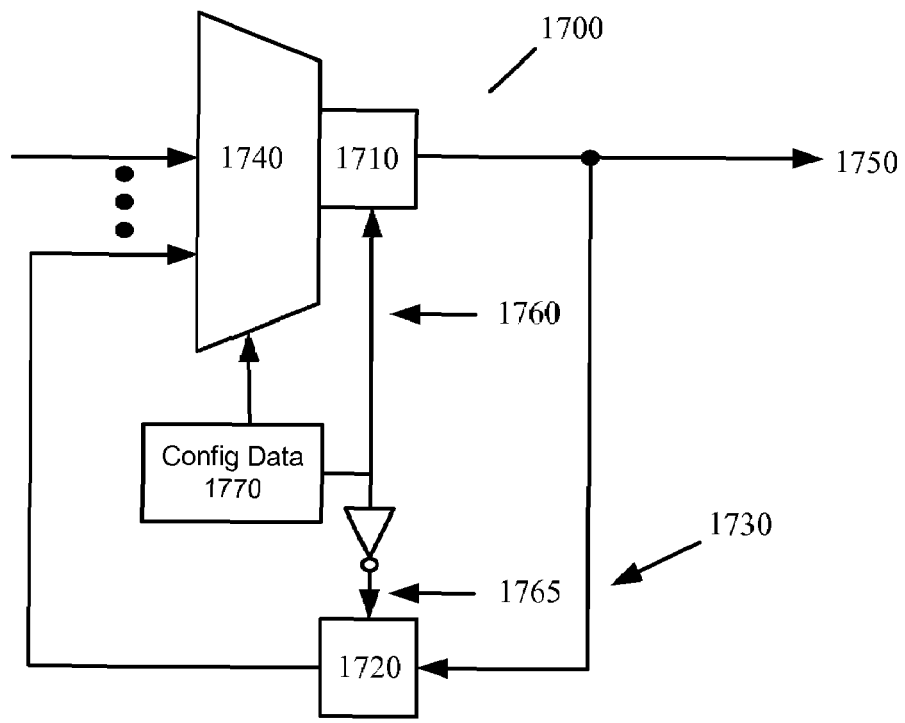
FIG. 17 illustrates a storage element within the routing fabric with a feedback path connected in series to the output of a routing circuit.

FIG. 17 illustrates an example of short and long term storage elements. The routing fabric section 1700 includes the short term configurable storage element 1710 at the output stage of a source component 1740. The source 1740 is illustrated in FIG. 17 as an interconnect circuit (e.g., a routing multiplexer or other routing circuit), though it should be apparent to one of ordinary skill in the art that the source 1740 may include any configurable IC component which receives or distributes signals throughout the routing fabric. The second configurable storage element, referred to as the long term storage, is implemented via the feedback path 1730 which is connected in series to the short term storage section 1710.

In some embodiments, the short term storage section 1710 operates in a manner similar to those described with respect to FIGS. 10 and 11. The short term storage 1710 receives an enable signal 1760. When the enable signal 1760 is inactive, the circuit simply distributes the current output to the destination 1750 and the feedback path 1730. In some embodiments, the connection from the short term storage 1710 to the destination 1750 is a direct connection. When the enable signal 1760 is active, the circuit acts as a latch that stores the current value and continually outputs that value so long as the enable signal 1760 remains active.

However, continued use of the short term storage 1710 causes the routing fabric section 1700 to perform only storage operations and therefore restricts the routing functionality of the routing fabric section 1700. For example, storing a value within the short term storage 1710 for three clock cycles prevents the routing circuit 1740 of the routing fabric section 1700 from performing routing operations for the later two of the three clock cycles. Therefore, a second storage section 1720 is used for long term storage when storing a value for two or more subsequent clock cycles.

The long term storage is implemented via the feedback path 1730 that is directly connected to the output of the short term storage element 1710. The feedback path 1730 routes the output of the routing circuit 1740 through the controllable storage element 1720 which may store the output before returning the output to the routing circuit 1740 through a second direct connection. The feedback path 1730 receives its input from the output of the short term storage 1710 which is directly distributed to the destination 1750 at the same time that the output passes through the feedback path 1730. By distributing the output of the routing circuit 1740 through the feedback path 1730 which reenters the routing circuit 1740, the storage element 1720 within the feedback path 1730 may store the output value for several clock cycles without impeding the routing functionality of the routing fabric section 1700. The feedback path therefore clears the routing path while simultaneously providing storage during subsequent clock cycles.

As mentioned above, a direct connection is established through a combination of one or more wire segments and/or one or more vias. In some of these embodiments, a direct connection might include intervening non-configurable circuits, such as (1) intervening buffer circuits in some embodiments, (2) intervening non-buffer, non-configurable circuits in other embodiments, or (3) a combination of such buffer and non-buffer circuits in yet other embodiments. In some embodiments, the feedback path 1730 includes a configurable connection (e.g., include a configurable connection between the long term storage 1720 and the input of the circuit 1740).

In some embodiments, one configuration data set controls both the short term storage 1710 and the long term storage 1720 during each clock cycle (e.g., user-design clock cycle or sub-cycle). Accordingly, in these embodiments, the long term storage 1720 stores the output value only when the short term storage 1710 is not storing and vice versa. For instance, positive logic might enable the short term storage 1710 while negative logic might enable the long term storage 1720. By using one configuration data set 1770 and its complement value, the total number of configuration data needed to implement the storage elements of the routing fabric section is reduced. Moreover, it should be apparent to one of ordinary skill in the art that the configuration data set 1770 of some embodiments include different sets of configuration data to control each storage element 1710 and 1720 (i.e., the configuration data need not be shared between the storage elements 1710 and 1720). In some such embodiments, the short and long term storage elements would not have to be operated in a complementary manner in each cycle (i.e., one storage element does not have to store a value during one cycle while the other storage element is transparent during that cycle, as both storage elements can be transparent or storing during any cycle).

In some embodiments, the configuration data set that control the short 1710 and long 1720 term storage elements come at least partly from configuration data storage of the IC. In some embodiments (e.g., some embodiments that are not runtime reconfigurable), the configuration data storage stores one configuration data set (e.g., one bit or more than one bit) for all clock cycles. In other embodiments (e.g., some embodiments that are runtime reconfigurable and have runtime reconfigurable circuits), the configuration data storage stores multiple configuration data sets, with each set defining the operation of the storage elements 1710 and 1720 during a different clock cycle. The different clock cycles might be different user design clock cycles, or different sub-cycles of a user design clock cycle or some other clock cycle.

As shown in FIG. 17, the routing operations of the routing circuit 1740 are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuit 1740 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

In the discussion below, multiple other embodiments (such as those illustrated in FIGS. 20, 24-27, and 29) are described which illustrate two storage elements that are controlled from the same set of configuration data. Like the embodiment illustrated in FIG. 17, these other embodiments do not need to use one set of configuration data for a pair of storage elements. Also, like the embodiment illustrated in FIG. 17, the configuration data sets can include one or more bits for all cycles, or can include different bits for different clock cycles (e.g., different configuration data sets for embodiments that are runtime reconfigurable and have runtime reconfigurable circuits).

Figure 18:
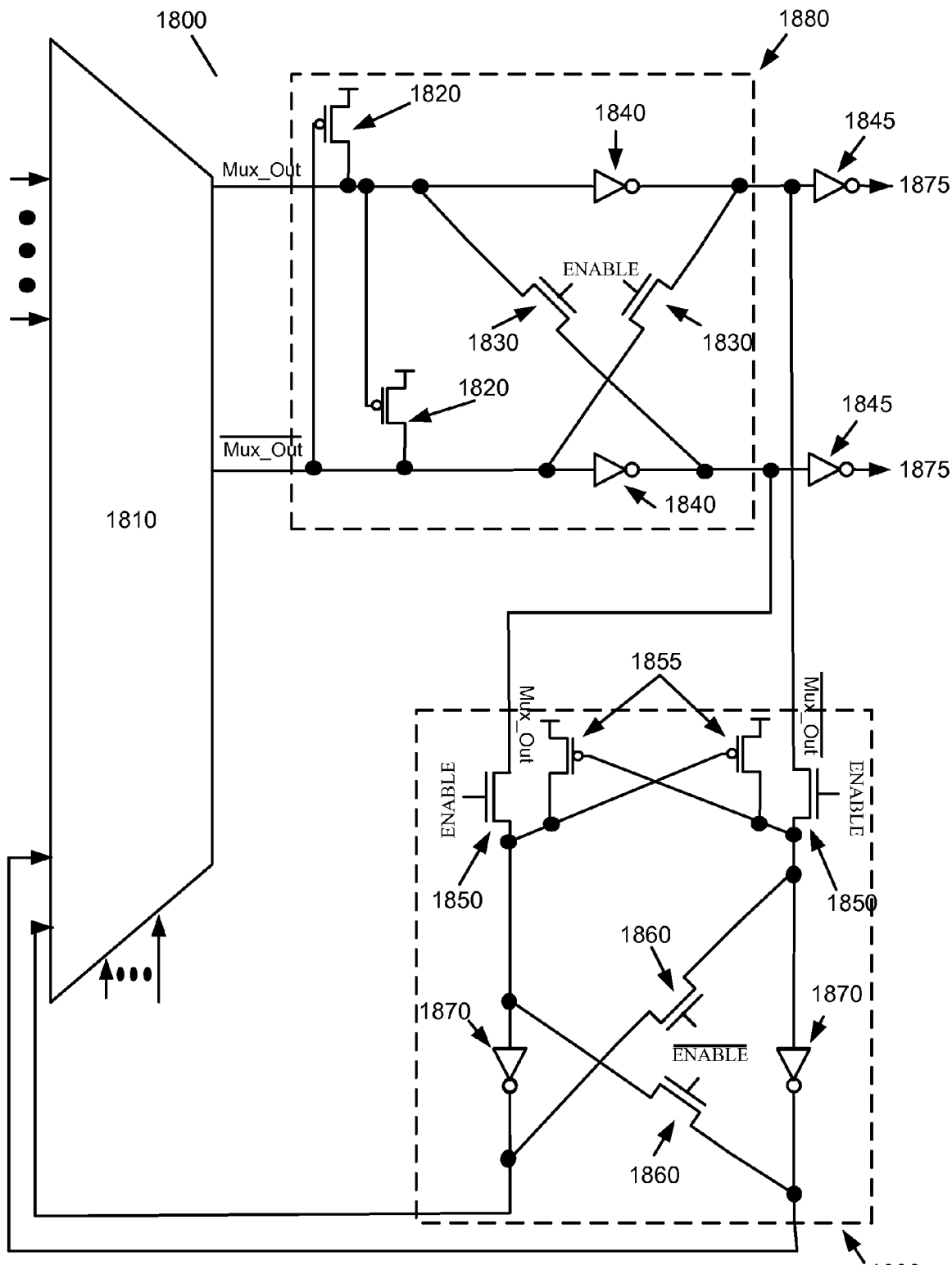
FIG. 18 illustrates an embodiment for the circuit of FIG. 17.

FIG. 18 presents an embodiment for implementing the storage functionality of the routing fabric section 1700 of FIG. 17. As shown in this figure, the circuit 1800 includes (1) a multiplexer 1810, (2) a first pair of pull-up PMOS transistors 1820, (3) a first pair of cross-coupling transistors 1830, (4) a first pair of inverting output buffers 1840, (5) an output pair of inverting output buffers 1845, (6) a pair of NMOS pass gate transistors 1850, (7) a second pair of pull-up PMOS transistors 1855, (8) a second pair of cross-coupling transistors 1860, and (9) a second pair of inverting output buffer 1870.

The sections 1880 and 1890 implement the short term storage and long term storage elements of FIG. 17 using CPL implementation similar to the one discussed with respect to FIG. 11. The short term storage element 1710 of FIG. 17 is implemented via the first pair of pull-up PMOS transistors 1820, the first pair of cross-coupling transistors 1830, and the first pair of inverting output buffers 1840.

In some embodiments, the multiplexer 1810 is implemented in accordance with circuit representation of FIG. 11 while omitting the set of cross-coupled transistors 1145 and 1150 that provide storage at the output stage as well as the level restoring transistors 1125 and 1130. The multiplexer 1810 of such embodiments is formed by the four stages 1105, 1110, 1115, and 1120 of FIG. 11. In such embodiments, the pull-up PMOS transistors 1820 are similar to the pull-up transistors 1125 and 1130, as they are placed after stage 1120 of FIG. 11 and act as level restorers to quickly restore degraded high levels from the multiplexer 1810 passing into the short term storage element 1880 and to prevent leakage in the inverters 1840.

In some embodiments, the multiplexer 1810 internally includes the level restoring transistors 1820 to restore the output signal before passing the values across the wire segments of the routing fabric. In other embodiments, the multiplexer 1810 internally includes the PMOS transistors 1820, cross-coupled transistors 1830, and inverting buffers 1840, like the multiplexer 1100 which internally includes the level restorers 1125 and 1130, cross-coupled transistors 1145 and 1150, and inverting buffers 1135 and 1140 of FIG. 11.

Figure 19:
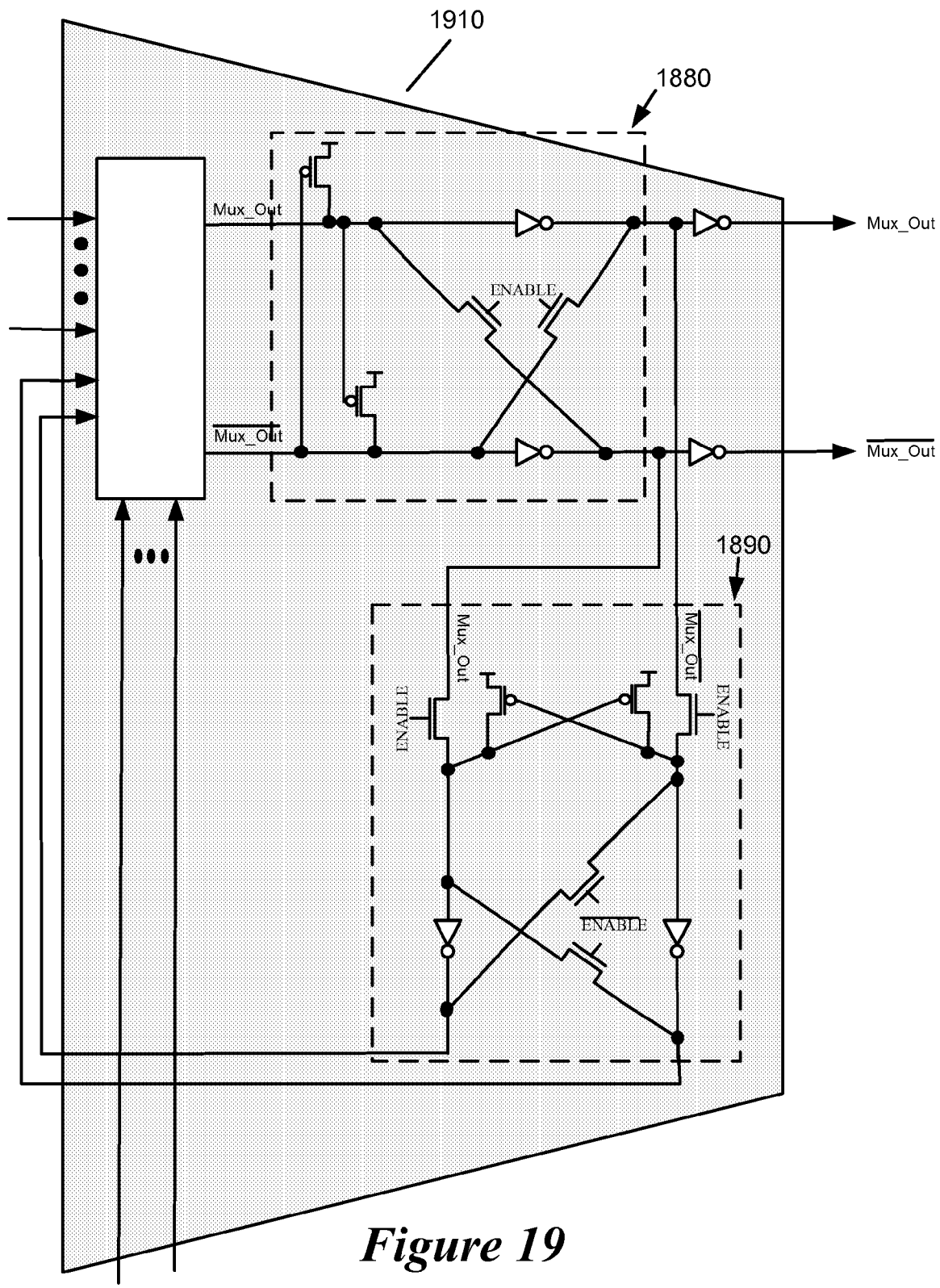
FIG. 19 presents an alternative placement for the storage element of the storage circuit of FIG. 18.

The long term storage element 1890 of some of these embodiments remains separate from the multiplexer 1810, while this storage element 1890 is part of the multiplexer 1810 in other embodiments, as illustrated in FIG. 19. Specifically, FIG. 19 illustrates both the short and long term storages 1880 and 1890 as part of the internal multiplexer structure 1910.

The first pair of PMOS transistors 1820 receives the output of the routing circuit 1810 and its complementary value. As discussed above, the PMOS transistors 1820 regenerate the voltage levels that may have been degenerated by passing through the NMOS transistors at the output stage of the multiplexer 1810 which results in a threshold drops. A low voltage on the complementary output of Mux_Out turns on the pull-up transistor 1820 connected to the non-complementary Mux_Out, which in turn, accelerates the pull-up of the non-complementary Mux_Out and drives those values to the positive rail. After passing through the pull-up transistors 1820, the outputs continue through the first pair of inverting output buffers 1840, but also through the output pair of inverting buffers 1845 which restore the output of the multiplexer to its original value.

When the enable bit is active (e.g., high in this example), the short term storage section 1880 will act as a latch storing a value. The active enable bit will cause the output inverters 1840 and the pair of cross-coupling transistors 1830 to operate forming a pair of cross-coupling inverters that hold and output the signal propagating through the short term storage section 1880 prior to the enable bit becoming active. The cross-coupling transistors 1830 cross-couple the output of each inverter buffer 1840 to the input of the other buffer. This cross-coupling causes the inverting buffers 1840 to hold the value at the outputs 1875 right before the enable signal went active.

Similar to the implementation of FIG. 17, the same enable bit controlling the short term storage section 1880 also controls the long term storage section 1890. The long term storage 1890 and short term storage sections 1880 are comprised of the same components, namely a pair of pass gate transistors 1850, a second pair of pull-up PMOS transistors 1855, a pair of cross-coupling transistors 1860, and a pair of inverting buffers 1870. One difference is that the long term storage section 1890 receives its complementary set of inputs from the complementary set of outputs of the short term storage 1880. Another difference is that the long term storage section 1890 routes its complimentary set of outputs back into the multiplexer 1810 as opposed to routing the outputs to some other destination 1875. As described above, by routing the outputs of the long term storage 1890 back into the multiplexer 1810, a feedback path is created whereby a value maybe stored for multiple clock cycles without impeding the routing operations of the routing fabric section 1800.

Another difference is that the positive logic of the enable bit causes the short term storage 1880 to perform storage operations while the negative logic of the enable bit causes the long term storage 1890 to perform storage operations (e.g., when the enable signal is low, the output of the multiplexer 1810, to destination 1875, which goes through the short term storage element 1850 the long term storage latches the signal at the output of the short term storage element 1850. Therefore, when the long term storage 1890 is performing storage operations, the path through the short term storage 1880 remains clear for performing routing operations.

It will be evident to one of ordinary skill in the art that the various components and functionality of FIGS. 19 and 18 may be implemented differently without diverging from the essence of the invention. For example, the cross-coupling storage elements 1880 and 1890 may be replaced to include traditional D flip-flops.

D. Storage Via a Feedback Path Connected in Parallel

Figure 20:
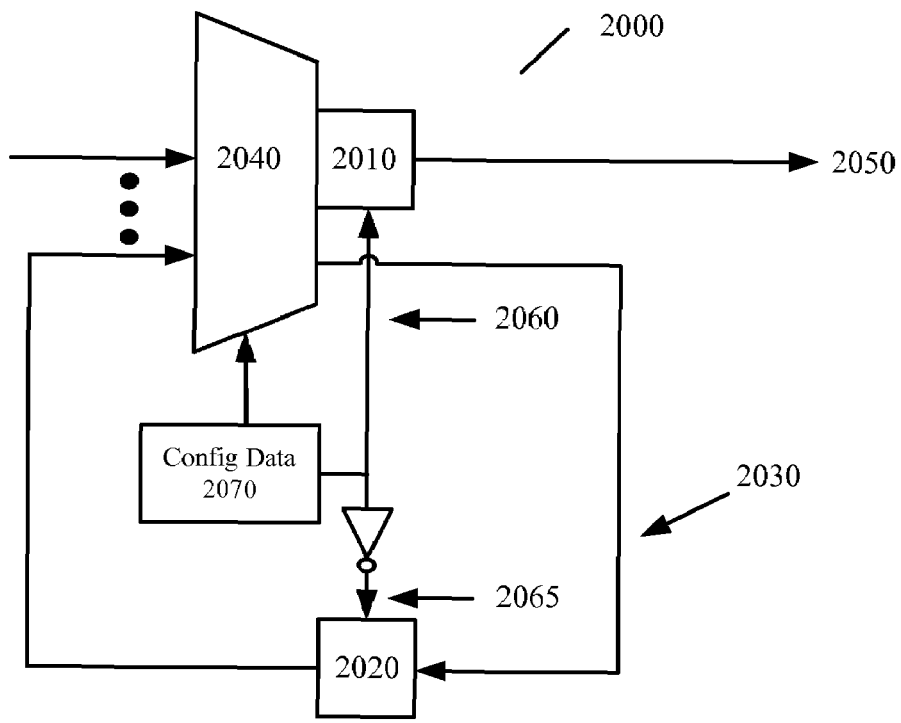
FIG. 20 illustrates a storage element within the routing fabric with a feedback path connected in parallel to the output of a routing circuit.

An alternative implementation of the routing fabric section of FIG. 17 is the routing fabric section of FIG. 20. Similar to FIG. 17, FIG. 20 presents an implementation of a routing fabric section 2000 in which a short term storage section 2010 is connected to the output stage of a routing circuit 2040 and a long term storage section is in a feedback path 2030 between the output and input of the routing circuit 2040. The storage elements 2010 and 2020 are configurably controlled by the set of configuration data 2070. In some embodiments, the storage elements 2010 and 2020 share the same set of configuration data 2070, while in some other embodiments the storage elements 2010 and 2020 are controlled by different sets of configuration data.

The difference between the routing fabric section 2000 and the routing fabric section 1700 is that the input to the feedback path 2030 does not pass through the short term storage section 2010. Rather, the feedback path 2030 is instead connected in parallel to the first output path of the routing circuit 2040. The output of the routing circuit 2040 is therefore distributed via two paths. This alternative approach allows for greater usage flexibility in the design of the routing fabric while also providing short and long term storage without the need to pass through multiple storage elements. Therefore, storage can be achieved in a single clock operation.

In some embodiments of FIG. 20, the first output path of the routing circuit 2040 directly connects to and passes through the short term storage section 2010 en route to destination 2050. The second path contains a pair of direct connections. A first direct connection connects the output of the routing circuit 2040 to the input of the storage element 2020. A second direct connection connects the output of the storage element 2020 back into the input of the routing circuit 2040. In this manner, the direct connections of the second path create the feedback path 2030 which returns the value of the routing circuit 2040 back into the routing circuit 2040 without traversing the short term storage section 2010.

As mentioned above, a direct connection is established through a combination of one or more wire segments and/or one or more vias. In some of these embodiments, a direct connection might include intervening non-configurable circuits, such as (1) intervening buffer circuits in some embodiments, (2) intervening non-buffer, non-configurable circuits in other embodiments, or (3) a combination of such buffer and non-buffer circuits in yet other embodiments. In some embodiments, the feedback path 2030 includes a configurable connection (e.g., include configurable connection between the long term storage 2020 and the input of the circuit 2040).

Figure 21:
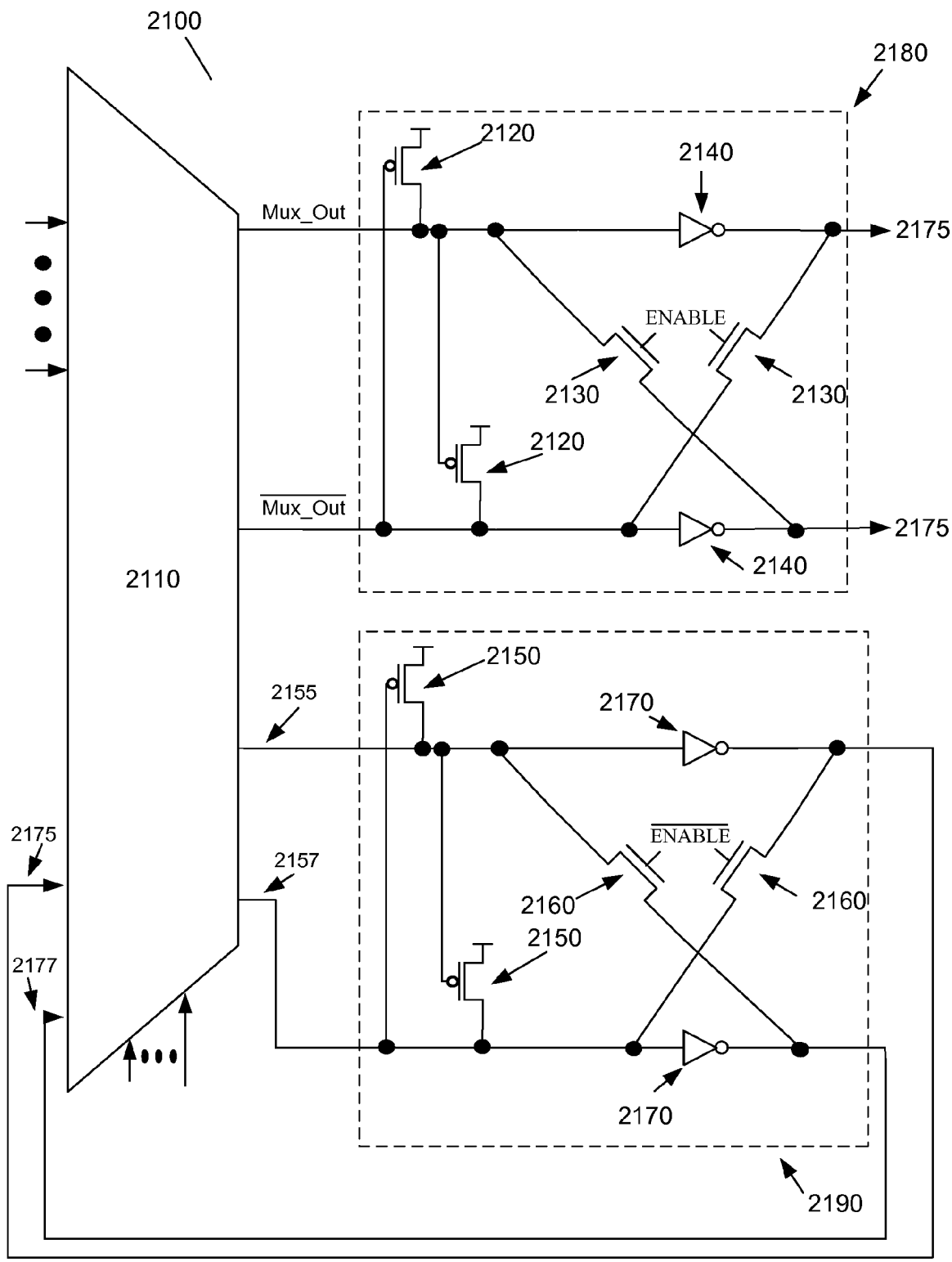
FIG. 21 illustrates an embodiment for the circuit of FIG. 20.

FIG. 21 presents an illustrative implementation of the routing fabric section of FIG. 20. Similar to FIG. 18 above, FIG. 21 is a CPL implementation of FIG. 20 including (1) a multiplexer 2110, (2) a first pair of pull-up PMOS transistors 2120, (3) a first pair of cross-coupling transistors 2130, (4) a first pair of inverting output buffers 2140, (5) a second pair of pull-up PMOS transistors 2150, (6) a second pair of cross-coupling transistors 2160, (7) a second pair of inverting output buffer 2170, and (8) a configuration data bit set (e.g., ENABLE and the complement of ENABLE) for controlling the cross-coupled transistors 2130 and 2160.

The short term storage section 2180 contains the first pair of pull-up PMOS 2120, the first pair of cross-coupling transistors 2130, and the first pair of inverting output buffers 2140. The first pair of PMOS transistors 2120 receives the output of the multiplexer 2110 and its complementary value. The PMOS transistors 2120 regenerate the voltage levels that may have been degenerated by passing through NMOS threshold drops at the output stage of the multiplexer 2110. A low voltage on the complementary output of Mux_Out turns on the pull-up transistor 2120 connected to the non-complementary Mux_Out, which, in turn, accelerates the pull-up of the non-complementary Mux_Out. After passing through the pull-up transistors 2120, the outputs will continue through the first pair of inverting output buffers 2140, before being output at terminals 2175.

When the enable bit (e.g., configuration data set) is active, the short term storage section 2180 will act as a latch storing a value. The active enable bit will cause the output inverters 2140 and the pair of cross-coupling transistors 2130 to operate forming a pair of cross-coupling inverters that hold and output the signal propagating through the short term storage section 2180 prior to the enable bit becoming active. The cross-coupling transistors 2130 cross-couple the output of each inverter buffer 2140 to the input of the other buffer. This cross-coupling causes the inverting buffers 2140 to hold the value at the outputs 2175 right before the enable signal went active.

The long term storage section 2190 is connected in parallel to the short-term storage 2180. The parallel connection of the long term storage 2190 requires the multiplexer 2110 to provide a parallel set of outputs. As illustrated in FIG. 21, the multiplexer 2110 outputs Mux_Out and its complement to the short term output 2180. Additionally, multiplexer 2110 outputs a parallel set of complementary outputs that are provided along the wire segments 2155 and 2157.

Figure 22:
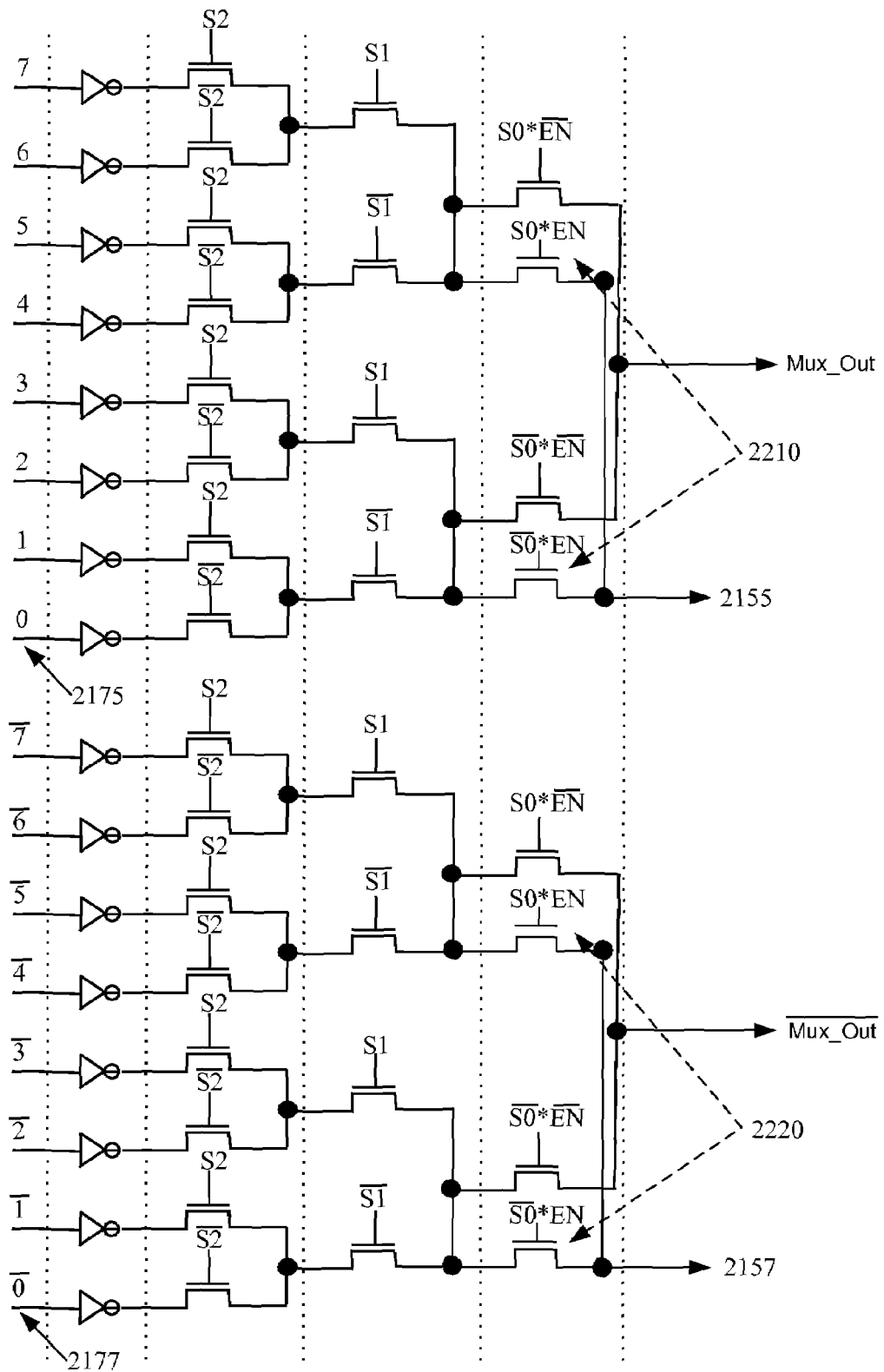
FIG. 22 present a circuit representation for a multiplexer containing a parallel set of complementary outputs.

FIG. 22 illustrates one implementation for the multiplexer 2110 of FIG. 21, which generates parallel complementary set of outputs. This multiplexer is similar to the first four stages 1105, 1110, 1115, and 1120 of multiplexer 1110 except that in FIG. 22, the parallel complementary outputs 2155 and 2157 are generated by introducing two additional pairs of NMOS pass gate transistors 2210 and 2220 which are activated using the select bit S0 in conjunction with the EN signal. The outputs 2155 and 2157 are then passed into the long term storage section 2190 which includes the same components as the short term storage section 2180.

Moreover, the long term storage 2190 performs storage operations by using the complementary value of the enable signal described above with reference to the short term storage 2180. Therefore, when the short term storage 2180 is inactive and acts only to propagate the complementary set of outputs of the multiplexer 2110, the long term storage is enabled and stores a parallel set of complementary outputs of the multiplexer 2110 using the second pair of cross-coupling transistors 2160. By routing the outputs of the long term storage 2190 back into the routing circuit 2110, a feedback path is created whereby a value maybe stored for multiple clock cycles without impeding the routing operations of the routing circuit 2110. After passing through the controllable storage element in the feedback path, the signals are re-routed back into the inputs 2175 and 2177 of multiplexer 2110.

In some embodiments, the configuration data controlling the short 2180 and long 2190 term storage elements come at least partly from configuration data storage of the IC. In some embodiments (e.g., embodiments that are not runtime reconfigurable), the configuration data storage stores one configuration data set for all clock cycles. In other embodiments (e.g., embodiments that are runtime reconfigurable), the configuration data storage stores multiple configuration data sets, with each set defining the operation of the storage elements 2180 and 2190 during different clock cycles. The different clock cycles might be different user design clock cycles, or different sub-cycles of a user design clock cycle or some other clock cycle.

As shown in FIG. 21, the routing operations of the routing circuit 2110 are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuit 2110 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

In some embodiments, the multiplexer 2110 not only includes the circuits illustrated in FIG. 22, but also internally includes the level restorers 2120 to restore the output signal before passing the values across the wire segments of the routing fabric. In other embodiments, the multiplexer 2110 internally includes the PMOS transistors 2120, cross-coupled transistors 2130, and inverting buffers 2140, like the multiplexer 1100 which internally includes the level restorers 1125 and 1130, cross-coupled transistors 1145 and 1150, and inverting buffers 1135 and 1140 of FIG. 11.

Figure 23:
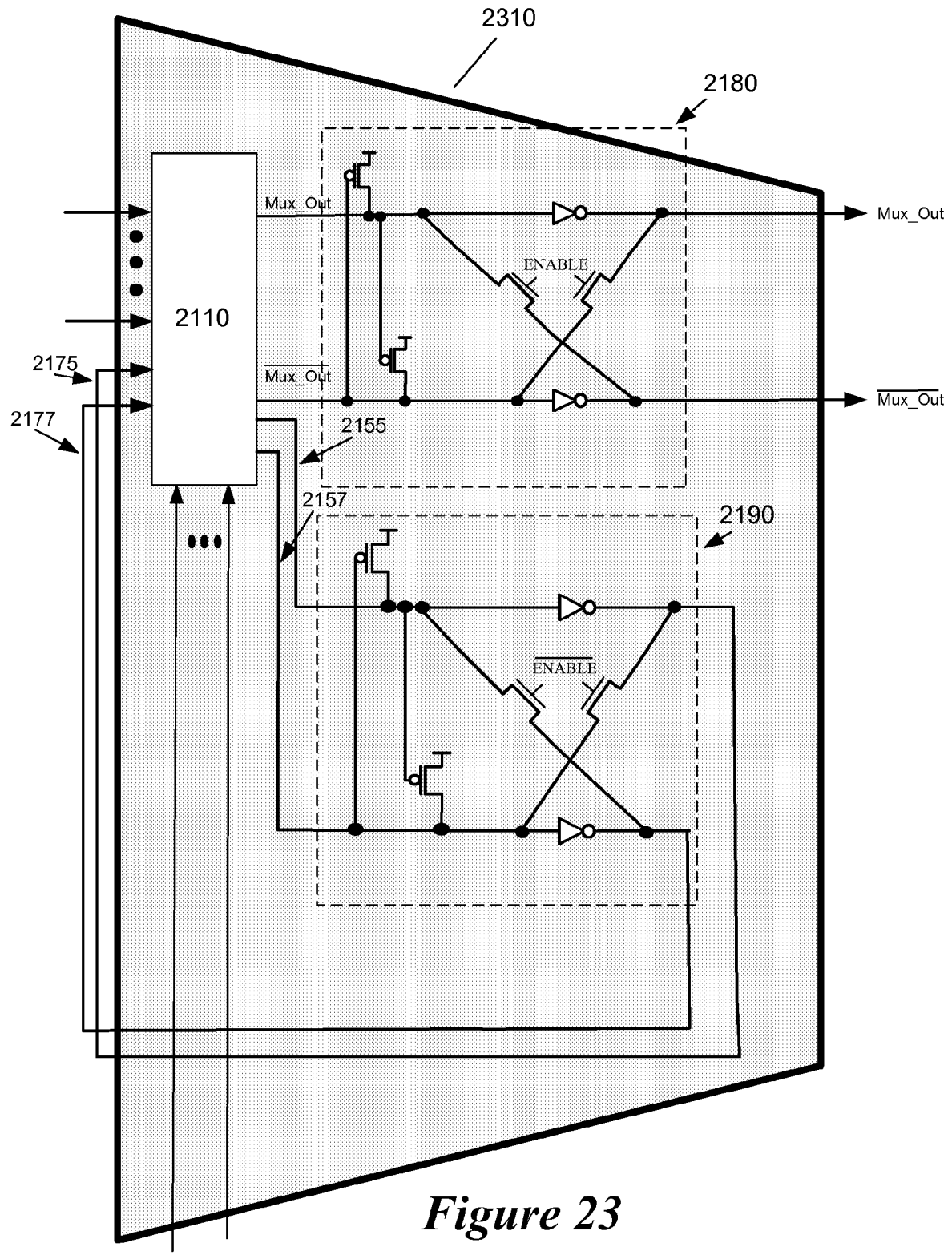
FIG. 23 presents an alternative placement for the storage element of the storage circuit of FIG. 21.

The long term storage element 2190 of some of these embodiments remains separate from the multiplexer 2110, while this storage element 2190 is part of the multiplexer 2110 in other embodiments, as illustrated in FIG. 23. Specifically, FIG. 23 illustrates both the short and long term storages 2180 and 2190 as part of the internal multiplexer structure 2310. It will be evident to one of ordinary skill in the art that the various components and functionality of FIGS. 23 and 21 may be implemented differently without diverging from the essence of the invention.

Figure 24A:
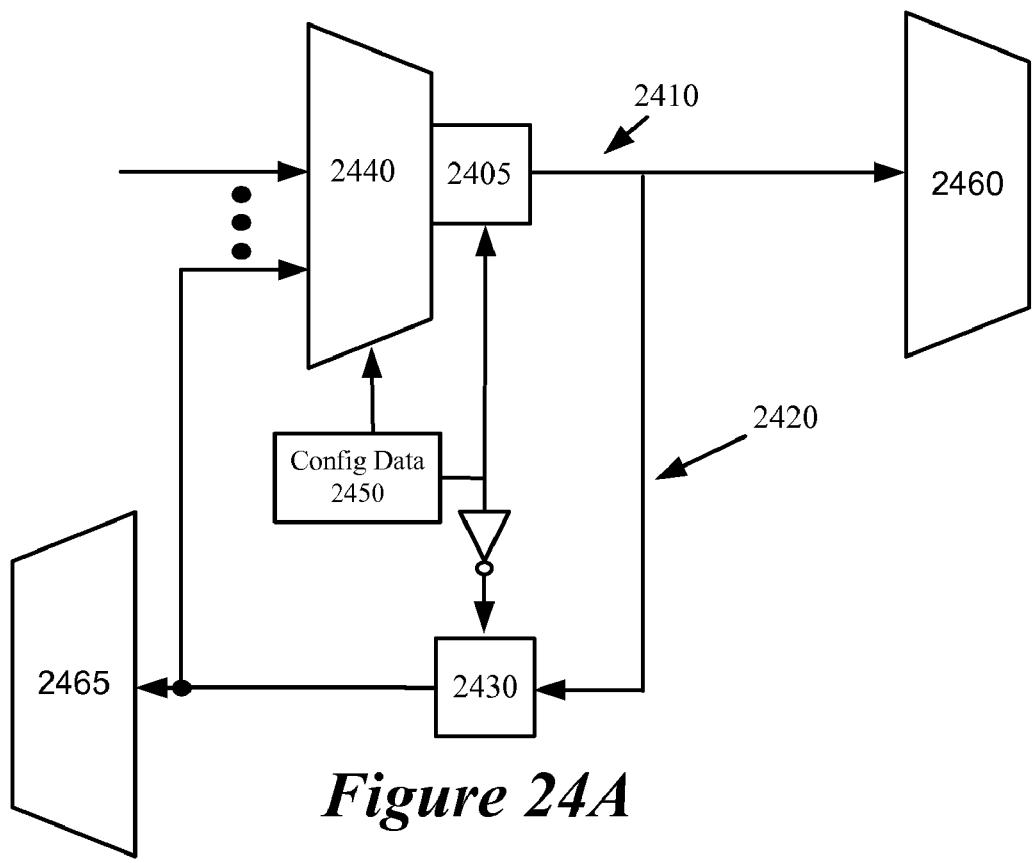
FIG. 24A illustrates a storage element within the routing fabric with a feedback path connected in series to the output of a routing circuit.

FIG. 24A presents an alternative embodiment to FIG. 17 in which the output of the multiplexer 2440 is passed to a short term storage element 2405 before passing to the destination 2460 and the feedback loop 2420 where the output may alternatively appear at a destination 2465. In this manner, the output from multiplexer 2440 can be stored in one section of the routing fabric (e.g. storage element 2430) and appear at a destination 2465 along a different portion of the routing fabric. In some embodiments, the connections between the storage element 2405 and the destination 2460, between the storage element 2405 and the storage element 2430, and between the storage element 2430 and the destination 2465 are direct connections. However, in some embodiments, some of the connections are configurable connections (e.g., the connection between storage element 2430 and destination 2465 might be configurable).

Moreover, because the embodiment of FIG. 24A does not include the parallel distributed path of FIGS. 13A and 13B, this embodiment is no longer restricted to routing the same signal along multiple paths. For example, in FIG. 13B, when the source circuit 1310 routes a signal to destination 1340 along wire segment 1320, the parallel distributed path would require the signal to similarly pass through wire segments 1325. Using some embodiments of FIG. 24A, a signal passes from source circuit 2440 to destination 2460 without having to pass an additional signal from the feedback loop back to destination 2460. Rather, in these embodiments the signal may pass to the destination 2460 along one path and an alternate destination 2465 along another (e.g., where the alternate path includes the feedback path 2420).

Figure 24B:
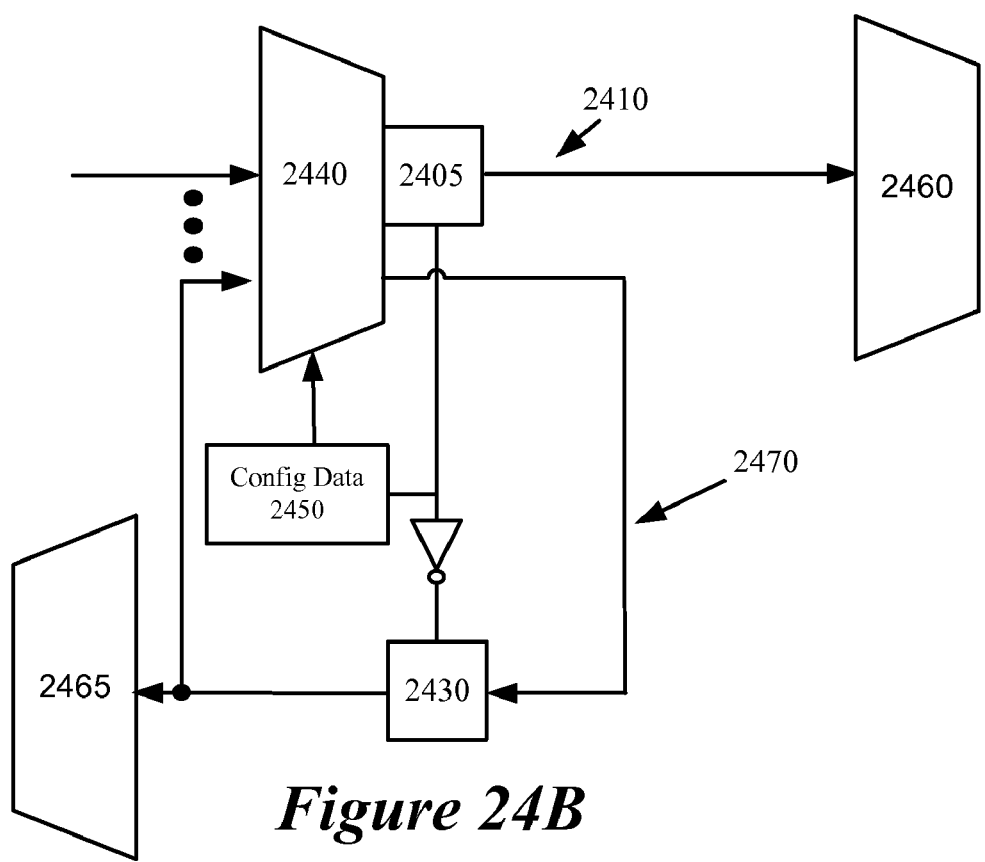
FIG. 24B illustrates a storage element within the routing fabric with a feedback path connected in parallel to the output of a routing circuit.

FIG. 24B presents still another embodiment of the routing fabric section 2000 of FIG. 20. In this figure, a first parallel output path of multiplexer 2440 is routed to a first destination 2460. The second parallel output path 2470 of multiplexer 2440 is routed through the feedback path 2470 back into the multiplexer 2440 and alternatively to a second destination 2465. In this manner, multiple destinations 2460 and 2465 can receive a stored value of a single source 2440. Moreover, the same term storage element 2430 can store different values of the source 2440 for processing by different destinations 2460 and 2465 at different clock cycles. For instance, at a first clock cycle, the storage element 2430 stores a value for destination 2460 and feeds that stored value to destination 2460 at a second clock cycle. At a third clock cycle, the storage element 2430 can alternatively store a value for destination 2465 which receives the stored value at the fourth clock cycle.

In some embodiments, the connections in FIG. 24B between the storage element 2405 and the destination 2460, between the routing circuit 2440 and the storage element 2430, and between the storage element 2430 and the destination 2465 are direct connections. However, it should be apparent to one of ordinary skill in the art that in some embodiments, some of the connections are configurable connections. For example, the connections between the storage element 2405 and the destination 2460, between the storage element 2430 and the destination 2465, or both are configurable connections.

Figure 25:
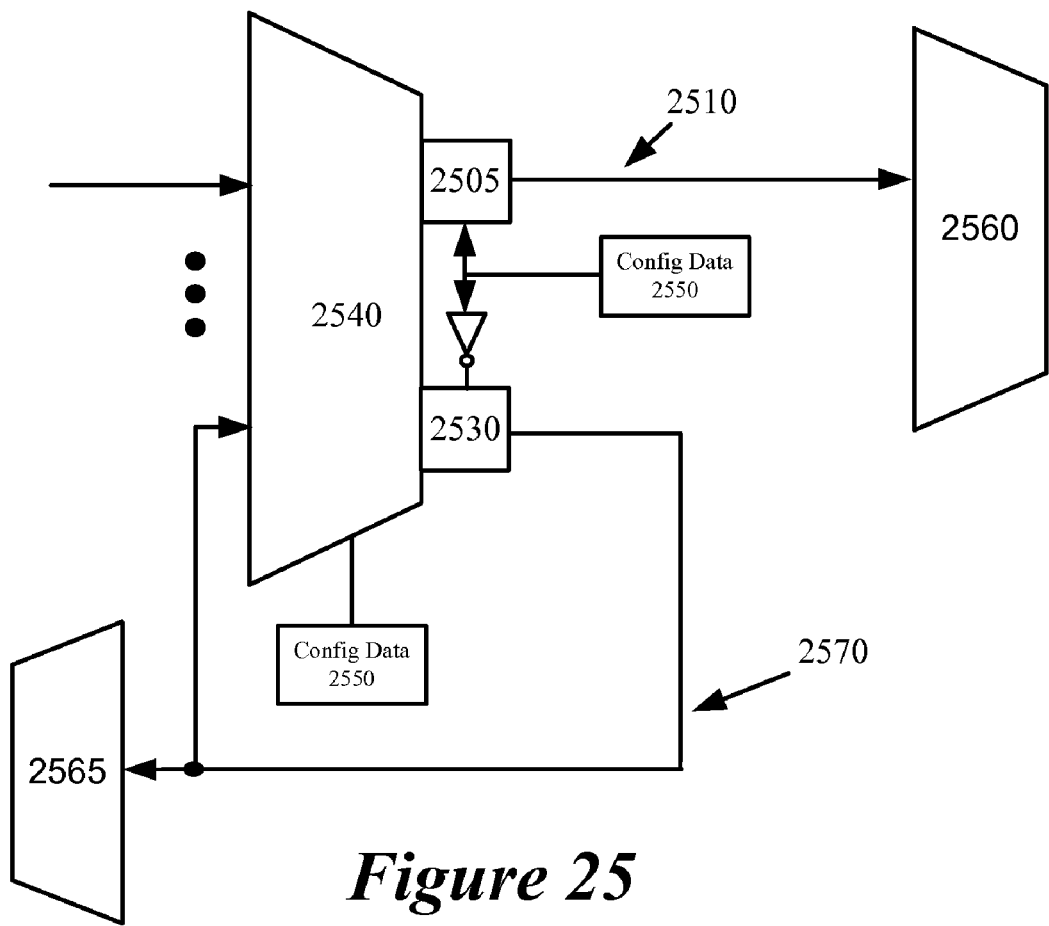
FIG. 25 illustrates a pair of storage elements connected to the output stage of a routing circuit.

In FIG. 24B, the storage element 2430 was illustrated within the feedback path 2470. Alternatively, as illustrated in FIG. 25, some embodiments locate the storage element 2530 at the output stage of the routing circuit 2540, similar to the first storage element 2505. In some embodiments of FIG. 25, the connection between the storage element 2505 and the destination circuit 2560 and the connection between the storage element 2530 and the routing circuits 2540 and 2565 are direct connections. However, in some embodiments, some of these connections are configurable connections. For instance, the connection between the storage element 2505 and the destination circuit 2560 the connection between the storage element 2530 and the destination circuit 2565, or both are configurable.

In some embodiments, the storage elements 2405 and 2430 of FIGS. 24A and 24B and the storage elements 2505 and 2530 of FIG. 25 share the same set of configuration data, while in some other embodiments the storage elements are controlled by different sets of configuration data. In some embodiments, the configuration data sets that control the storage elements of FIGS. 24A, 24B, and 25 come at least partly from configuration data storage of the IC. In some embodiments (e.g., some embodiments that are not runtime reconfigurable), the configuration data storage stores one configuration data set (e.g., one bit or more than one bit) for all clock cycles. In other embodiments (e.g., embodiments that are runtime reconfigurable and have runtime reconfigurable circuits), the configuration data storage stores multiple configuration data sets, with each set defining the operation of the storage elements during different clock cycles. The different clock cycles might be different user design clock cycles, or different sub-cycles of a user design clock cycle or some other clock cycle, As shown in FIGS. 24A, 24B, and 25, the routing operations of the routing circuits are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuits of FIGS. 24A, 24B, and 25 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

In some embodiments, the storage elements 2505 and 2530 are either both located within the routing circuit 2540 or alternatively one storage element is located at the output stage of the routing circuit 2540 while the other storage element is an internal component of the circuit 2540. It should be apparent to one of ordinary skill in the art that in some embodiments the feedback paths of FIGS. 24A, 24B, and 25 need not route to both the multiplexer (2440 or 2540) and a second destination (2465 or 2565). In some such embodiments, the output of storage elements 2430 or 2530 are routed only to the respective destination 2465 or 2565 and not back into the multiplexer 2440 or 2540.

Figure 26:
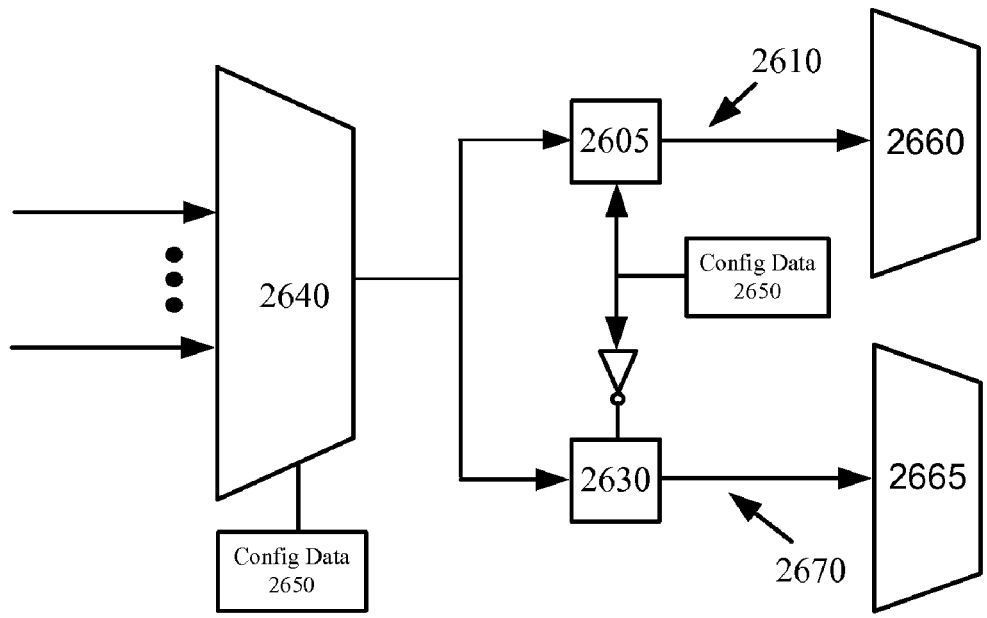
FIG. 26 illustrates a pair of storage elements along a parallel distributed output path.

FIG. 26 presents yet another embodiment of some invention. In FIG. 26, the feedback path 2570 and the parallel set of outputs from the routing circuit 2540 of FIG. 25 are removed. Instead, a single output from the multiplexer 2640 is distributed in two parallel paths. Each path contains a storage element 2605 and 2630, however neither path is a primary signal path. The output from the first storage element 2605 is directly connected 2610 to a first destination circuit 2660 and the output from the second storage element 2630 is directly connected 2670 to a second destination circuit 2665. However, one of ordinary skill in the art will recognize that in some cases the two parallel paths might not end at the two destinations 2660 and 2665, but instead at a single destination circuit. In this manner, the circuit resembles the circuits of FIGS. 13A and 13B, though the inclusion of the second storage element ameliorates timing issues related to having a first path with a storage element and a second path without a storage element.

As mentioned above, the direct connections of FIG. 24-26 may be established through a combination of one or more wire segments and/or one or more vias. In some of these embodiments, a direct connection might include intervening non-configurable circuits, such as (1) intervening buffer, non-configurable circuits in some embodiments, (2) intervening non-buffer circuits in other embodiments, or (3) a combination of such buffer and non-buffer circuits in yet other embodiments. In some embodiments, one or more of the connections between circuits 2640, 2605, 2630, 2660, and 2665 are configurable connections. For instance the connection between storage element 2605 and the destination 2660, storage element 2630 and the destination 2665, or both can be configurable.

In FIG. 26, the same set of configuration data 2650 is used to control both storage elements 2605 and 2630. In some embodiments, the storage element 2605 latches when the set of configuration data 2650 is high and the storage element 2630 latches when the set of configuration data 2650 is low. In this manner, one path of the parallel distributed path performs storage operations and the other path routes signals to and from the source circuit 2640 to a destination 2660 or 2665. Therefore, the circuit of FIG. 26 transparently provides routing and storage operations within the routing fabric. However, it should be apparent to one or ordinary skill in the art that some embodiments do not use the same set of configuration data 2650 to control each storage element 2605 and 2630.

In some embodiments, the configuration data sets that control the storage elements of FIG. 26 come at least partly from configuration data storage of the IC. In some embodiments (e.g., some embodiments that are not runtime reconfigurable), the configuration data storage stores one configuration data set (e.g., one bit or more than one bit) for all clock cycles. In other embodiments (e.g., some embodiments that are runtime reconfigurable and have runtime reconfigurable circuits), the configuration data storage stores multiple configuration data sets, with each set defining the operation of the storage elements during differing clock cycles. These differing clock cycles might be different user design clock cycles, or different sub-cycles of a user design clock cycle or some other clock cycle.

As shown in FIG. 26, the routing operations of the routing circuit 2640 are controlled by configuration data. In some embodiments (e.g., some embodiments that are not runtime reconfigurable), this configuration data is one configuration data set for all clock cycles. However, in other embodiments (e.g., some embodiments that are runtime reconfigurable circuits), the configuration data includes multiple configuration data sets, each set for defining the operation of the routing circuit 2640 during different clock cycles. The different clock cycles might be different user design clock cycles, or different sub-cycles of a user design clock cycle or some other clock cycle. U.S. patent application Ser. No. 11/081,859 discloses circuitry for retrieving configuration data sets from configuration data storage in order to control the operation of interconnects and storage elements.

FIG. 26 is illustrated with a single path output from the multiplexer 2640, though some embodiments of the circuit 2640 produce the parallel paths directly from the circuit 2640. A first output of the parallel output path directly connects to storage element 2605 and a second output of the parallel output path directly connects to the storage element 2630. An implementation of such a multiplexer 2640 includes in some embodiments, the multiplexer 2110 of FIG. 21 where the second pair of parallel outputs 2155 and 2157 are directly connected to the second storage element 2190. However, in an implementation consistent with FIG. 26, the outputs from the second storage element 2190 would be directly connected a second destination instead of feeding back into the multiplexer 2110. Moreover, in some embodiments of FIG. 26, the storage elements 2605 and 2630 are built into the output stage of the multiplexer 2640 similar to the storage elements 2180 and 2190 of FIG. 23 without feeding back into the multiplexer 2640.

Figure 27:
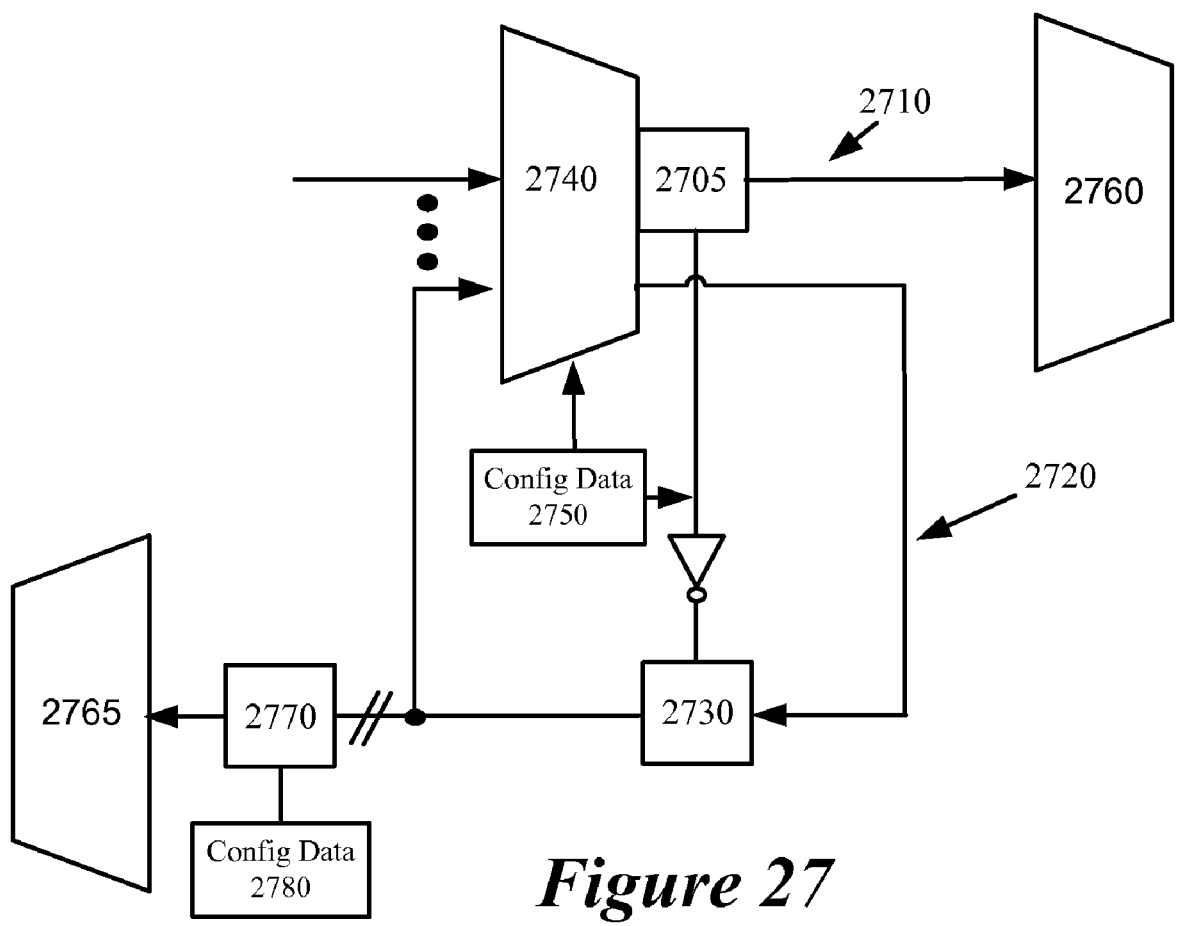
FIG. 27 illustrates using multiple storage elements within the routing fabric for providing long term storage.

FIG. 27 conceptually illustrates how some embodiments of the invention use uncongested areas within the routing fabric to store data and to route data to desired destinations. Some embodiments use the feedback path 2720 to provide values from the multiplexer 2740 to the storage element 2730. However, the different destinations 2760 and 2765 may need different values to be stored within the storage element 2730. For instance, at a first clock cycle, the output from source 2740 may need to be stored for three subsequent clock cycles before arriving at destination 2765, therefore the value is stored in the storage element 2730 located within the feedback path. During a second clock cycle, the output from source 2740 needs to be stored for two subsequent clock cycles before arriving at destination 2760. However, the first output is currently being stored within the storage element 2730.

In order to free the storage element 2730, but nevertheless provide long term storage for the first output, some embodiments of FIG. 27 pass the first stored value within the storage element 2730 to an unused storage element 2770 located elsewhere within the routing fabric. In this manner, the storage element 2730 is now available to store the signal output from the multiplexer 2740 at the second clock cycle. So long as neither storage element 2730 or 2770 is needed during the third clock cycle, these storage elements continue storing their respective values. Then at the fourth clock cycle, the signal stored within storage element 2770 is released and routed to destination 2765 and the signal stored within storage element 2730 is released and routed to destination However, if the storage elements 2730 or 2770 are used for storing other signals or the wire segments upon which the storage elements are located are used for routing other signals, then the storage elements 2730 or 2770 may first pass the stored values to other unused storage elements elsewhere within the routing fabric. In this manner, the storage element and the wiring path on which the storage element is located is freed and storage is provided for at another unused storage element within the routing fabric.

In some embodiments, one or more of the connections between the various circuits illustrated in FIG. 27 are configurable connections. However, in some embodiments, the connections between the storage element 2705 and the destination 2760, between the routing circuit 2740 and the storage element 2730, between the storage element 2730 and the routing circuit 2740, and between the storage element 2730 and the storage element 2770 are direct connections. Additionally, in some embodiments, one or more of these direct connections are long offset direct connections. Such connections are further described below.

Figure 28:
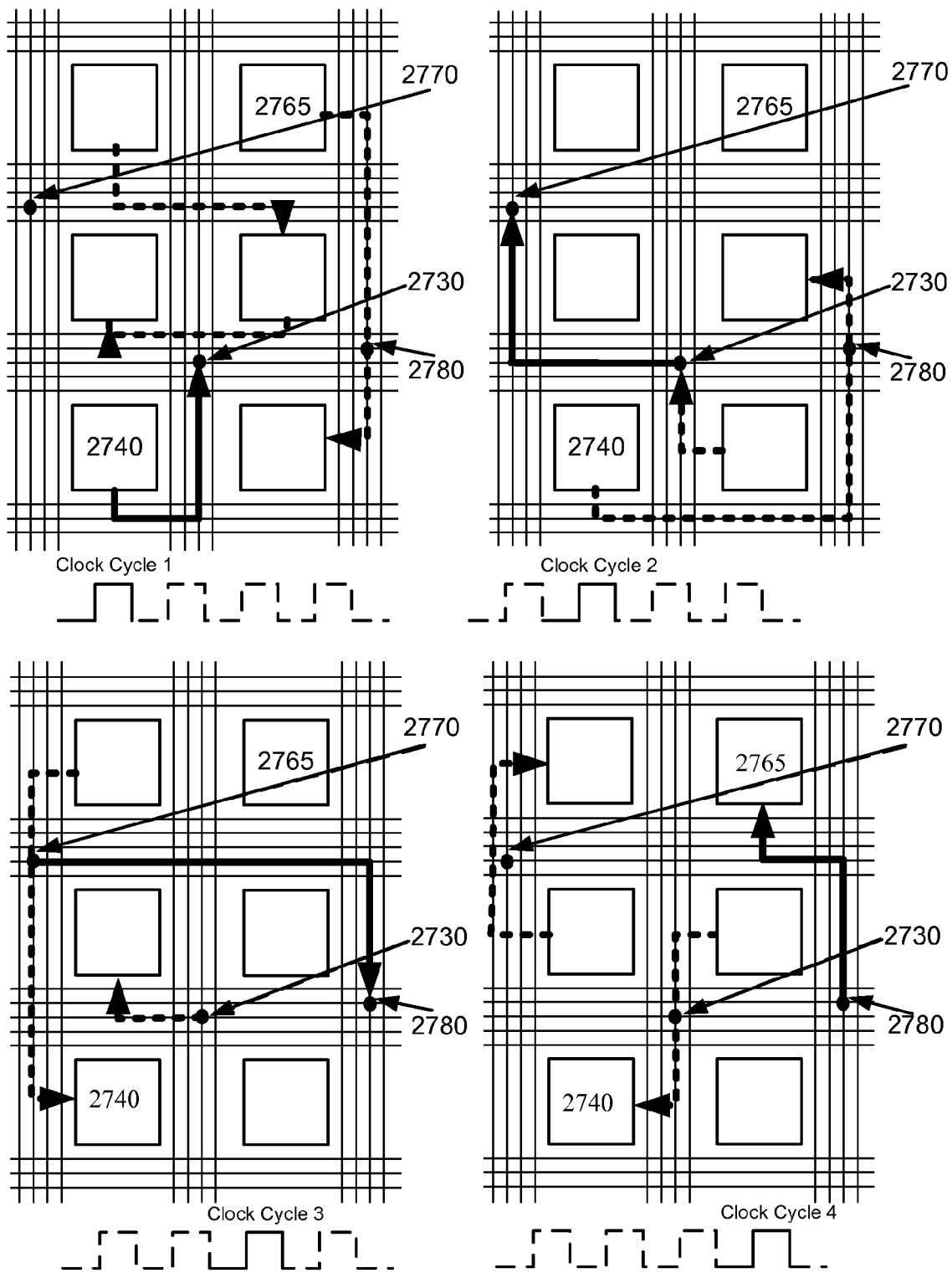
FIG. 28 provides an illustrative embodiment of the functionality provided by placing storage elements within the routing fabric.

As indicated above, the connections between storage elements 2730 and 2770 in FIG. 27 allow data to be stored while being routed to desired locations through uncongested areas of the routing fabric. FIG. 28 conceptually illustrates an example of such storage and passing of a stored signal from one storage element to another unused storage element in order to free the storage element or the routing path on which the storage element is located for use by other circuits of the IC. For instance, at a first clock cycle, a signal is passed from a source circuit element 2740 to a storage element 2730 for long term storage until a fourth clock cycle at which point the signal is to arrive at a destination circuit element 2765. However, because the storage element 2730 is required to store the value passed from an alternate circuit element during a second clock cycle, the storage element 2730 releases the previously stored value and routes the value to a second unused storage element 2770. The storage element 2730 is now available to provide storage at the second clock cycle for the alternate circuit element.

At the third clock cycle, the wiring path on which the second storage element 2770 is located is required to route signals from other circuits of the IC. Therefore, the second storage element 2770 releases the stored value to a third unused storage element 2780 to provide storage for the previously stored value during the third clock cycle. With the second storage element 2770 no longer providing storage, the path is clear for a signal to be routed from other circuits within the IC. At the fourth clock cycle, the stored value is routed from the third storage element 2780 to the destination circuit 2765.

Such operations maximize the usage of the existing storage elements within the routing fabric without requiring additional storage elements and also without congesting wiring paths which in some embodiments may be required for routing other signals from other circuits of the configurable IC. Moreover, the circuit elements of the IC can continue to perform routing operations irrespective of whether storage for previous values output from the circuit elements is being performed within the routing fabric. As noted above, in different embodiments, the routing fabric includes (1) a combination of wire segments, (2) a combination of wire segments and vias, (3) a combination of wire segments, vias, and buffers, but no intervening configurable interconnect circuits, or (4) a combination of wire segments, vias, and intervening non-configurable interconnect circuits.

Figure 29:
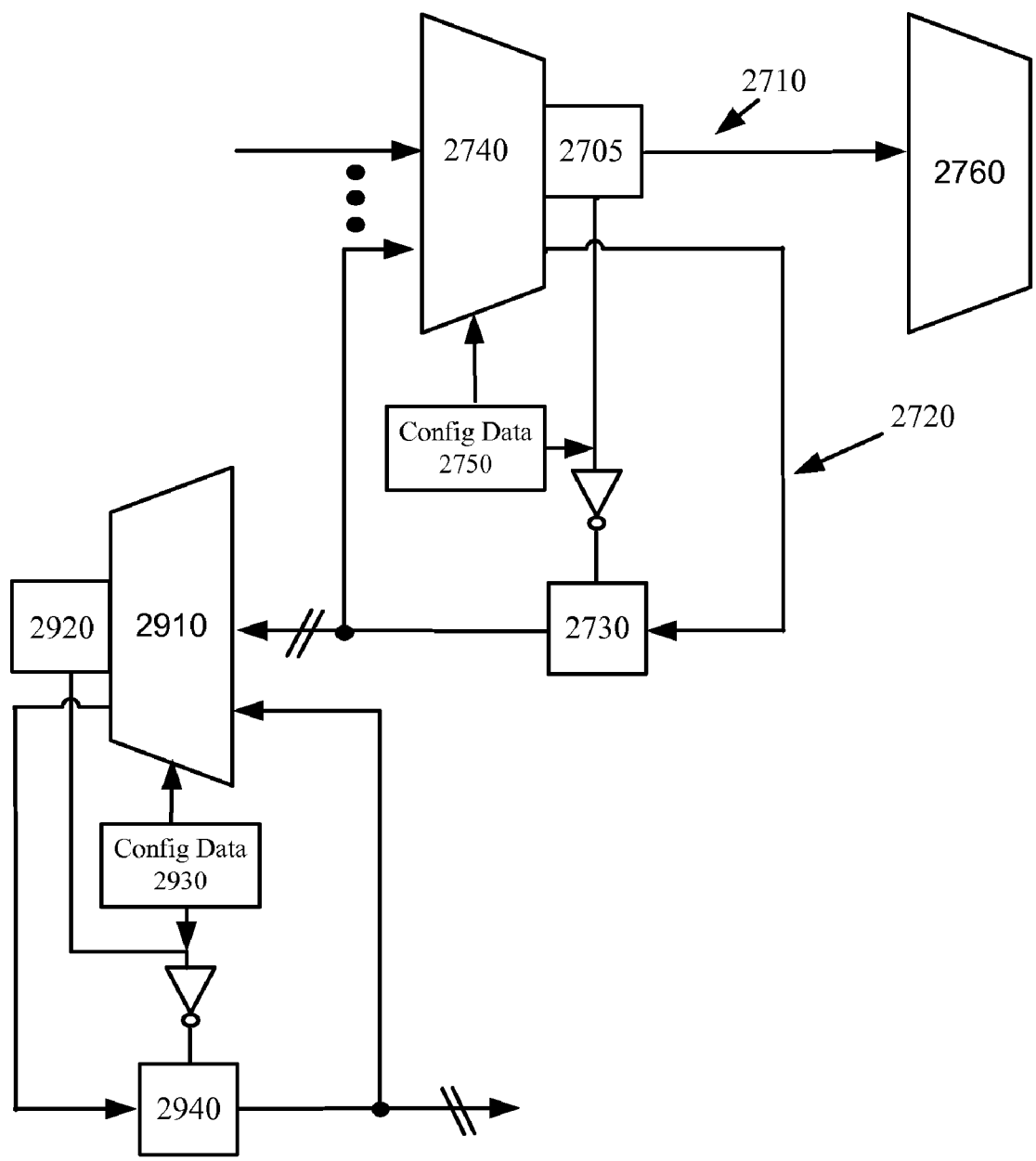
FIG. 29 illustrates an alternative placement and use of multiple storage elements within the routing fabric to provide long term storage.

Even though FIGS. 27 and 28 illustrate the concept of storing and routing data to desired locations through uncongested areas of the routing fabric by reference to the storage elements illustrated in FIG. 27, other embodiments might use this same approach with other storage elements discussed above (e.g., with the storage elements illustrated in FIGS. 13, 17, 20, 24A, 25, and 26). Moreover, even through FIG. 27 illustrates 2770 as a standalone storage element, this storage element might be at the output of another circuit, such as another configurable interconnect. FIG. 29 illustrates one such example.

Specifically, FIG. 29 illustrates an alternative embodiment of FIG. 27 in which the storage element 2770 of FIG. 27 is removed and instead replaced with a second short term 2920 and long term 2940 storage circuit. Though the components and wiring between FIG. 29 and FIG. 27 are similar, FIG. 29 illustrates a connection between such circuits within the routing fabric. By connecting two such circuits, the long term storage capabilities of one circuit are expanded so that the circuit can utilize unused storage elements of another circuit. One of ordinary skill in the art will recognize that even though FIG. 29 illustrates two communicatively connected circuits, some embodiments include several such circuits.

As described above, such functionality is necessary when a circuit must provide long term storage for multiple destinations at the same time. Therefore, if the storage element 2730 is already used but is needed to provide long term storage for a different signal and/or destination of circuit 2740, then storage element 2730 may release the previously stored value to the storage element 2940 provided that storage element 2940 is unused. In this manner, signals originated from circuit 2740 are stored in the storage element 2730 within its own feedback path and storage element 2940 within the feedback path of circuit 2910. Such interconnection between storage elements within different segments of the routing fabric makes available the storage resources of different segments of the routing fabric to circuits that otherwise would require additional storage elements within their own direct connection.

Though FIG. 29 has been illustrated with storage elements 2705, 2730, 2920, and 2940, one of ordinary skill in the art will recognize that several other variations are possible. For instance, these storage elements may be located in a manner similar to the storage elements 2605 and 2630 of FIG. 26. Moreover, in some embodiments the storage elements 2605 and 2630 may be included in addition to the existing storage elements of FIG. 27 or FIG. 29. In this manner the storage elements 2605 and 2630 can work in tandem with storage elements 2730 and 2770 of FIG. 27 or in tandem with the storage elements 2730 and 2920/2940 of FIG. 29. Similarly, instead of storage elements 2920 and 2940 after the routing circuit 2910, the storage elements that precede the routing circuit 2910 might be those of the PDP's illustrated in FIGS. 13-15.

In FIG. 29, all the connections are direct connections in some embodiments, while one or more of them are configurable connections in other embodiments. Moreover, some of the direction connections (e.g., the connection between circuits 2730 and 2910) in this figure can be implemented as direct long offset connections.

In some embodiments, direct long offset connections (also referred to as long-offset direct connections) are direct connections between two non-neighboring nodes that are not vertically or horizontally aligned. In some embodiments, the two nodes are two configurable circuits (e.g., circuits 2730 and 2910), which in some of these embodiments the two circuits are arranged in an array with other configurable circuits. In other embodiments, the two nodes are two configurable tiles that include the two directly connected circuits (e.g., the tile that includes circuit 2730 and the tile that includes the circuit 2910). In some embodiments, two nodes are not neighboring nodes when they are not adjacent to each other in the vertical, horizontal, or diagonal directions. Accordingly, the two nodes that are connected by a direct long offset connection are two nodes that are not vertically or horizontally aligned and that have at least one other node between them.

A direct long offset connection is a direct connection. As mentioned above, a direct connection is established through a combination of one or more wire segments and/or one or more vias. In some of these embodiments, a direct connection might include intervening non-configurable circuits, such as (1) intervening buffer circuits in some embodiments, (2) intervening non-buffer, non-configurable circuits in other embodiments, or (3) a combination of such buffer and non-buffer circuits in yet other embodiments.

Even though direct long offset connections were described above by reference to FIGS. 27 and 29, one of ordinary skill will realize that such connections can be used to implement the circuit structures illustrated in some of the other figures. For example, some or all the connections between the circuits mentioned above (e.g., between circuits 1310 and 1340, 1305 and 1340, 2405 and 2460, 2430 and 2465, 2505 and 2560, 2530 and 2565, 2605 and 2660, 2630 and 2665, and 2705 and 2760) may be implemented as long offset direct connections. Examples for implementing long offset direct connections are described U.S. Pat. No. 7,193,438. U.S. Pat. No. 7,193,438 is incorporated herein by reference.

While the above discussion has illustrated some embodiments of storage elements applicable to a configurable IC, it should be apparent to one of ordinary skill in the art that some embodiments of the storage elements and routing circuits are similarly applicable to a reconfigurable IC. Therein, some embodiments of the invention implement the components within FIGS. 13A, 13B, 17, 24-27, and 29 with multiple sets of configuration data to operate on a sub-cycle reconfigurable basis. For example, the storage elements for the sets of configuration data in these figures (e.g., a set of memory cells, such as SRAM cells) can be modified to implement switching circuits in some embodiments. The switching circuits receive a larger set of configuration data that are stored internally within the storage elements of the switching circuits. The switching circuits are controlled by a set of reconfiguration signals. Whenever the reconfiguration signals change, the switching circuits supply a different set of configuration data to the routing circuits, such as the multiplexers and the selectively enabled storage elements within the routing fabric sections.

The sets of configuration data then determine the connection scheme that the routing circuits 1310, 1740, 2040, 2440, 2540, and 2740 of some embodiments use. Furthermore, the sets of configuration data determine the set of storage elements for storing the output value of the routing circuits. This modified set of switching circuits therefore adapts the routing fabric sections of FIGS. 13A, 13B, 17, 24-27, and 29 for performing simultaneous routing and storage operations within a sub-cycle reconfigurable IC.

While numerous storage element circuits have been described with reference to numerous specific details, one of ordinary skill in the art will recognize that such circuits can be embodied in other specific forms without departing from the spirit of the invention. For instance, several embodiments were described above by reference to particular number of circuits, storage elements, inputs, outputs, bits, and bit lines. One of ordinary skill will realize that these elements are different in different embodiments. For example, routing circuits and multiplexers have been described with n logical inputs and only one logical output, where n is greater than one. However, it should be apparent to one of ordinary skill in the art that the routing circuits, multiplexers, IMUXs, and other such circuits may include n logical inputs and m logical outputs where m is greater than one.

Moreover, though storage elements have been described with reference to routing circuits (RMUXs), it will be apparent to one of ordinary skill in the art that the storage elements might equally have been described with reference to input-select multiplexers such as the interconnect circuits (IMUXs) described above. Similarly, the routing circuits illustrated in the figures, such as the 8-to-1 multiplexer of FIG. 11, may alternatively be described with reference to IMUXs.

The storage elements of some embodiments are state elements that can maintain a state for one or more clock cycles (user-design clock cycles or sub-cycles). Therefore, when storing a value, the storage elements of some embodiments output the stored value irrespective of the value at its input. Moreover, some embodiments have referred to the storage elements as "short term" or "long term" storage elements (e.g., the storage elements 1710 and 1720 of FIG. 17), however, it should be apparent to one of ordinary skill in the art that such terminology describes one type of use for the storage elements. For instance, the storage element 1710 need not store for only one clock cycle (e.g., user-design clock or sub-cycle clock) or store for a short term. Similarly, the storage element 1720 need not be used only for long term storage.

Moreover, even though some embodiments described above showed storage functionality at the output stage of the RMUXs, one of ordinary skill in the art will recognize that such functionality can be placed within or at the input stage of the RMUXs or within or at the input stage of IMUXs. Similarly, the source and destination circuits described with reference to the various figures can be implemented using IMUXs. Thus, one of ordinary skill in the art would understand that the invention is not to be limited by the foregoing illustrative details.

V. Configurable IC and System

Some embodiments described above are implemented in configurable ICs that can compute configurable combinational digital logic functions on signals that are presented on the inputs of the configurable ICs. In some embodiments, such computations are state-less computations (i.e., do not depend on a previous state of a value). Some embodiments described above are implemented in configurable ICs that can perform a continuous function. In these embodiments, the configurable IC can receive a continuous function at its input, and in response, provide a continuous output at one of its outputs.

Figure 30:
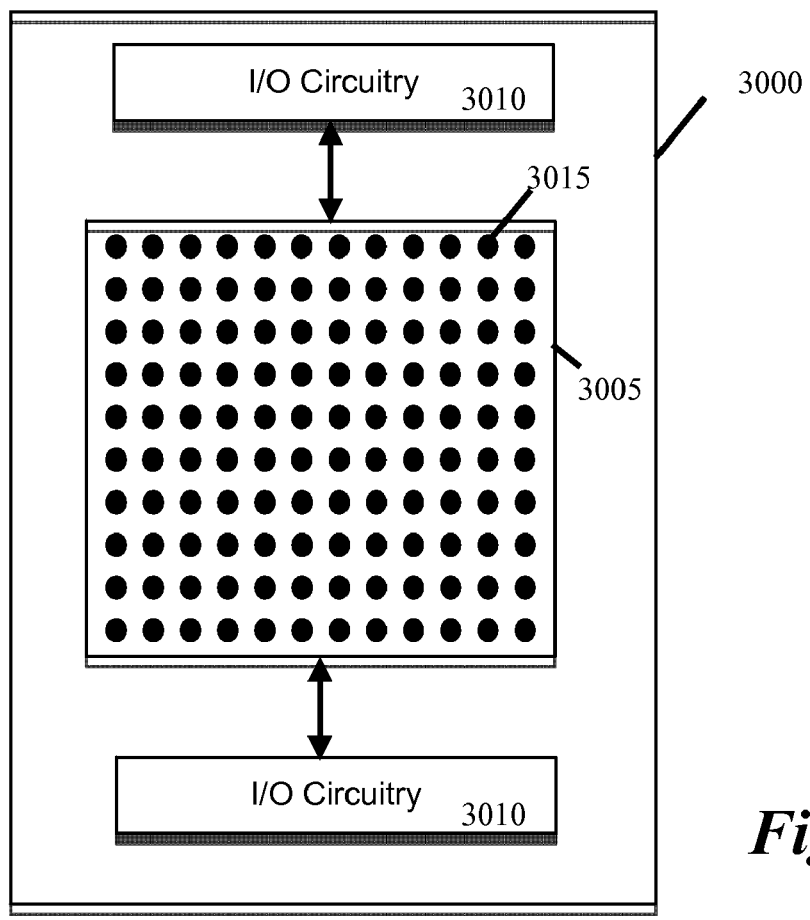
FIG. 30 illustrates a portion of a configurable IC of some embodiments of the invention.

FIG. 30 illustrates a portion of a configurable IC 3000 of some embodiments of the invention. As shown in this figure, this IC has a configurable circuit arrangement 3005 and I/O circuitry 3010. The configurable circuit arrangement 3005 can include any of the above described circuits, storage elements, and routing fabric of some embodiments of the invention. The I/O circuitry 3010 is responsible for routing data between the configurable nodes 3015 of the configurable circuit arrangement 3005 and circuits outside of this arrangement (i.e., circuits outside of the IC, or within the IC but outside of the configurable circuit arrangement 3005). As further described below, such data includes data that needs to be processed or passed along by the configurable nodes.

Figure 31:
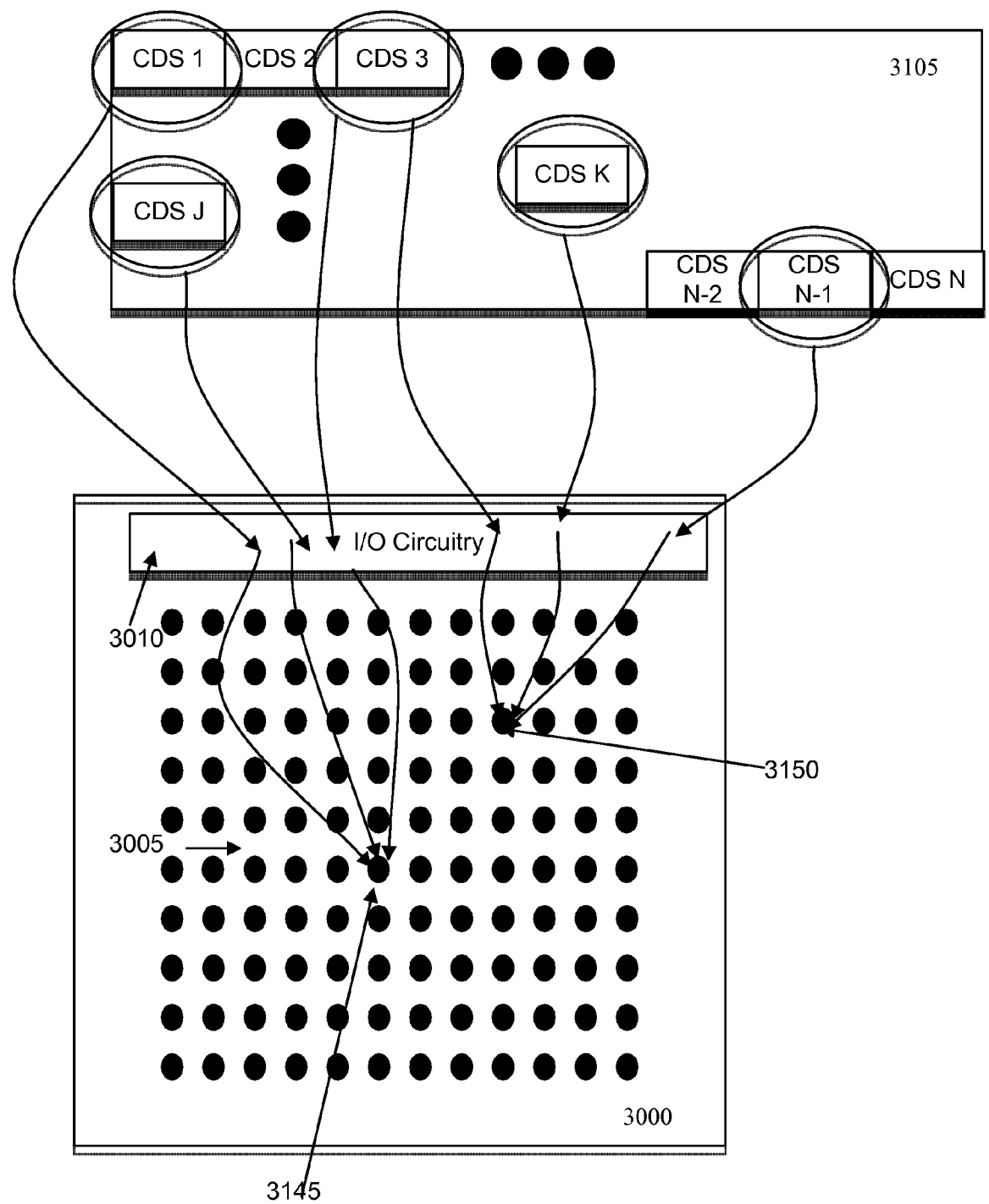
FIG. 31 illustrates a more detailed example of data between a configurable node and a configurable circuit arrangement that includes configuration data that configure the nodes to perform particular operations.

The data also includes in some embodiments a set of configuration data that configures the nodes to perform particular operations. FIG. 31 illustrates a more detailed example of this. Specifically, this figure illustrates a configuration data pool 3105 for the configurable IC 3000. This pool includes N configuration data sets (CDS). As shown in FIG. 31, the input/output circuitry 3010 of the configurable IC 3000 routes different configuration data sets to different configurable nodes of the IC 3000. For instance, FIG. 31 illustrates configurable node 3145 receiving configuration data sets 1, 3, and J through the I/O circuitry, while configurable node 3150 receives configuration data sets 3, K, and N−1 through the I/O circuitry. In some embodiments, the configuration data sets are stored within each configurable node. Also, in some embodiments, a configurable node can store multiple configuration data sets for a configurable circuit within it so that this circuit can reconfigure quickly by changing to another configuration data set for a configurable circuit. In some embodiments, some configurable nodes store only one configuration data set, while other configurable nodes store multiple such data sets for a configurable circuit.

Figure 32:
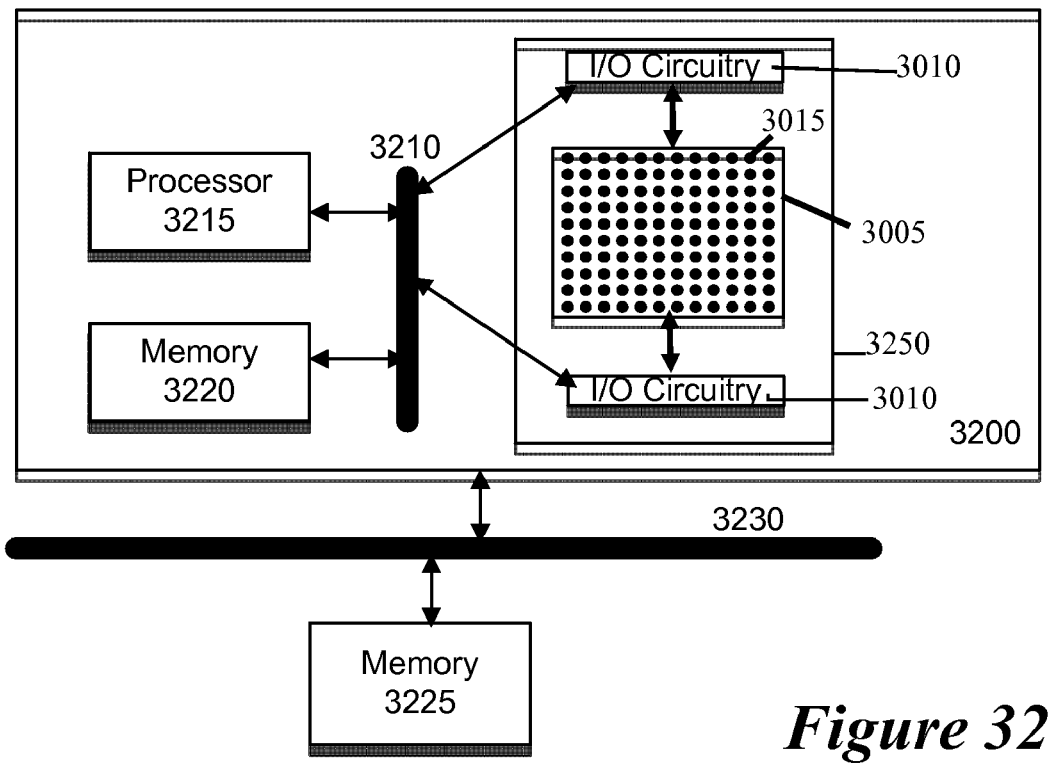
FIG. 32 illustrates a system on chip ("SoC") implementation of a configurable IC.

A configurable IC of the invention can also include circuits other than a configurable circuit arrangement and I/O circuitry. For instance, FIG. 32 illustrates a system on chip ("SoC") implementation of a configurable IC 3200. This IC has a configurable block 3250, which includes a configurable circuit arrangement 3005 and I/O circuitry 3010 for this arrangement. It also includes a processor 3215 outside of the configurable circuit arrangement, a memory 3220, and a bus 3210, which conceptually represents all conductive paths between the processor 3215, memory 3220, and the configurable block 3250. As shown in FIG. 32, the IC 3200 couples to a bus 3230, which communicatively couples the IC to other circuits, such as an off-chip memory 3225. Bus 3230 conceptually represents all conductive paths between the components of the IC 3200.

This processor 3215 can read and write instructions and/or data from an on-chip memory 3220 or an offchip memory 3225. The processor 3215 can also communicate with the configurable block 3250 through memory 3220 and/or 3225 through buses 3210 and/or 3230. Similarly, the configurable block can retrieve data from and supply data to memories 3220 and 3225 through buses 3210 and 3230.

Figure 33:
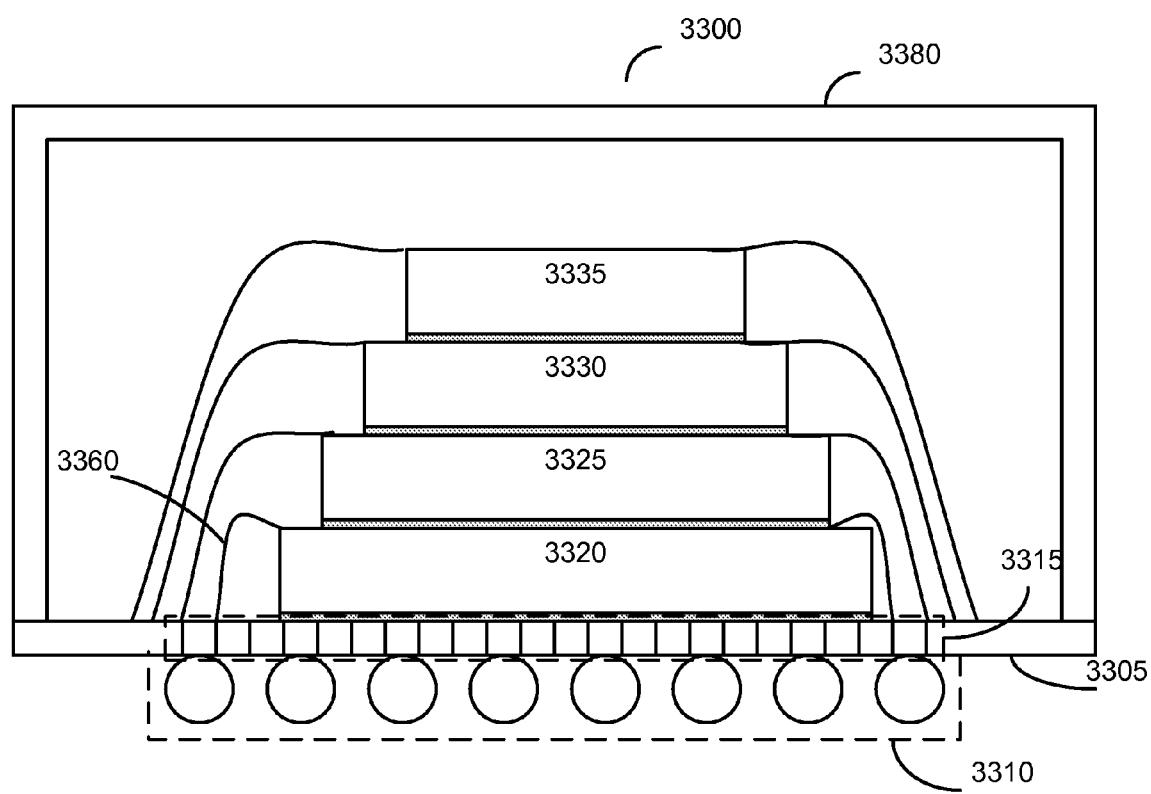
FIG. 33 illustrates an embodiment that employs a system in package ("SiP") implementation for a configurable IC.

Instead of, or in conjunction with, the system on chip ("SoC") implementation for a configurable IC, some embodiments might employ a system in package ("SiP") implementation for a configurable IC. FIG. 33 illustrates one such SiP 3300. As shown in this figure, SiP 3300 includes four ICs 3320, 3325, 3330, and 3335 that are stacked on top of each other on a substrate 3305. At least one of these ICs is a configurable IC that includes a configurable block, such as the configurable block 3250 of FIG. 32. Other ICs might be other circuits, such as processors, memory, etc.

As shown in FIG. 33, the IC communicatively connects to the substrate 3305 (e.g., through wire bondings 3360). These wire bondings allow the ICs 3320-3335 to communicate with each other without having to go outside of the SiP 3300. In some embodiments, the ICs 3320-3335 might be directly wire-bonded to each other in order to facilitate communication between these ICs. Instead of, or in conjunction with the wire bondings, some embodiments might use other mechanisms to communicatively couple the ICs 3320-3335 to each other.

As further shown in FIG. 33, the SiP includes a ball grid array ("BGA") 3310 and a set of vias 3315. The BGA 3310 is a set of solder balls that allows the SiP 3300 to be attached to a printed circuit board ("PCB"). Each via connects a solder ball in the BGA 3310 on the bottom of the substrate 3305, to a conductor on the top of the substrate 3305.

The conductors on the top of the substrate 3305 are electrically coupled to the ICs 3320-3335 through the wire bondings. Accordingly, the ICs 3320-3335 can send and receive signals to and from circuits outside of the SiP 3300 through the wire bondings, the conductors on the top of the substrate 3305, the set of vias 3315, and the BGA 3310. Instead of a BGA, other embodiments might employ other structures (e.g., a pin grid array) to connect a SiP to circuits outside of the SiP. As shown in FIG. 33, a housing 3380 encapsulates the substrate 3305, the BGA 3310, the set of vias 3315, the ICs 3320-3335, the wire bondings to form the SiP 3300. This and other SiP structures are further described in U.S. patent application Ser. No. 11/081,820 entitled "Programmable System In Package", which is incorporated herein by reference.

Figure 34:
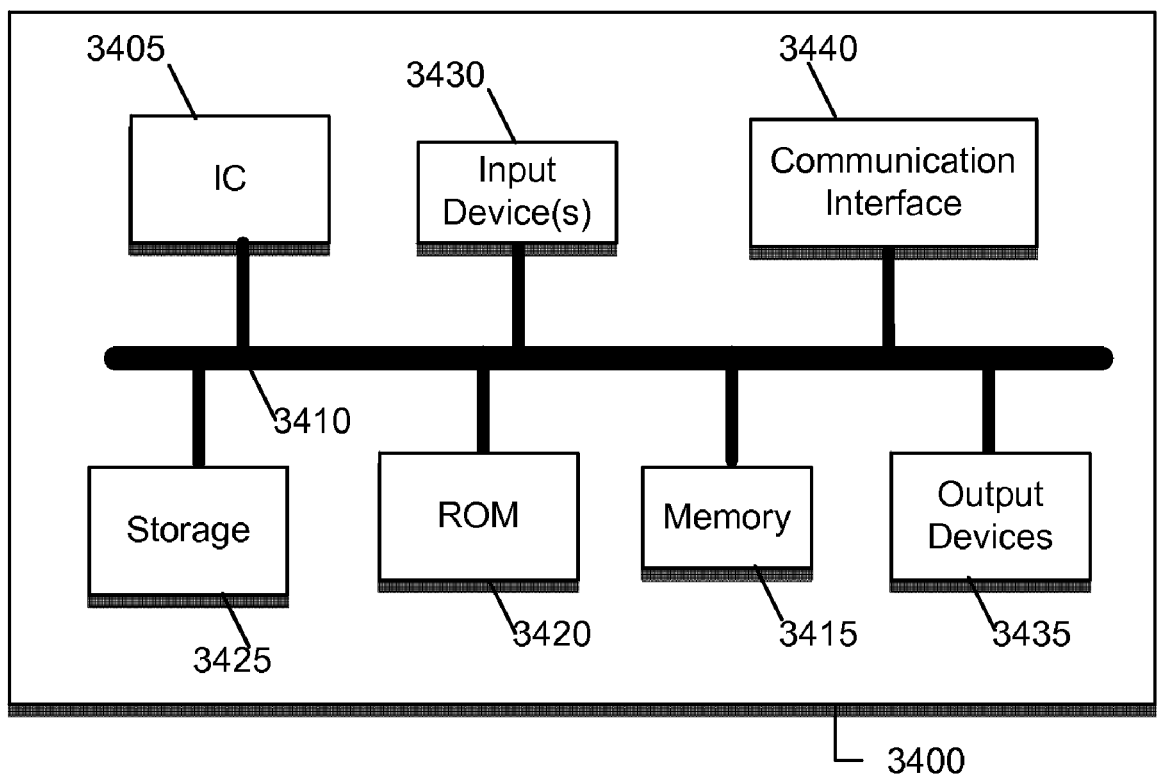
FIG. 34 conceptually illustrates a more detailed example of a computing system that has an IC, which includes one of the invention's configurable circuit arrangements.

FIG. 34 conceptually illustrates a more detailed example of a computing system 3400 that has an IC 3405, which includes a configurable circuit arrangement with configurable circuits, storage elements, and routing fabric of some embodiments of the invention that were described above. The system 3400 can be a stand-alone computing or communication device, or it can be part of another electronic device. As shown in FIG. 34, the system 3400 not only includes the IC 3405, but also includes a bus 3410, a system memory 3415, a read-only memory 3420, a storage device 3425, input devices 3430, output devices 3435, and communication interface 3440.

The bus 3410 collectively represents all system, peripheral, and chipset interconnects (including bus and non-bus interconnect structures) that communicatively connect the numerous internal devices of the system 3400. For instance, the bus 3410 communicatively connects the IC 3410 with the read-only memory 3420, the system memory 3415, and the permanent storage device 3425. The bus 3410 may be any of several types of bus structure including a memory bus or memory controller, a peripheral bus, and a local bus using any of a variety of conventional bus architectures. For instance, the bus 3410 architecture may include any of the following standard architectures: PCI, PCI-Express, VESA, AGP, Microchannel, ISA and EISA, to name a few.

From these various memory units, the IC 3405 receives data for processing and configuration data for configuring the ICs configurable logic and/or interconnect circuits. When the IC 3405 has a processor, the IC also retrieves from the various memory units instructions to execute. The read-only-memory (ROM) 3420 stores static data and instructions that are needed by the IC 3405 and other modules of the system 3400.

Some embodiments of the invention use a mass-storage device (such as a magnetic disk to read from or write to a removable disk or an optical disk for reading a CD-ROM disk or to read from or write to other optical media) as the permanent storage device 3425. Other embodiments use a removable storage device (such as a flash memory card or memory stick) as the permanent storage device. The drives and their associated computer-readable media provide non-volatile storage of data, data structures, computer-executable instructions, etc. for the system 3400. Although the description of computer-readable media above refers to a hard disk, a removable magnetic disk, and a CD, it should be appreciated by those skilled in the art that other types of media which are readable by a computer, such as magnetic cassettes, digital video disks, and the like, may also be used in the exemplary operating environment.

Like the storage device 3425, the system memory 3415 is a read-and-write memory device. However, unlike storage device 3425, the system memory is a volatile read-and-write memory, such as a random access memory. Typically, system memory 3415 may be found in the form of random access memory (RAM) modules such as SDRAM, DDR, RDRAM, and DDR-2. The system memory stores some of the set of instructions and data that the processor needs at runtime.

The bus 3410 also connects to the input and output devices 3430 and 3435. The input devices enable the user to enter information into the system 3400. The input devices 3430 can include touch-sensitive screens, keys, buttons, keyboards, cursor-controllers, touch screen, joystick, scanner, microphone, etc. The output devices 3435 display the output of the system 3400. The output devices include printers and display devices, such as cathode ray tubes (CRT), liquid crystal displays (LCD), organic light emitting diodes (OLED), plasma, projection, etc.

Finally, as shown in FIG. 34, bus 3410 also couples system 3400 to other devices through a communication interface 3440. Examples of the communication interface include network adapters that connect to a network of computers, or wired or wireless transceivers for communicating with other devices. Through the communication interface 3440, the system 3400 can be a part of a network of computers (such as a local area network ("LAN"), a wide area network ("WAN"), or an Intranet) or a network of networks (such as the Internet). The communication interface 3440 may provide such connection using wireless techniques, including digital cellular telephone connection, Cellular Digital Packet Data (CDPD) connection, digital satellite data connection or the like.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is
1. An integrated circuit (IC) comprising:
  a) a source circuit comprising at least one output;
  b) a storage element comprising at least one input and at least one output, wherein said output from the source circuit directly connects to said input of the storage element;
  c) a first destination circuit comprising a plurality of inputs, wherein a first input of the plurality of inputs directly connects to said output from the source circuit, wherein a second input of the plurality of inputs directly connects to said output from the storage element; and
  d) a second destination circuit comprising at least one input, wherein the input is directly connected to a second output of the storage element.

2. The IC of claim 1 further comprising a routing fabric for configurably routing signals between the source circuit and the destination circuits, wherein the routing fabric comprises the direct connection between the output of the source circuit and input of the storage element, the direct connection between the first input of the first destination circuit and the output of the source circuit, and the direct connection between the second input of the first destination circuit and the output of the storage element.

3. The IC of claim 2, wherein the routing fabric further comprises at least one via used for establishing a direct connection.

4. The IC of claim 2, wherein the routing fabric further comprises at least one buffer circuit used for establishing a direct connection.

5. The IC of claim 2, wherein the routing fabric does not include interconnect circuits.

6. The IC of claim 1, wherein the source circuit is a configurable interconnect circuit for configurably routing signals to the destination circuits based on configuration data received by the source circuit.

7. The IC of claim 1, wherein at least one of the source circuit and the destination circuits is a configurable circuit that configurably performs a set of operations based on configuration data received by the configurable circuit.

8. The IC of claim 1, wherein the storage element stores a first output of the source circuit while the source circuit generates and passes a second output through the direct connection between the output of the source circuit and the first input of the first destination circuit.

9. An electronic device comprising:
an integrated circuit (IC) comprising:
a) a source circuit comprising at least one output;
b) a storage element comprising at least one input and at least one output, wherein said output from the source circuit is directly connected to said input of the storage element;
c) a first destination circuit comprising a plurality of inputs, wherein a first input of the plurality of inputs directly connects to said output from the source circuit, wherein a second input of the plurality of inputs directly connects to said output from the storage element; and
d) a second destination circuit comprising at least one input, wherein the input is directly connected to a second output of the storage element.

10. The electronic device of claim 9, wherein the IC is configurable.

11. The electronic device of claim 10, wherein the storage element is configurable based on a set of configuration data that is not a clock signal.

12. The electronic device of claim 10, wherein the source circuit is configurable based on a set of configuration data received by the source circuit.

13. An integrated circuit (IC) comprising:
a) a plurality of circuits arranged in a particular arrangement, each of a group of the circuits having a plurality of inputs and at least one output;
b) a plurality of storage elements each comprising at least one input and at least one output; and
c) a routing fabric comprising parallel sets of wiring paths, wherein each particular parallel set comprising (i) a first wiring path directly connecting an output of a particular first circuit to a first input of a second circuit, and (ii) a second wiring path directly connecting said output of the first circuit to an input of a particular storage element, wherein the output of the particular storage element connects to a second input of the second circuit, wherein a particular parallel set farther comprises connecting the output of the storage element in the second wiring path to an input of a third circuit.

14. The IC of claim 13, wherein the particular arrangement of the plurality of configurable circuits comprises sets of configurable circuits.

15. The IC of claim 14, wherein a set of configurable circuits in the plurality of configurable circuits are arranged in a tile.

16. The IC of claim 14, wherein a set of configurable circuits in the plurality of configurable circuits are arranged in an array.

17. The IC of claim 13, wherein the IC is a configurable IC and the set of circuits are configurable circuits that receive sets of configuration data for controlling the set of circuits.

18. The IC of claim 13, wherein the routing fabric farther comprises at least one individual wiring path that is not part of a parallel wiring path.

19. An electronic device comprising:
an integrated circuit (IC) comprising:
a) a plurality of circuits arranged in a particular arrangement, each of a group of the circuits having a plurality of inputs and at least one output;
b) a plurality of storage elements each comprising at least one input and at least one output; and
c) a routing fabric comprising parallel sets of wiring paths, wherein each particular parallel set comprising (i) a first wiring path directly connecting an output of a particular first circuit to a first input of a second circuit, and (ii) a second wiring path directly connecting said output of the first circuit to an input of a particular storage element, wherein the output of the particular storage element connects to a second input of the second circuit, wherein a particular parallel set further comprises connecting the output of the storage element in the second wiring path to an input of a third circuit.

20. An integrated circuit (IC) comprising:
a) a source circuit comprising at least one output;
b) a storage element comprising at least one input and at least one output, wherein said output from the source circuit directly connects to said input of the storage element;
c) a first destination circuit comprising a plurality of inputs, wherein a first input of the plurality of inputs directly connects to said output from the source circuit, wherein a second input of the plurality of inputs directly connects to said output from the storage element; and
d) a second destination circuit comprising at least one input, wherein the input is configurably connected to a second output of the storage element.

21. The IC of claim 20, wherein the source circuit is a configurable interconnect circuit for configurably routing signals to the destination circuits through a routing fabric comprising the direct connections based on configuration data received by the source circuit.

22. An electronic device comprising:
an integrated circuit (IC) comprising:
a) a source circuit comprising at least one output;
b) a storage element comprising at least one input and at least one output, wherein said output from the source circuit is directly connected to said input of the storage element;
c) a first destination circuit comprising a plurality of inputs, wherein a first input of the plurality of inputs directly connects to said output from the source circuit, wherein a second input of the plurality of inputs directly connects to said output from the storage element; and
d) a second destination circuit comprising at least one input, wherein the input is configurably connected to a second output of the storage element.

23. An integrated circuit (IC) comprising:
a source circuit comprising at least one output;
a storage element comprising at least one input and at least one output, wherein said output from the source circuit directly connects to said input of the storage element; and
a destination circuit comprising a plurality of inputs with (i) a first input of the plurality of inputs directly connected to said output from the source circuit, and (ii) a second input of the plurality of inputs directly connected to said output from the storage element,
wherein at least one of the source and destination circuits is a configurable circuit that configurably performs a plurality of different operations as determined by configuration data.

24. The IC of claim 23, wherein the configurable circuit is a configurable routing circuit for configurably selecting at least one of a plurality of inputs to route through at least one output based on configuration data received by the configurable routing circuit.

25. The IC of claim 23, wherein the configurable circuit is a configurable logic circuit for configurably performing one function from a set of functions based on configuration data received by the configurable logic circuit.

26. The IC of claim 23, wherein the storage element configurably stores a signal received at the input based on configuration data.

27. The IC of claim 23 further comprising a plurality of configurable circuits for configurably performing sets of operations based on configuration data.

28. The IC of claim 23, wherein both the source and destination circuits are configurable circuits that each configurably perform one of a plurality of different operations based on a configuration data set received by each circuit.

29. The IC of claim 28, wherein the storage element is for selectively storing a signal from the particular source circuit for a particular duration based on configuration data received by the storage element before passing the signal to the particular destination circuit.

30. The IC of claim 28, wherein the storage element in the second wiring path of a particular parallel wiring path stores a first signal from a particular source circuit while the particular source circuit generates and passes a second signal through a first wiring path of the particular wiring path.

31. The IC of claim 28, wherein at least one of the source and destination circuits is a configurable circuit.

32. An integrated circuit comprising:

a plurality of circuits comprising a plurality of configurable circuits for configurably performing sets of operations based on configuration data; and a routing fabric for configurably routing signals between the plurality of circuits, said routing fabric comprising a plurality of parallel wiring paths and a plurality of individual wiring paths, each particular parallel wiring path comprising:

a first wiring path with at least one wire segment used for establishing a direct connection between an output of a particular source circuit and an input of a particular destination circuit, and a second wiring path comprising (i) a storage element with a wire segment establishing a direct connection between the output of the particular source circuit and an input of the storage element, and (ii) a wire segment establishing a direct connection between an output of the storage element and the input of the particular destination circuit.

* * * * *